US011366540B2

(12) United States Patent
Yoshida

(10) Patent No.: US 11,366,540 B2
(45) Date of Patent: Jun. 21, 2022

(54) DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/088,641

(22) Filed: Nov. 4, 2020

(65) Prior Publication Data

US 2021/0173506 A1 Jun. 10, 2021

Related U.S. Application Data

(60) Provisional application No. 62/943,954, filed on Dec. 5, 2019.

(51) Int. Cl.
*G06F 3/041* (2006.01)
*G06F 3/044* (2006.01)
*G06F 3/047* (2006.01)

(52) U.S. Cl.
CPC ............ *G06F 3/0412* (2013.01); *G06F 3/047* (2013.01); *G06F 3/0445* (2019.05); *G06F 3/0446* (2019.05); *G06F 3/0447* (2019.05); *G06F 2203/04111* (2013.01)

(58) Field of Classification Search
CPC .... G06F 3/0412; G06F 3/0445; G06F 3/0446; G06F 3/0447; G06F 3/047; G06F 2203/04111; G06F 3/04164; G06F 3/0443; H01L 27/3276; H01L 27/323
See application file for complete search history.

(56) References Cited

U.S. PATENT DOCUMENTS

| | | | | |
|---|---|---|---|---|
| 2013/0328812 | A1* | 12/2013 | Kim | G06F 3/0445 345/173 |
| 2014/0145996 | A1* | 5/2014 | Sugita | G06F 3/0412 345/173 |
| 2016/0041666 | A1 | 2/2016 | Lee et al. | |
| 2016/0247478 | A1* | 8/2016 | Ishige | G02F 1/1345 |
| 2019/0163302 | A1* | 5/2019 | Lin | G06F 3/0412 |

FOREIGN PATENT DOCUMENTS

JP 2016-038918 A 3/2016

* cited by examiner

*Primary Examiner* — Patrick N Edouard
*Assistant Examiner* — Joseph P Fox
(74) *Attorney, Agent, or Firm* — Keating & Bennett, LLP

(57) ABSTRACT

A display device includes pixel electrodes, position detection electrodes, a signal supply section, main position detection lines disposed in the display area, and an auxiliary position detection line disposed outside the display area and routed around an area in which the main position detection lines are disposed. One end portions the main position detection lines are connected to the position detection electrodes and another end portions thereof are connected to the signal supply section and cross a space between the signal supply section and the display area. One end portion of the auxiliary position detection line is connected to the position detection electrode different from the position detection electrodes connected to the main position detection lines. Another end portion of the auxiliary position detection line is connected to the signal supply section. The auxiliary position detection line includes portions of conductive films included in different layers via insulating films.

19 Claims, 28 Drawing Sheets

DISPLAY DEVICE

CROSS REFERENCE TO RELATED APPLICATION

This application claims priority from U.S. Provisional Patent Application No. 62/943,954 filed on Dec. 5, 2019. The entire contents of the priority application are incorporated herein by reference.

TECHNICAL FIELD

The technology described herein relates to a display device.

BACKGROUND ART

An example of a touch sensor integrated type display device is described in Japanese Unexamined Patent Application Publication No. 2016-38918. The touch sensor integrated type display device includes gate lines and data lines, pixel electrodes, touch electrodes, first touch routing wires, second touch routing wires, and third touch routing wires. The touch electrodes are arranged in a matrix along a row direction and a column direction such that each touch electrode overlaps at least a pixel electrode. The first touch routing wire extends in a first direction that is one of the row direction and the column direction and commonly connects two or more touch electrodes that are arranged in the first direction. The second touch routing wire extends in a second direction that is another one of the row direction and the column direction and commonly connects two or more touch electrodes that are arranged in the second direction and are not connected to the first touch routing wire. The third touch routing wire extends in the second direction and is connected to the touch electrodes that are not connected to the first touch routing wire and the second touch routing wire.

According to the touch sensor integrated type display device, touch sensitivity can be improved while reducing the number of the touch routing wires. However, the touch routing wires are portions of one single conductive film. This may result in a small variety of a wiring structure of the touch routing wires.

SUMMARY

The technology described herein was made in view of the above circumstances. An object is to increase a variety of a wiring structure of an auxiliary position detection line.

A display device according to the technology described herein includes pixel electrodes disposed in a display area, a common electrode, position detection electrodes, a signal supply section, main position detection lines, and an auxiliary position detection line. The common electrode is disposed to partially overlap the pixel electrodes via an insulating film. The position detection electrodes are divided portions of the common electrode and create an electrostatic capacitance between one of the position detection electrodes and a position inputter that performs position inputting and detect an input position inputted by the position inputter. The signal supply section is disposed adjacent to the display area. The main position detection lines include portions that are disposed in the display area and have one end portions that are connected to portions of the position detection electrodes and another end portions that are connected to the signal supply section and cross a space between the signal supply section and the display area. The auxiliary position detection line is disposed outside the display area and routed around an area of the space between the signal supply section and the display area. The main position detection lines are disposed in the area of the space. The auxiliary position detection line has one end portion that is connected to one of the position detection electrodes different from the position detection electrodes connected to the main position detection lines. The auxiliary position detection line has another end portion that is connected to the signal supply section. The auxiliary position detection line includes portions of conductive films that are included in different layers via an insulating film.

According to the technology described herein, a wide variety of a wiring structure of an auxiliary position detection line can be achieved.

DETAILED DESCRIPTION

First Embodiment

Figure 1:
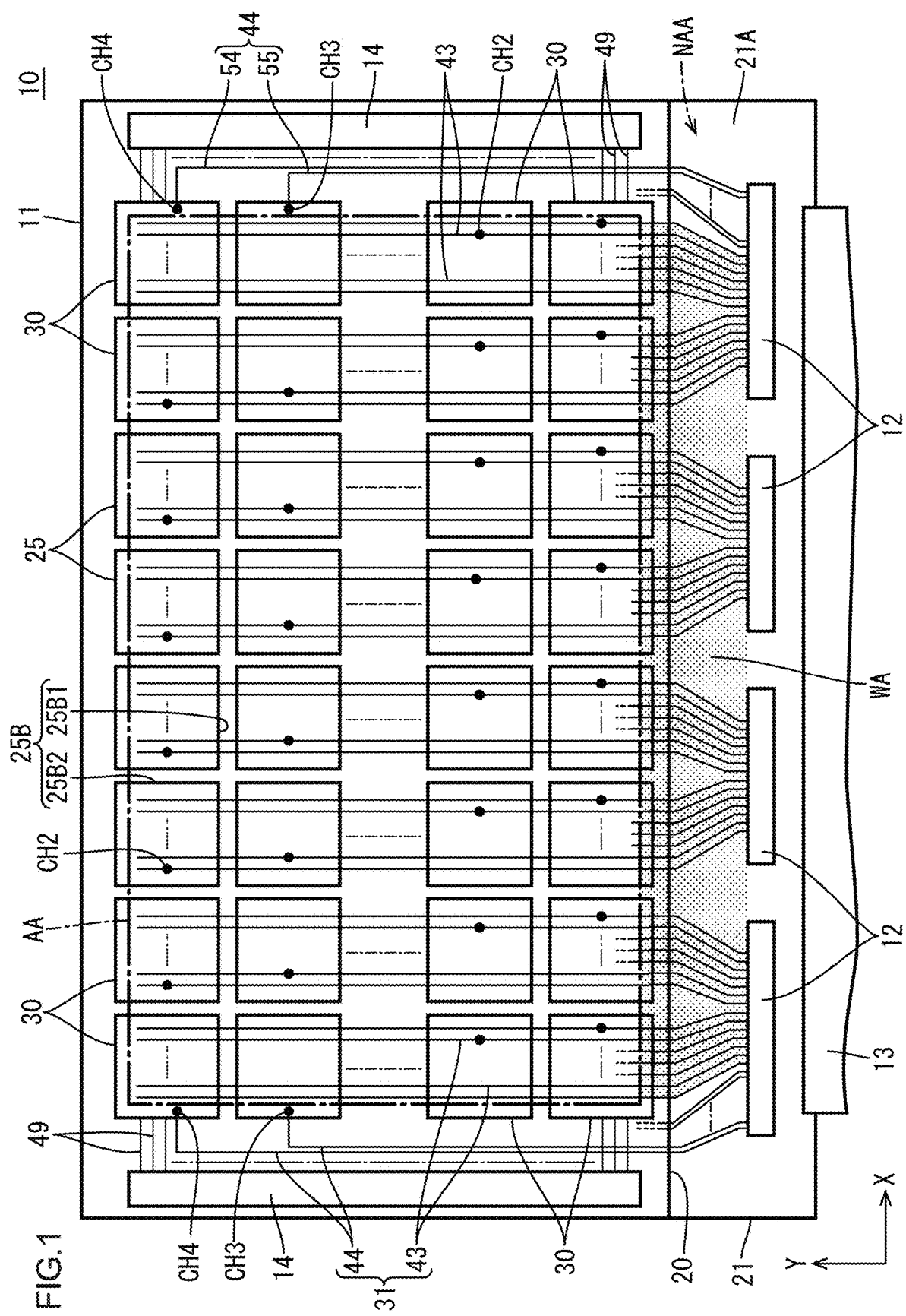
FIG. 1 is a plan view illustrating touch electrodes and touch lines included in a liquid crystal panel of a liquid crystal display device according to a first embodiment.

A first embodiment will be described with reference to FIGS. 1 to 18. In this section, a liquid crystal display device 10 (a display device having a position input function) having functions of a display and a touch panel (a function of inputting positions) will be described. In the drawings, X-axes, Y-axes, and Z-axes may be present. The axes in each drawing correspond to the respective axes in other drawings. Upper sides and the lower sides of FIGS. 3, 6, 8, 9, 16 and 18 correspond to the front side and the rear side, respectively.

FIG. 1 is a plan view schematically illustrating the liquid crystal panel 11. As illustrated in FIG. 1, the liquid crystal display device 10 at least includes the liquid crystal panel 11 (a display device, a display panel, a display panel having a position input function) and a backlight device (a lighting device). The liquid crystal panel 11 has a laterally-long rectangular shape and displays an image. The backlight device is an external light source and provides light to the liquid crystal panel 11 used for displaying. In this embodiment, the liquid crystal panel 11 has a screen size of about 15 inches (specifically 15.6 inches), for example, and resolution of full high definition (FHD). The backlight device is disposed behind (on a rear surface side of) the liquid crystal panel 11 and includes a light source (such as LEDs, for example) that emits white light and an optical member that adds an optical effect to the light from the light source and converts the light to planar light.

As illustrated in FIG. 1, the liquid crystal panel 11 includes a display area AA (an area surrounded by a chain line in FIG. 1) in a middle section of a screen surface and images can be displayed in the display area AA. The liquid crystal panel 11 includes a non-display area NAA in an outer peripheral section of the screen surface having a frame shape that surrounds the display area AA. No image is displayed in the non-display area NAA. In this embodiment, the display area AA has a long-side dimension of 345.6 mm and a short-side dimension of 194.4 mm, for example. The liquid crystal panel 11 includes a pair of bonded substrates 20, 21. One of the substrates 20, 21 on the front (a front surface side) is a CF substrate 20 (an opposed substrate) and another one on the rear (a rear surface side) is an array substrate 21 (an active matrix substrate, an element substrate). Each of the substrates 20, 21 includes a glass substrate and various films disposed on top of each other on the inner surface thereof. Polarizing plates are bonded to outer surfaces of the substrates 20, 21, respectively.

As illustrated in FIG. 1, the CF substrate 20 has a short-side dimension that is shorter than that of the array substrate 21. The CF substrate 20 is bonded to the array substrate 21 such that one edges of the respective substrates 20, 21 with respect to a short-side direction (the Y-axis direction) are aligned with each other. Another edge of the array substrate 21 with respect to the short-side direction is projected from the CF substrate 20 and a projected portion of the array substrate 21 is a CF substrate non-overlapping portion 21A that is not overlapped with the CF substrate 20. Drivers 12 (a signal supply section) that supply various kinds of signals related to a display function and a touch panel function, which will be described later, and a flexible circuit board 13 (a signal transfer section) are mounted on the CF substrate non-overlapping portion 21A. The driver 12 is an LSI chip that includes a driving circuit therein and mounted on the array substrate 21 with the chip-on-glass (COG) mounting method. The driver 12 processes various kinds of signals transferred via the flexible circuit board 13. In this embodiment, four drivers 12 are arranged at intervals in the X-axis direction in the non-display area NAA of the liquid crystal panel 11. The drivers 12 are adjacent to and away from the display area AA by a distance (a line crossing area WA which will be described later) with respect to the Y-axis direction. The flexible circuit board 13 includes a base member made of synthetic resin having insulation and flexibility (such as polyimide resin) and wiring of lines on the base member. The flexible circuit board 13 is connected to the non-display area NAA of the liquid crystal panel 11 at one edge section thereof and connected to a control board (a signal supply source) at another edge section thereof. Various kinds of signals supplied from the control board are transferred to the liquid crystal panel 11 via the flexible circuit board 13. The various kinds of signals are processed by the drivers 12 in the non-display area NAA and outputted to the display area AA. A pair of gate circuits 14 (a second signal supply section) are disposed in the non-display area NAA of the array substrate 21 so as to sandwich the display area AA from two sides with respect to the X-axis direction. The gate circuits 14 are for supplying scan signals to gate lines 26 via gate connection lines 49, which will be described later, and mounted on the array substrate 21 in a monolithic manner. A specific configuration of the gate circuit 14 will be described later.

The liquid crystal panel 11 according to this embodiment has a display function for displaying images and a touch panel function for detecting positions (input positions) of input performed by a user based on displayed images. The liquid crystal panel 11 includes an integrated touch panel pattern (with the in-cell technology) for exerting the touch panel function. The touch panel pattern uses so-called a projection type electrostatic capacitance method. A self-capacitance method is used for detection. As illustrated in FIG. 1, the touch panel pattern includes touch electrodes 30

(position detection electrodes) that are arranged in a matrix within the plate surface of the liquid crystal panel 11. The touch electrodes 30 are disposed in the display area AA of the liquid crystal panel 11. The display area AA of the liquid crystal panel 11 corresponds with a touch area in which input positions are detectable (a position input area). The non-display area NAA corresponds with a non-touch area in which input positions are not detectable (a non-position input area). When the user intends to input a position based on a displayed image in the display area AA of the liquid crystal panel 11 recognized by the user and brings his or her finger (a position input body), which is a conductive member, closer to the surface of the liquid crystal panel 11 (a display surface), the finger and the touch electrode 30 form a capacitor. A capacitance measured at the touch electrode 30 close to the finger changes as the finger approaches to the touch electrode 30 and is different from a capacitance at the touch electrodes 30 farther from the finger. Based on the difference in capacitance, the input position can be detected. The touch electrodes 30 are arranged at intervals in the display area AA in the X-axis direction (an arrangement direction in which pixel electrodes 24 sandwiching a touch line 31 are arranged) and the Y-axis direction (an extending direction of the touch lines 31), that is, the touch electrodes 30 are arranged in a matrix. Among the touch electrodes 30 arranged in a matrix, the touch electrodes 30 on the outer peripheral edges are arranged such that the respective outer edge portions thereof are disposed in the non-display area NAA. Each of the touch electrodes 30 has a square shape in the plan view with edges in some millimeters (e.g., about 2 mm to 6 mm). In the configuration in which each of the touch electrodes 30 has edges of about 4.2 mm, eighty four touch electrodes 30 are arranged in the long-side direction (the X-axis direction) and forty six touch electrodes 30 are arranged in the short-side direction (the Y-axis direction) and a total number of the touch electrodes 30 in the touch area (the display area AA) is 3864. The touch electrodes 30 are significantly larger than pixels PX, which will be described later, in the plan view. Namely, each touch electrode 30 is disposed in an area that straddles the pixels PX in the X-axis direction and the Y-axis direction (e.g., tens of the pixels PX).

As illustrated in FIG. 1, the touch lines 31 (position detection lines) included in the liquid crystal panel 11 are selectively connected to the touch electrodes 30. The touch lines 31 extend in the Y-axis direction and are connected to the specific touch electrodes 30 among the touch electrodes 30 arranged in the Y-axis direction. In FIG. 1, connection portions of the touch lines 31 connected to the touch electrodes 30 (touch line contact holes CH2, CH3, CH4, which will be described later) are illustrated with black points. The touch lines 31 are connected to a detection circuit. The detection circuit may be included in the driver 12 or provided outside the liquid crystal panel 11 via the flexible circuit board 13. The touch lines 31 include main touch lines 43 (main position detection lines) and auxiliary touch lines 44 (auxiliary position detection lines). At least portions of the respective main touch lines 43 are disposed in the display area AA. At least portions of the respective auxiliary touch lines 44 are disposed in the non-display area NAA that is outside the display area AA and are disposed next to the display area AA with respect to a perpendicular direction (the X-axis direction) perpendicular to the extending direction of the main touch lines 43 (the Y-axis direction). One end of the main touch line 43 is connected to the touch electrode 30 within the display area AA and another end is connected to the driver 12 disposed in the non-display area NAA that is outside the display area AA. The main touch lines 43 extend and cross a space between the driver 12 and the display area AA in the Y-axis direction (an arrangement direction in which the driver 12 and the display area AA are arranged). The array substrate 21 includes a line crossing area WA (an area) in which the main touch lines 43 extend. The auxiliary touch lines 44 are disposed in two areas that are sandwiched between the two respective gate circuits 14 and the display area AA with respect to the X-axis direction. The auxiliary touch lines 44 extend in the non-display area NAA of the array substrate 21 and extend around the line crossing area WA in which the main touch lines 43 are disposed between the drivers 12 and the display area AA. The line crossing area WA is illustrated with shading in FIG. 1. The main touch lines 43 and the auxiliary touch lines 44 will be described more in detail later. FIG. 1 schematically illustrates the touch electrodes 30 and the touch lines 31 and the specific number, the specific arrangement and the specific planar shape of the touch electrodes 30 and the specific routing of the touch lines 31 may be altered from those illustrated in the drawings as appropriate.

Figure 2:
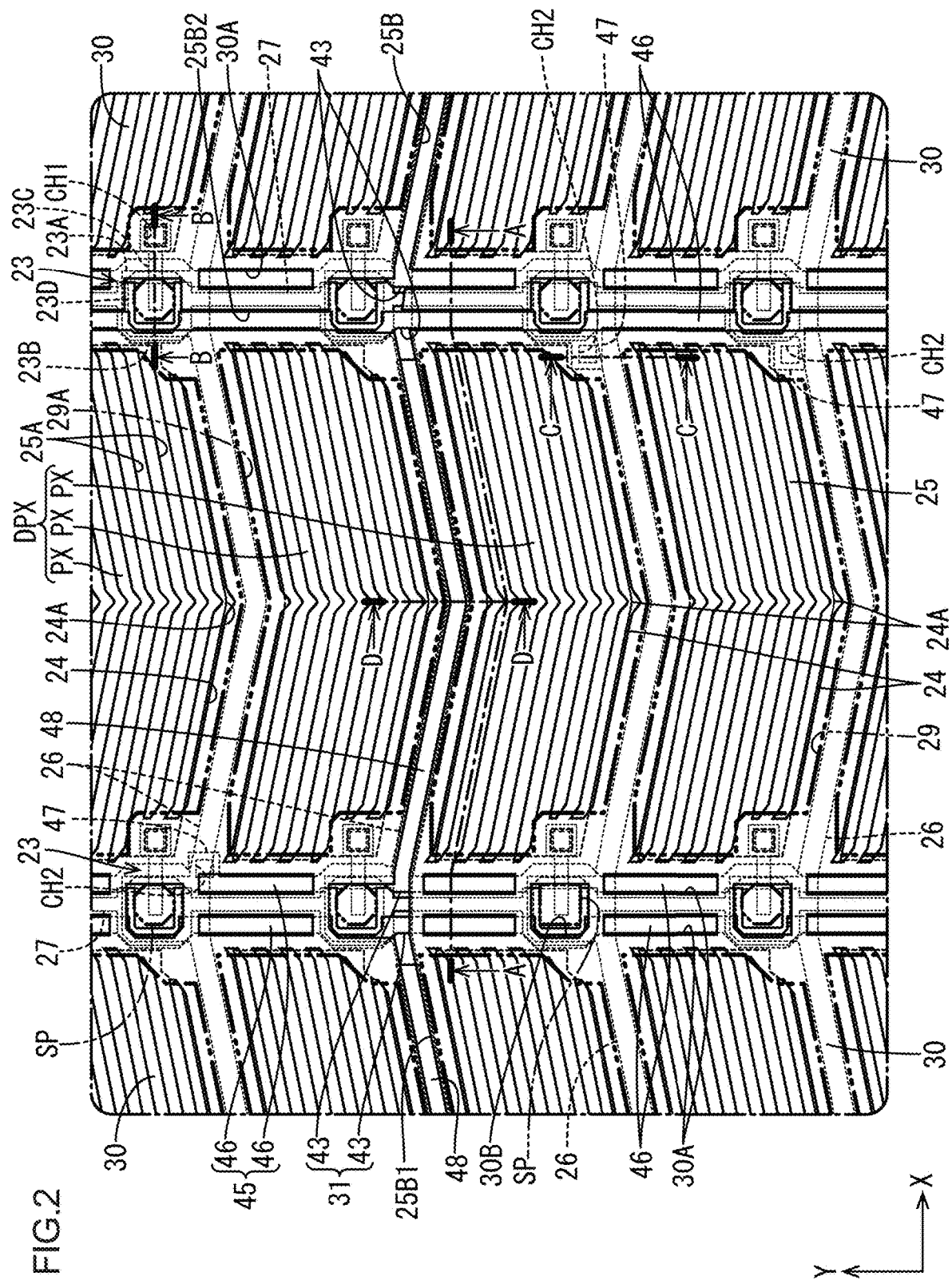
FIG. 2 is a plan view illustrating pixel arrangement in a display area of the liquid crystal panel.

FIG. 2 is a plan view illustrating the display area AA of the array substrate 21 and the CF substrate 20 included in the liquid crystal panel 11. As illustrated in FIG. 2, thin film transistors (TFTs) 23 (switching components) and pixel electrodes 24 are arranged on an inner surface of the array substrate 21 of the liquid crystal panel 11 in the display area AA. The TFTs 23 and the pixel electrodes 24 are arranged at intervals in the X-axis direction and the Y-axis direction, that is, in a matrix (in column and rows). Gate lines 26 (scan lines) and source lines 27 (image lines, signal lines, data lines) are routed perpendicular to each other (cross) to surround the TFTs 23 and the pixel electrodes 24. The gate lines 26 extend in a direction substantially along the X-axis direction. The source lines 27 extend in a direction substantially along the Y-axis direction. In this embodiment, the resolution of the liquid crystal panel 11 is FHD and color filters 28 of three different colors are arranged repeatedly along the source lines 27 (the Y-axis direction) as will be described later. With such a configuration, the number of the gate lines 26 is 3240 obtained by 1080×3 and the number of the source lines 27 is 1920. The gate lines 26 are connected to gate electrodes 23A of the TFTs 23 and the source lines 27 are connected to source electrodes 23B of the TFTs 23. The pixel electrodes 24 are connected to drain electrodes 23C of the TFTs 23. The TFTs 23 are driven based on signals supplied to the gate lines 26 and the source lines 27. Through the driving of the TFTs 23, application of potentials to the pixel electrodes 24 is controlled. Each TFT 23 is disposed on one side (on a left side in FIG. 2) of and adjacent to the pixel electrode 24 to be connected with respect to the X-axis direction.

As illustrated in FIG. 2, each of the pixel electrodes 24 has a laterally-long shape in a plan view and the elongated direction corresponds to the X-axis direction and the short-edge direction corresponds to the Y-axis direction. A ratio of the elongated dimension to the short-edge dimension of the pixel electrode 24 is 3. The gate lines 26 are disposed between the pixel electrodes 24 that are adjacent to on another in the short-edge direction (the Y-axis direction). The source lines 27 are disposed between the pixel electrodes 24 that are adjacent to one another in the elongated direction (the X-axis direction). Each pixel electrode 24 has a bent planar shape having a bent portion 24A that is included in an intermediate portion of the pixel electrode 24 with respect to the elongated direction. Specifically, the pixel electrode 24 has a shallow V-shape having an obtuse apex angle. The two elongated edges of each pixel electrode 24 are slightly inclined with respect to the X-axis direction and bent once at a middle portion thereof to form the shallow V-shape. The pixel electrode 24 includes the bent portion 24A at the middle portion with respect to the elongated direction. The pixel electrode 24 has a planar shape formed by linking two domains of a parallelogram at the bent portion 24A. The bent portion 24A is included at a linking portion linking the two domains and extends linearly in the short-edge direction of the pixel electrode 24 and extends between bent points at the two edges of the pixel electrode 24. The gate lines 26 disposed between the adjacent pixel electrodes 24 with respect to the short-edge direction extend along the elongated edges of the pixel electrode 24 and are bent repeatedly in a zig-zag manner along the elongated edges of the pixel electrodes 24. The interval between the gate lines 26 is about equal to the short-edge dimension of the pixel electrode 24 and the interval between the source lines 27 is about equal to the elongated dimension of the pixel electrode 24. The interval between the source lines 27 is about equal to the ratio obtained by dividing the elongated dimension of the pixel electrode 24 by the short-edge dimension (e.g., about 3) and accordingly, the number of the source lines 27 disposed per a unit length in the X-axis direction is reduced to about one third of that in a configuration including vertically elongated pixel electrodes. The interval between the gate lines 26 is about equal to the ratio obtained by dividing short-edge dimension of the pixel electrode 24 by the elongated dimension (e.g., about ⅓) and accordingly, the number of the gate lines 26 disposed per a unit length in the Y-axis direction is increased to about three times of that in the configuration including vertically elongated pixel electrodes. The number of the source lines 27 can be reduced and the number of image signals supplied to the source lines 27 is also reduced. The CF substrate 20 includes a black matrix 29 (an inter-pixel light blocking portion) that is illustrated by a chain double-dashed line in FIG. 2. The black matrix 29 is formed in a grid pattern in a plan view to separate the adjacent pixel electrodes 24. The black matrix 29 includes pixel openings 29A at positions overlapping large areas of the pixel electrodes 24 in a plan view. The light passing through the pixel electrodes 24 exit through the pixel openings 29A to the outside of the liquid crystal panel 11. The black matrix 29 overlaps at least TFTs 23, the gate lines 26 and the source lines 27 (including the main touch lines 43) on the array substrate 21 in a plan view. Spacers SP illustrated by a chain double-dashed line in FIG. 2 are disposed on the CF substrate 20. The Spacers SP keep the distance between the substrates 20, 21.

Figure 3:
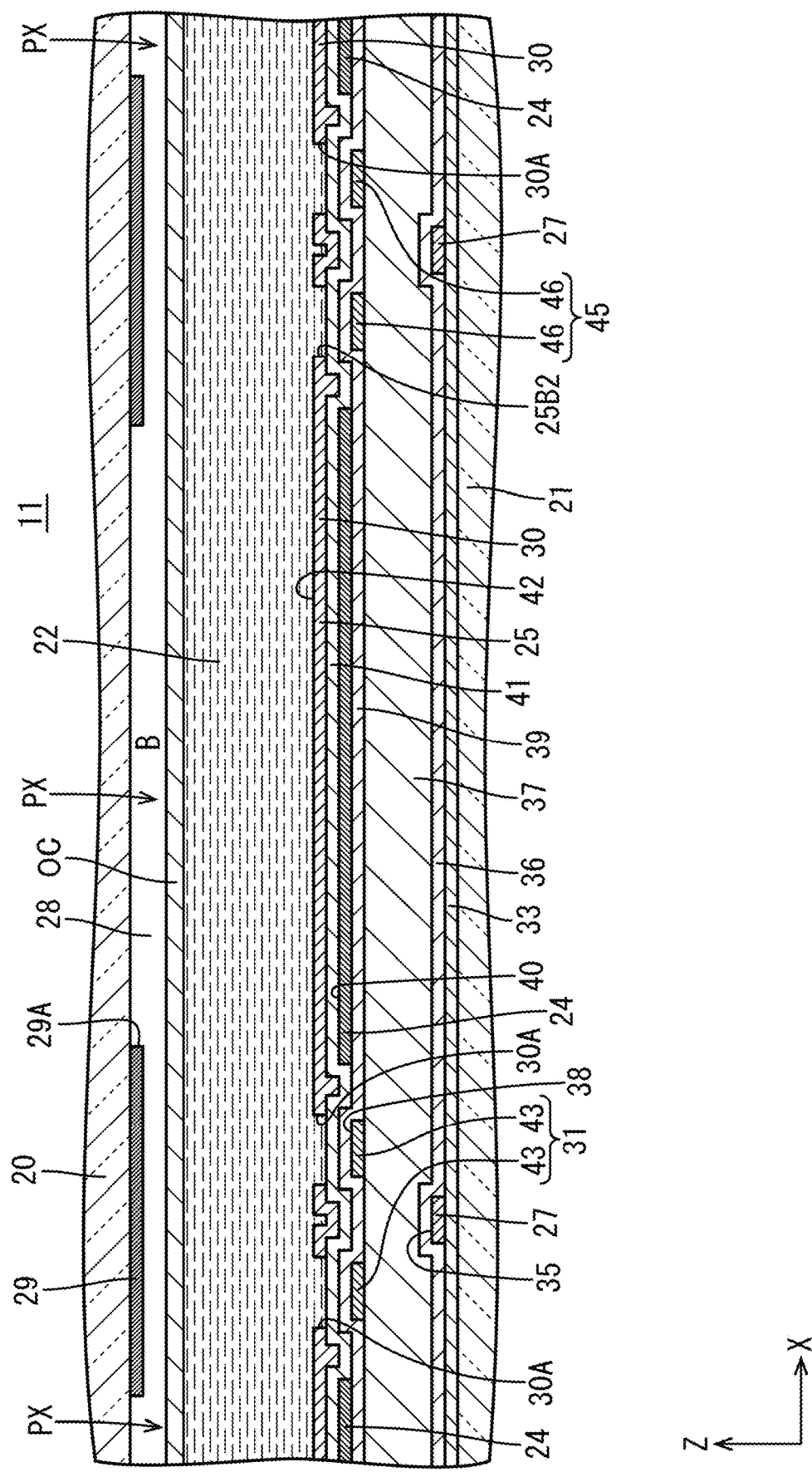
FIG. 3 is a cross-sectional view of the liquid crystal panel taken along line A-A in FIG. 2.

FIG. 3 is a cross-sectional view illustrating a middle section of the pixel PX included in the liquid crystal panel 11. As illustrated in FIG. 3, the liquid crystal panel 11 includes a liquid crystal layer 22 (a medium layer) between the substrates 20, 21. The liquid crystal layer 22 includes liquid crystal molecules that are substances having optical characteristics that change according to application of an electric field. Liquid crystal material having positive dielectric anisotropy (positive-type liquid crystal material) is used for the liquid crystal layer 22. Color filters 28 that exhibit three different colors of blue (B), green (G), and red (R) are disposed in the display area AA on the inner surface side of the CF substrate 20 of the liquid crystal panel 11. The color filters 28 are arranged in the X-axis direction and the Y-axis direction so as to overlap the pixel electrodes 24 on the array substrate 21, respectively, in a plan view. That is, the color filters 28 are arranged in a matrix. The color filters 28 that exhibit different colors are arranged along the source lines 27 (the Y-axis direction) in a repeated manner and the color filters that exhibit a same color are arranged along the gate lines 26 (the X-axis direction). In the liquid crystal panel 11, the R, the G, and the B color filters 28 that are arranged in the Y-axis direction and the three pixel electrodes 24 opposed to the respective three color filters 28 configure the pixels PX of the three colors, respectively. In the liquid crystal panel 11, the R, the G, and the B pixels PX that are adjacent to one another in the Y-axis direction form a display pixel DPX configured to perform color display in predefined tones. An interval between the pixels PX in the Y-axis direction is about 60 μm and an interval between the pixels PX in the X-axis direction is about 180 μm. The black matrix 29 is disposed to separate the color filter 28 into portions opposite the adjacent pixel electrodes 24. A planarization film OC is disposed in solid over an entire area of the CF substrate 20. The planarization film OC is included in an upper layer than (on the liquid crystal layer side of) the color filter 28. Alignment films are disposed on innermost surfaces of the substrates 20, 21 that are in contact with the liquid crystal layer 22, respectively. The alignment films are for aligning the liquid crystal molecules included in the liquid crystal layer 22.

Figure 4:
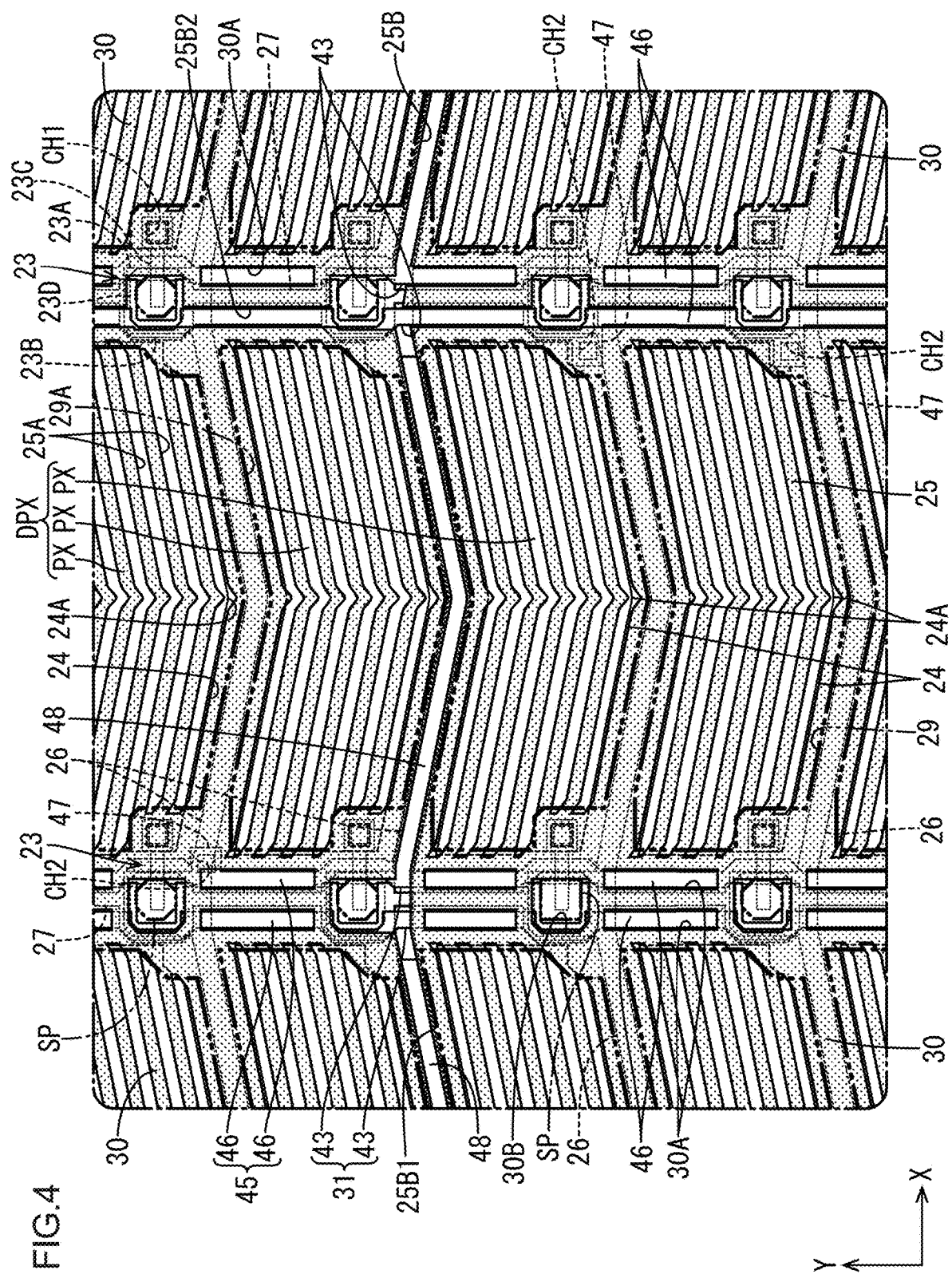
FIG. 4 is a plan view illustrating a pattern of a second transparent electrode film in FIG. 2.

Next, a common electrode 25 will be described with reference to FIGS. 2 to 4. FIG. 4 is a plan view illustrating a pattern of the common electrode 25 (a second transparent electrode film 42, which will be described later) included in the array substrate 21. The second transparent electrode film 42 is illustrated with shading in FIG. 4. As illustrated in FIGS. 2 to 4, the common electrode 25 is formed to overlap all the pixel electrodes 24 in a layer upper than the pixel electrodes 24 in the display area AA on an inner surface side of the array substrate 21. The common electrode 25 spreads over substantially an entire area of the display area AA to apply a reference voltage that is normally about constant except for a period (a sensing period) while receiving the touch signals (the position detection signals) and detecting the input position inputted by a finger, which is a position inputter. The common electrode 25 includes pixel overlapping openings 25A (pixel overlapping slits, alignment control slits) in areas overlapping the respective pixel electrodes 24. Each of the pixel overlapping openings 25A extends along the elongated direction of the pixel electrode 24. When a potential difference occurs between the pixel electrode 24 and the common electrode 25 that overlap each other as the pixel electrode 24 is charged, a fringe electric field (an oblique electric field) is created between an opening edge of the pixel overlapping opening 25A and the pixel electrode 24. The fringe electric field includes a component parallel to the plate surface of the array substrate 21 and a component normal to the plate surface of the array substrate 21. With the fringe electric field, orientations of the liquid crystal molecules included in the liquid crystal layer 22 can be controlled. Predefined display is performed according to the orientations of the liquid crystal molecules. Namely, the liquid crystal panel 11 according to this embodiment operates in fringe field switching (FFS) mode. The pixel electrode 24 in this embodiment has an elongated shape and includes the bent portion 24A in an intermediate portion with respect to the elongated direction. Therefore, the liquid molecules have various orientation directions due to the fringe electric fields that act on the liquid crystal layer 22 and have a border between those having different orientation directions (hereinafter, referred to as an orientation border) near the bent portion 24A of the pixel electrode 24. Specifically, in this embodiment, the liquid crystal layer 22 includes the liquid crystal material having positive dielectric anisotropy. Therefore, the liquid crystal molecules rotate in a counter-clockwise direction in a left section of the pixel electrode 24 with respect to the orientation border in FIGS. 2 and 4 and the liquid crystal molecules rotate in a clockwise direction in a right section of the pixel electrode 24 with respect to the orientation border in FIGS. 2 and 4. It is difficult to control the orientations of the liquid crystal molecules near the orientation border, and contribution to displaying is low in the section of the pixel electrode 24 near the orientation border.

As illustrated in FIGS. 2 to 4, the touch electrodes 30 are portions of the common electrode 25. The common electrode 25 includes dividing openings 25B (dividing slits) for separating the adjacent touch electrodes 30 from one another in addition to the pixel overlapping openings 25A. The dividing openings 25B include first openings 25B1 that cross the common electrode 25 and extend in the X-axis direction for an entire length of the common electrode 25 and second openings 25B2 that cross the common electrode 25 and extend in the Y-axis direction for an entire length of the common electrode 25. The first openings 25B1 separate the adjacent touch electrodes 30 that are adjacent to one another in the Y-axis direction and the second openings 25B2 separate the adjacent touch electrodes 30 that are adjacent to one another in the X-axis direction. The dividing openings 25B form a grid in a plan view. The first openings 25B1 overlap the gate lines 26 that are disposed between the touch electrodes 30 that are adjacent to one another in the Y-axis direction. The gate lines 26 includes ones that overlap the first openings 25B1 and ones that do not overlap the first openings 25B1. The second openings 25B2 overlap the source lines 27 that are disposed between the touch electrodes 30 that are adjacent to one another in the X-axis direction. The common electrode 25 includes the touch electrodes 30 that are separated from one another by the dividing openings 25B to form the grid in the plan view and electrically independent from one another. Therefore, the touch lines 31 that are connected to the touch electrodes 30 supply common signals (reference potential signals) for the display function and touch signals for the touch function to the touch electrodes 30 at different timings. The common signals are transmitted to all the touch lines 31 at the same timing and thus all the touch electrodes 30 have the reference potential and function as the common electrode 25.

As illustrated in FIG. 4, the touch electrodes 30 include touch line overlapping openings 30A (line overlapping openings) at least partially overlapping the main touch lines 43, which will be described later. The touch line overlapping openings 30A extend in the Y-axis direction that is parallel to the main touch lines 43. Each of the touch line overlapping openings 30A is vertically long in the plan view (elongated in the extending direction of the main touch lines 43). The width of each of the touch line overlapping openings 30A (a dimension in the X-axis direction) is about equal to the width of the main touch lines 43. Since the touch line overlapping openings 30A at least partially overlap the respective main touch lines 43, parasitic capacitances that may appear between the main touch lines 43 and the touch electrodes 30 that are not connected to the main touch lines 43 can be reduced. Therefore, proper sensitivity in detection of position input can be achieved. The touch electrodes 30 include TFT overlapping openings 30B (switching component overlapping openings) that partially overlap the respective TFTs 23.

Figure 5:
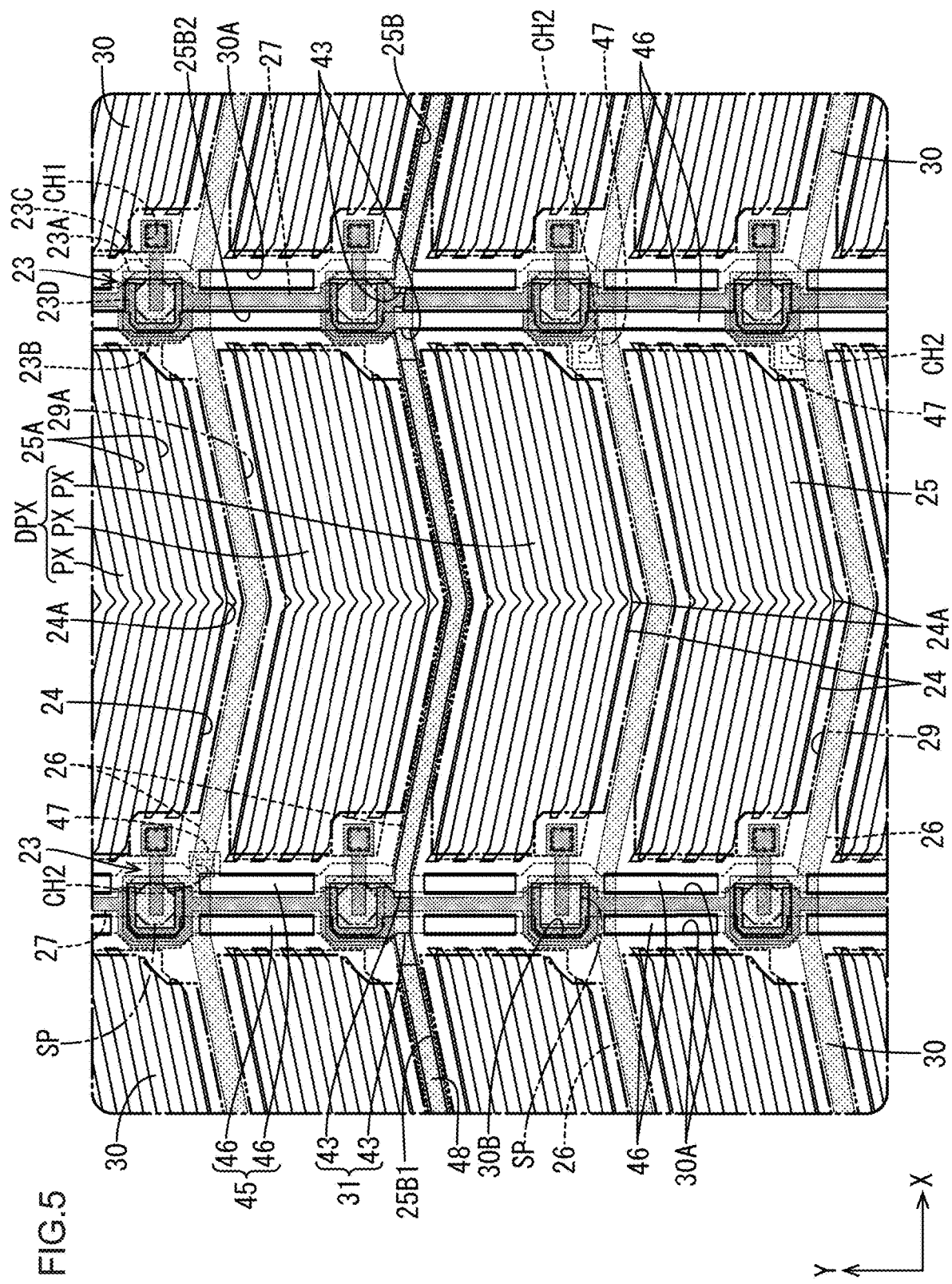
FIG. 5 is a plan view illustrating patterns of a first metal film and a second metal film in FIG. 2.

Configurations of the TFTs 23 will be described in detail with reference to FIG. 5. FIG. 5 is a plan view illustrating patterns of the electrodes 23A to 23C of the TFTs 23, the gate lines 26 and the source lines 27 (a first metal film 32 and a second metal film 35, which will be described later) included in the array substrate 21. The first metal film 32 and the second metal film 35 are illustrated with different kinds of shadings in FIG. 5. As illustrated in FIG. 5, the TFTs 23 include the gate electrodes 23A that branch off from the gate lines 26. The gate electrodes 23A protrude from sections of the gate lines 26 crossing the source lines 27 along the Y-axis direction toward the pixel electrodes 24 to be connected. Each of the gate electrodes 23A has a rectangular shape in a plan view. The gate electrodes 23A are provided with scan signals to be transmitted to the gate lines 26. The TFTs 23 include the source electrodes 23B that are sections of the source lines 27 overlapping the gate electrodes 23A. The section of each source line 27 crossing the gate line 26 is bent along three edges of the gate electrode 23A and has a channel shape that is open toward the pixel electrode 24 and the section is configured as the source electrode 23B. The sections of the source lines 27 that are configured as the source electrodes 23B are bent to be routed around on an opposite side from the pixel electrodes 24 to be connected with respect to the X-axis direction (the left side in FIG. 4) to prevent the contact with (short circuit) drain electrodes 23C, which will be described later. The TFTs 23 include the drain electrodes 23C disposed away from the source electrodes 23B. Each of the drain electrodes 23C is opposite the three edges of the source electrode 23B and extends from the opening area of the source electrode 23B in the X-axis direction. An extended end of the drain electrode 23C overlaps a portion (a corner portion) of the pixel electrode 24 in a plan view and is connected to the portion. The TFTs 23 include channel sections 23D that overlap the gate electrodes 23A and are connected to the source electrodes 23B and the drain electrodes 23C. Each channel section 23D has a rectangular plan view shape similar to the gate electrodes 23A and three edge sections of each channel section 23D are connected to the source electrode 23B and a section including the other edge section is connected to the drain electrode 23C. When the TFTs 23 turn on based on the scan signals supplied to the gate electrodes 23A, image signals (signals, data signals) supplied to the source lines 27 are transmitted from the source electrodes 23B to the drain electrodes 23C via the channel sections 23D. As a result, the pixel electrodes 24 are charged. The common electrode 25 includes the TFT overlapping openings 30B in sections overlapping the channel sections 23D of the TFTs 23 (refer to the symbol number 30B in FIG. 4). The TFT overlapping openings 30B are for suppressing variation in the leaking current amount between the source electrodes 23B and the drain electrodes 23C due to the potential change of the common electrode 25 (the touch electrodes 30) while the TFTs 23 are off or during the sensing period.

Figure 6:
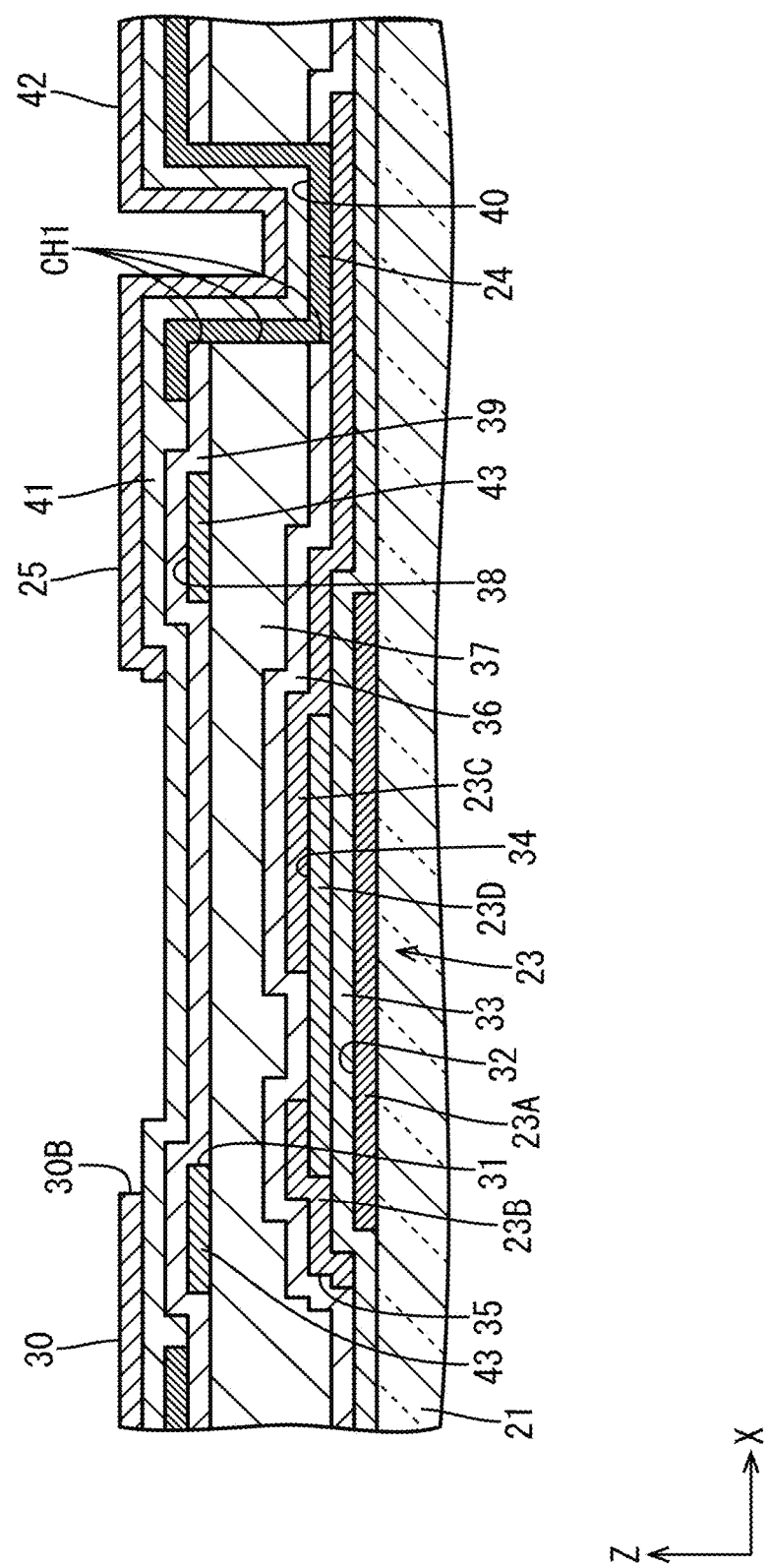
FIG. 6 is a cross-sectional view of an array substrate included in the liquid crystal panel taken along line B-B in FIG. 2.

Films disposed on top of each other on the inner surface of the array substrate 21 will be described with reference to FIG. 6. FIG. 6 is a cross-sectional view illustrating a portion of the array substrate 21 including the TFT 23. As illustrated in FIG. 6, a first metal film 32 (a conductive film), a gate insulating film 33 (an insulating film), a semiconductor film 34, a second metal film 35 (a conductive film), a first interlayer insulating film 36 (an insulating film), a planarization film 37 (an insulating film), a third metal film 38 (a conductive film), a second interlayer insulating film 39 (an insulating film), a first transparent electrode film 40, an electrode in-between insulating film 41 (an insulating film), and a second transparent electrode film 42 are stacked on the array substrate 21 in this sequence from a lower layer. Each of the first metal film 32, the second metal film 35, and the third metal film 38 may be a single-layer film made of one kind of metal, a multilayer film made of a material containing different kinds of metals such as copper, titanium aluminum, molybdenum, tungsten, or an alloy and have conductivity and light blocking properties. The gate lines 26 and the gate electrodes 23A of the TFTs 23 are portions of the first metal film 32. The source lines 27, the source electrodes 23B and the drain electrodes 23C of the TFTs 23, and the auxiliary touch lines 44 are portions of the second metal film 35. The main touch lines 43 and the auxiliary touch lines 44 are portions of the third metal film 38. The semiconductor film 34 is a thin film made of an oxide semiconductor material or a semiconductor material such as amorphous silicon. The channel sections 23D of the TFTs 23 are portions of the semiconductor film 34. The first transparent electrode film 40 and the second transparent electrode film 42 are made of a transparent electrode film (e.g., indium tin oxide (ITO) and indium zinc oxide (IZO)). The pixel electrodes 24 are portions of the first transparent electrode film 40. The common electrode 25 (the touch electrodes 30) is a portion of the second transparent electrode film 42.

The gate insulating film 33, the first interlayer insulating film 36, the second interlayer insulating film 39, and the electrode in-between insulating film 41 are made of an inorganic material such as silicon nitride ($SiN_X$) and silicon oxide ($SiO_2$). The planarization film 37 is made of an organic material such as acrylic resin (PMMA) and has a film thickness greater than those of other insulating films 33, 36, 39, 41. The array substrate 21 has a planar surface due to the planarization film 37. The gate insulating film 33 insulates the first metal film 32 in the lower layer from the semiconductor film 34 and the second metal film 35 in the upper layer. The first interlayer insulating film 36 and the planarization film 37 insulate the semiconductor film 34 and the second metal film 35 in the lower layer from the third metal film 38 in the upper layer. The first interlayer insulating film 36 and the planarization film 37 include pixel contact holes CH1 in portions thereof overlapping both of the drain electrode 23C and the pixel electrode 24 and the pixel contact holes CH are for connecting the drain electrode 23C and the pixel electrode 24. The second interlayer insulating film 39 insulates the third metal film 38 in the lower layer from the first transparent electrode film 40 in the upper layer. The electrode in-between insulating film 41 insulates the first transparent electrode film 40 in the lower layer from the second transparent electrode film 42 in the upper layer.

Figure 7:
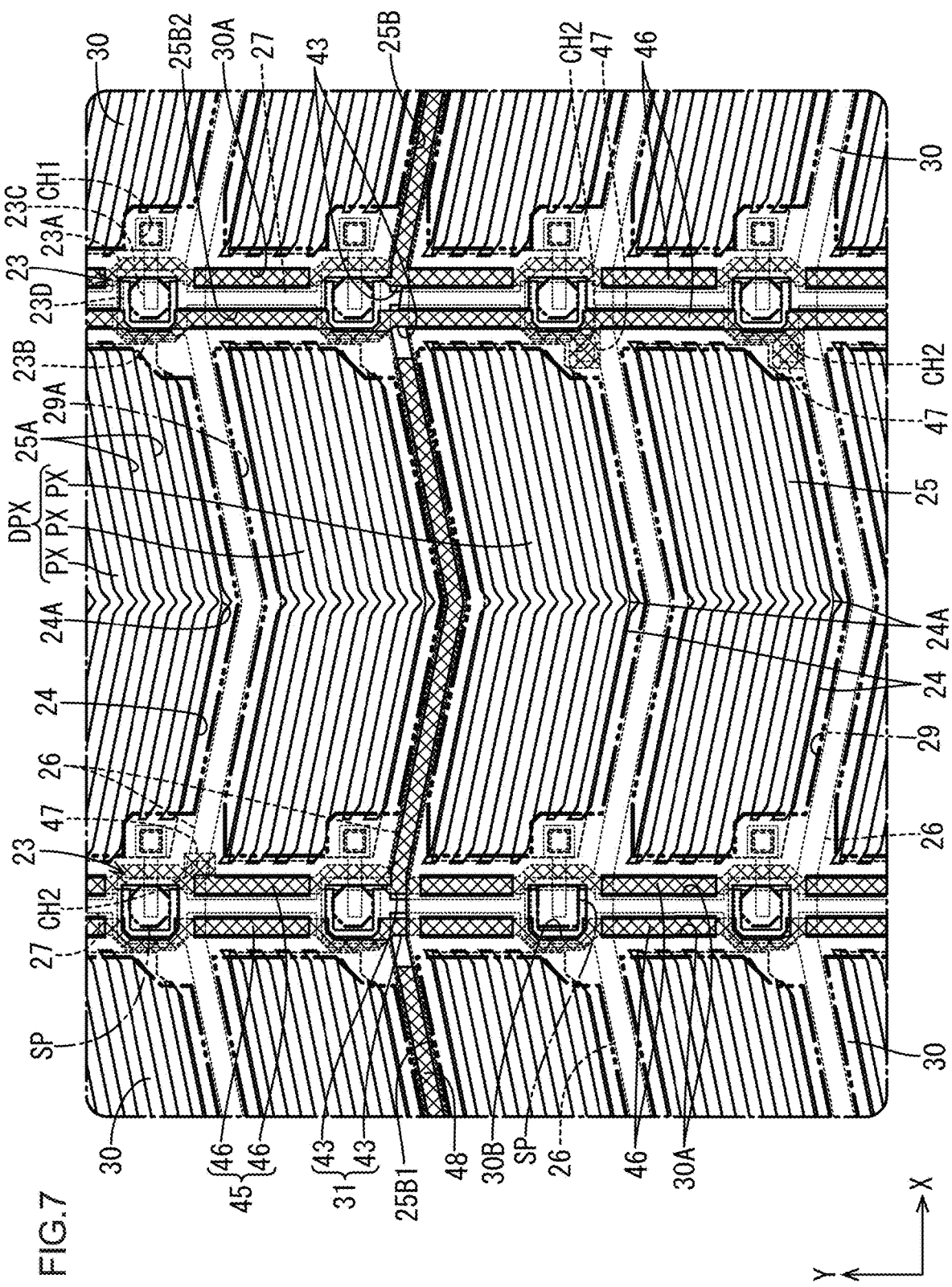
FIG. 7 is a plan view illustrating a pattern of a third metal film in FIG. 2.

Next, configurations of the main touch lines 43 in the display area AA will be described with reference to FIG. 7. FIG. 7 illustrates a plan view illustrating a pattern of the third metal film 38 portions of which are configured as the main touch lines 43 on the array substrate 21. The third metal film 38 is illustrated with shading in FIG. 7. As illustrated in FIG. 7, the main touch lines 43 are portions of the third metal film 38. The main touch lines 43 are disposed in a space that is adjacent to the pixel electrode 24, which is to be connected, on the same side (on the left side in FIG. 2) as the source lines 27 with respect to the pixel electrode 24 and extend in the Y-axis direction. The main touch lines 43 extend in the Y-axis direction in the space that is adjacent to the pixel electrode 24 with respect to the X-axis direction. The main touch lines 43 include portions that are adjacent to the pixel electrodes 24 while crossing the TFTs 23 and portions that are adjacent to the pixel electrodes 24 while not crossing the TFTs 23. Two main touch lines 43 are arranged in the space at an interval therebetween with respect to the X-axis direction. Therefore, the number of the main touch lines 43 is about twice as that of the source lines 27 and specifically is 3840. The number of the main touch lines 43 is smaller than the number of the touch electrodes 30, which is 3864. Every two main touch lines 43 and every one source line 27 that are adjacent to each column of the pixel electrodes 24 that are arranged in the Y-axis direction are sandwiched between the pixel electrodes 24 that are adjacent to each other in the X-axis direction except for the two main touch lines 43 and one source line 27 that are adjacent to the left end column of the pixel electrodes 24 in the display area AA in FIG. 1.

As illustrated in FIG. 7, the two main touch lines 43 that are adjacent to and on the same side with respect to the pixel electrode 24 as the source line 27 to be connected include common sections 45. The common sections 45 are disposed with a common position relation with respect to the source line 27. The common sections 45 include line non-overlapping common sections 46 that do not overlap the source lines 27 in a plan view. Specifically, the line non-overlapping common sections 46 of the main touch lines 43 are adjacent to the pixel electrodes 24 without crossing the TFTs 23. The line non-overlapping common sections 46 are spaced from the source line 27 at a small distance of about 1.5 μm, for example, with respect to the X-axis direction. The line non-overlapping common sections 46 included in each of the two main touch lines 43 that are adjacent to the pixel electrode 24 sandwich the source line 27 with respect to the X-axis direction. A distance between a center position of the source line 27 and a center position of each line non-overlapping common section 46 is about 6 μm, for example, and the width of each line non-overlapping common section 46 is about 5 μm, for example. Position relations between the source line 27 and the respective two line non-overlapping common sections 46 sandwiching the source line 27 are common. The distances between the source line 27 and the respective two line non-overlapping common sections 46 sandwiching the source line 27 are preferably equal to each other. However, the distances may be different due to an alignment displacement (about 1 μm, for example) that may be caused in a process of producing the array substrate 21 (a photolithography process) and it may be regarded that the distances with such small differences are about equal to each other.

According to such a configuration, even if a parasitic capacitance may appear between the source line 27 and each of the common sections 45 of the two main touch lines 43, the parasitic capacitances between the source line 27 and the common sections 45 can be equalized due to the common position relations of the common sections 45 and the source line 27. Therefore, difference between the parasitic capacitances that may appear between the source line 27 and the two main touch lines 43 is less likely to be caused. This suppresses deterioration of sensing precision (position detection precision) or lowering of display quality due to the difference in parasitic capacitances. Furthermore, in this embodiment, the common sections 45 include the line non-overlapping common sections 46, the parasitic capacitances that may appear between the main touch lines 43 and the source line 27 are suppressed compared to a configuration in which portions of the main touch lines overlap the source line 27 and the overlapping portions are configured as the common sections. Therefore, lowering of display quality is suppressed. One of the two main touch lines 43 (a left one in FIG. 7) crosses the TFTs 23 and includes portions that are adjacent to the pixel electrodes 24 and partially overlap the source electrodes 23B of the TFTs 23; however, the overlapping portions have non-common structures and small areas. Therefore, the parasitic capacitances are effectively suppressed. Further, the source line 27 is disposed between the two line non-overlapping common sections 46. With such a configuration, the distances between the source line 27 and the respective two pixel electrodes 24 sandwiching the source line 27 can be kept equal and the line non-overlapping common sections 46 of the two main touch lines 43 can be arranged effectively. Therefore, the parasitic capacitances between the source line 27 and each of the two pixel electrodes 24 can be equalized and display errors such as shadowing are less likely to be caused and the aperture ratio is less likely to be reduced.

As illustrated in FIG. 7, the main touch line 43 includes the line non-overlapping common sections 46 and portions that cross the TFTs 23 and are adjacent to the pixel electrodes 24. The line non-overlapping common sections 46 and the portions are arranged alternately in a repeated manner. Therefore, the number of the line non-overlapping common sections 46 included in one main touch line 43 is same as the number of the pixel electrodes 24 that are arranged in the Y-axis direction. Since the common sections of the main touch line 43 includes the line non-overlapping common sections 46, the main touch line 43 has the routing that extends almost straight and parallel to the Y-axis direction as a whole. The routing of the main touch line 43 is simplified compared to a configuration in which two main touch lines are routed so as to overlap the source line 27 alternately. The configuration of this embodiment is preferable for a configuration with a small width dimension of the main touch line 43 and a small distance between the two main touch lines 43.

As illustrated in FIG. 7, some of the line non-overlapping common sections 46 of the main touch line 43 overlap the dividing openings 25B that separate the common electrode 25. Specifically, since the line non-overlapping common sections 46 do not overlap the source line 27, portions of the second openings 25B2 of the dividing openings 25B overlapping the line non-overlapping common sections 46 do not overlap the source lines 27. The line non-overlapping common sections 46 that overlap the dividing openings 25B are included in one of the two main touch lines 43 (the left one in FIG. 7) that are adjacent to the source line 27 disposed between the touch electrodes 30 that are adjacent to each other in the X-axis direction. The second opening 25B2 extends substantially in the Y-axis direction and overlaps almost all of the line non-overlapping common sections 46 included in one of the main touch lines 43. According to such a configuration, an electric field that may be created between the source line 27 and the second opening 25B2 side opening edges of the dividing openings 25B of the touch electrodes 30 can be blocked by the line non-overlapping common sections 46 that overlap the second openings 25B2 of the dividing openings 25B. This suppresses deterioration of display quality due to an electric field that may be created near the second opening 25B2 side opening edges of the dividing openings 25B of the touch electrodes 30.

Figure 8:
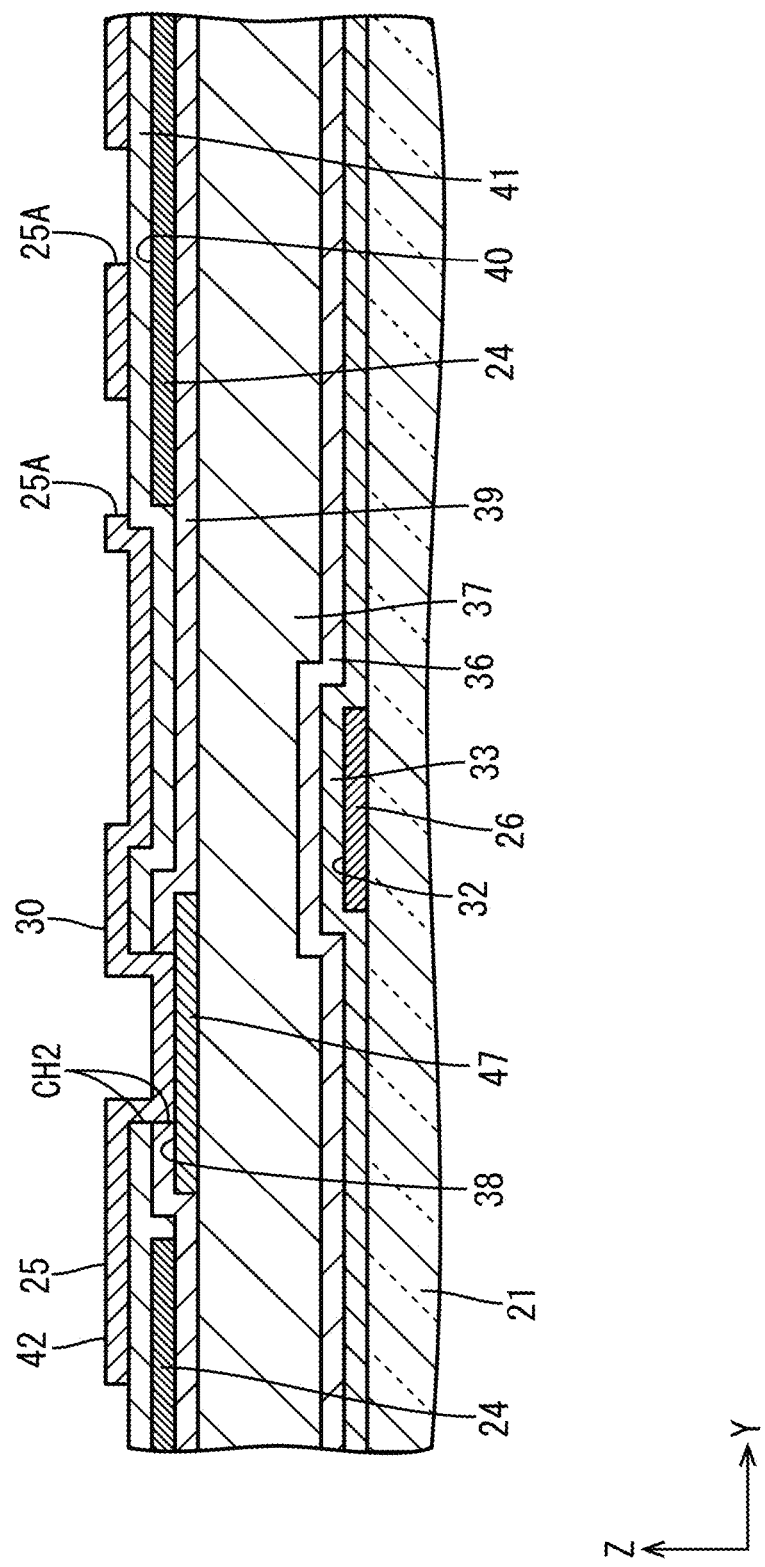
FIG. 8 is a cross-sectional view of the array substrate taken along line C-C in FIG. 2.

As illustrated in FIGS. 7 and 8, the main touch lines 43 includes a main touch line connection portion 47 (a main position detection line connection portion) that overlaps the touch electrode 30 (the common electrode 25) and is connected to the touch electrode 30. FIG. 8 is a cross-sectional view illustrating a portion of the array substrate 21 including the main touch line connection portion 47. The main touch line connection portion 47 is disposed near the TFT 23 that is to be connected to the source line 27 that is adjacent to the main touch line 43 in a plan view. The main touch line connection portions 47 are portions of the third metal film 38 that includes portions configured as the main touch lines 43 and are directly continuous from the main touch lines 43. Specifically, the main touch line connection portion 47 included in one of the two main touch lines 43 (the left one in FIG. 7) is disposed adjacent to the TFT 23 to be connected to the source line 27 that is near the main touch lines 43. The main touch line connection portion 47 is disposed on an opposite side from a connection structure (the pixel contact hole CH1) with respect to the TFT 23 in the X-axis direction. The connection structure is for connecting the pixel electrode 24 to the TFT 23. The main touch line connection portion 47 included in another one of the two main touch lines 43 (the right one in FIG. 7) is disposed adjacent to the TFT 23 to be connected to the source line 27 that is near the main touch lines 43. The main touch line connection portion 47 is disposed closer to the connection structure with respect to the TFT 23 in the X-axis direction. The connection structure is for connecting the pixel electrode 24 to the TFT 23. The main touch line connection portion 47 of the main touch line 43 that is a portion of the third metal film 38 and the touch electrode 30 that is a portion of the second transparent electrode film 42 are connected via the touch line contact holes CH2 in the second interlayer insulating film 39 and the electrode in-between insulating film 41 that are disposed between the main touch line connection portion 47 and the touch electrode 30.

Figure 9:
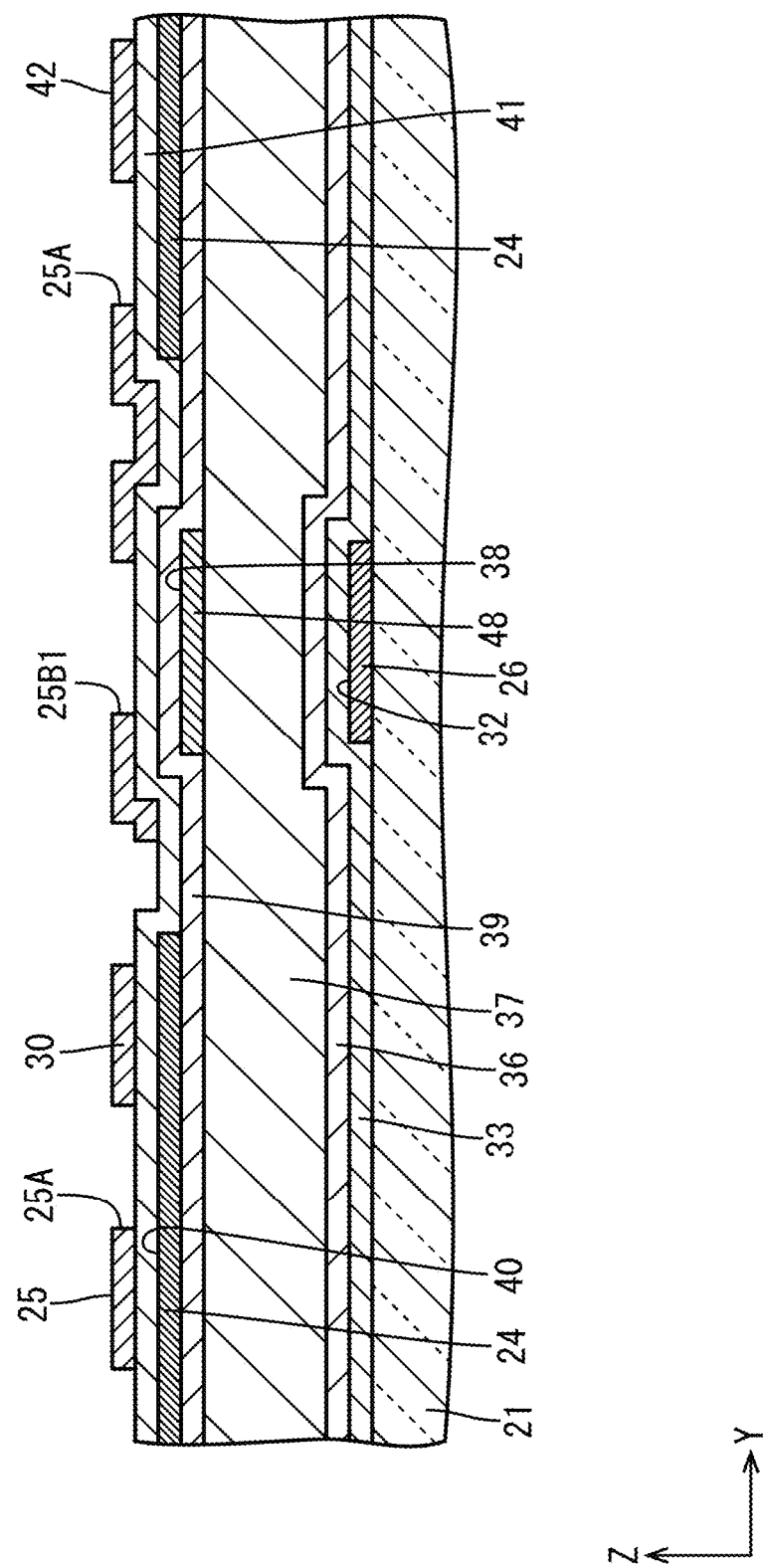
FIG. 9 is a cross-sectional view of the array substrate taken along line D-D in FIG. 2.

As illustrated in FIG. 7, the other one of the two main touch lines 43 is electrically connected to a blocking portion 48. The blocking portion 48 is disposed to overlap the first opening 25B1 of the dividing opening 25B and has a linear shape (a belt shape) with a constant width so as to extend along the first opening 25B1. Therefore, the blocking portion 48 selectively overlaps one of the gate lines 26 overlapping the first opening 25B1. The blocking portion 48 has a width dimension that is slightly greater than the width dimension of the gate line 26 and the width dimension of the first opening 25B1 but is smaller than the distance between the adjacent pixel electrodes 24 with respect to the Y-axis direction. Therefore, the blocking portions 48 do not overlap the pixel electrodes 24. The blocking portions 48 are portions of the third metal film 38 portions of which are configured as the main touch lines 43 and continuous directly from the main touch lines 43. The blocking portion 48 extends from the main touch line 43 to be connected toward a right side in FIG. 7 along the gate line 26 that the blocking portion 48 overlaps. The blocking portion 48 has a shallow V-shape extending along the elongated-side edge of the pixel electrode 24 and having an obtuse apex angle. The main touch line 43 connected to the blocking portion 48 and another main touch line 43 sandwich the pixel electrode 24. The blocking portion 48 has an extended distal end portion and the extended distal end portion is disposed adjacent to the TFT 23 that the other main touch line 43 cross. The blocking portion 48 is disposed between the touch electrodes 30 that are adjacent to each other in the Y-axis direction. As illustrated in FIG. 9, the gate insulating film 33, the first interlayer insulating film 36, and the planarization film 37 are disposed between the blocking portions 48 that are portions of the third metal film 38 and the gate lines 26 that are portions of the first metal film 32 to establish insulation. FIG. 9 is a cross-sectional view illustrating the portion of the array substrate 21 near the blocking portion 48. According to such a configuration, the blocking portion 48 overlapping the gate line 26 effectively blocks an electric field that may be created between the gate line 26 and the hole edge of the first opening 25B1 of the touch electrode 30. This suppresses deterioration of display quality due to the electric field in the edge portion of the touch electrode 30 adjacent to the first opening 25B1.

Figure 10:
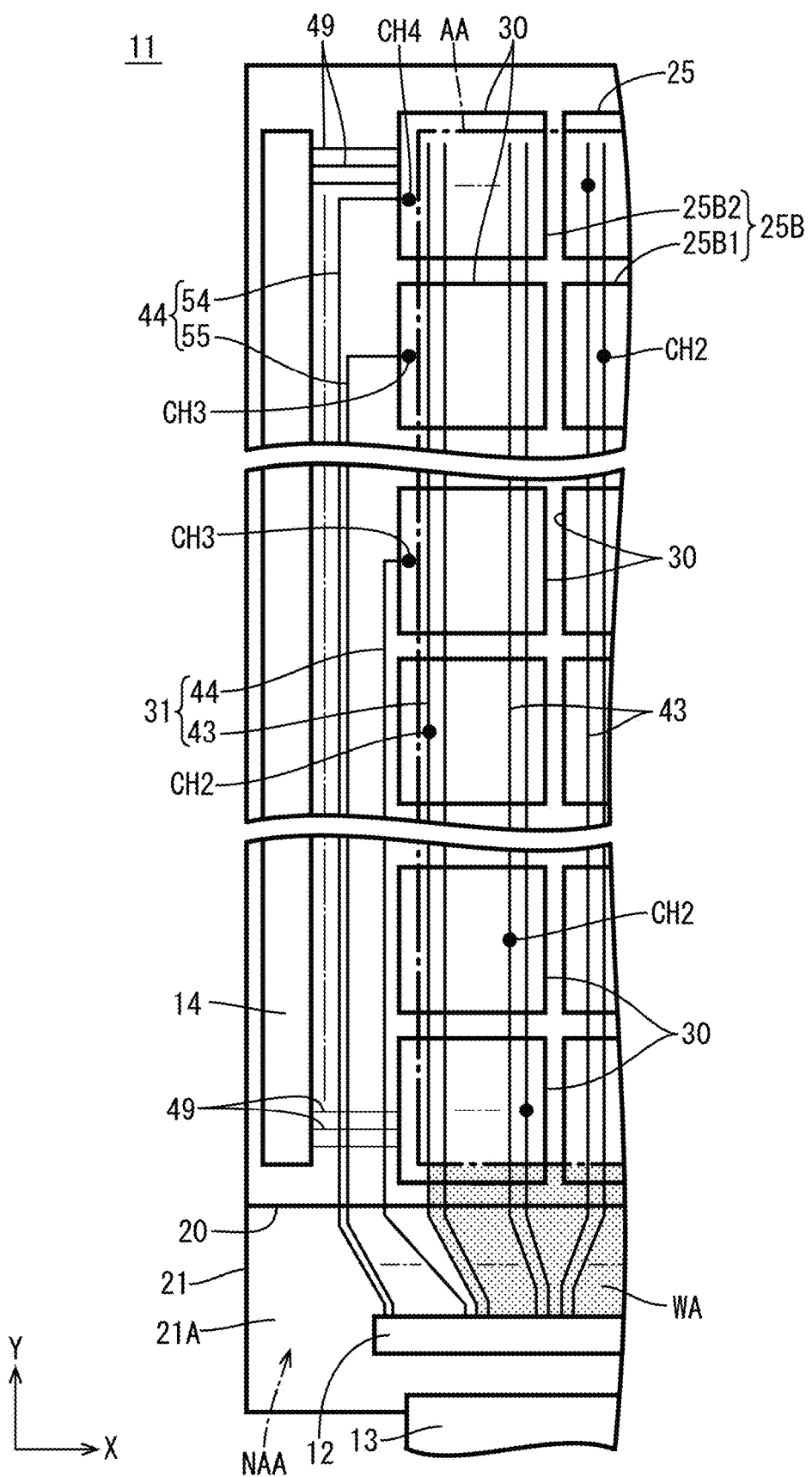
FIG. 10 is an enlarged plan view illustrating a portion of the liquid crystal panel including a driver, a gate circuit, touch electrodes, and auxiliary touch lines.

Next, configurations of the auxiliary touch lines 44 in the non-display area NAA that is outside the display area AA will be described with reference to FIGS. 10 to 18. FIG. 10 is an enlarged plan view illustrating the portion of the liquid crystal panel 11 including the driver 12, the gate circuit 14, the touch electrodes 30, and the auxiliary touch lines 44. The line crossing area WA is illustrated with shading in FIG. 10. As illustrated in FIG. 10, the auxiliary touch lines 44 are disposed in an area of the non-display area NAA between the gate circuit 14 and the display area AA. The area has a predefined width. The auxiliary touch lines 44 extend in the Y-axis direction in the area as the main touch lines 43 extend. The auxiliary touch lines 44 are arranged in two areas that sandwich the display area AA as previously described (refer to FIG. 1) and twelve auxiliary touch lines 44 are arranged in each of the two areas. Therefore, the number of the auxiliary touch lines 44 is equal to the value obtained by subtracting the number of the main touch lines 43 from the number of the touch electrodes 30. The auxiliary touch lines 44 are selectively connected to the touch electrodes 30 (the touch electrodes 30 that are not connected to the main touch lines 43) that are different from the touch electrodes 30 to be connected to the main touch lines 43. Thus, the touch lines 31 (the main touch lines 43 and the auxiliary touch lines 44) can be connected to all the touch electrodes 30 independently from one another. The auxiliary touch lines 44 extend outside the display area AA and around the line crossing area WA in which the main touch lines 43 extend between the driver 12 and the display area AA. The auxiliary touch lines 44 are arranged in the area adjacent to the display area AA in the X-axis direction (a direction crossing an arrangement direction in which the driver 12 and the display area AA are arranged). With such a configuration, the number of the main touch lines 43 can be reduced by the number of the auxiliary touch lines 44 and this reduces a space in the display area AA for arranging the main touch lines 43. In other words, the number of the touch electrodes 30 is increased by the number of the auxiliary touch lines 44 and this is preferable for improving the sensing accuracy (the position detecting accuracy). Specifically, among the touch electrodes 30 that are arranged in a matrix, the touch electrodes 30 that are to be connected to the auxiliary touch lines 44 belong to the columns of the touch electrodes 30 that are on the two ends of the display area AA with respect to the X-axis direction. The touch electrodes 30 included in each of the columns are arranged from the edge opposite from the driver 12 with respect to the Y-axis direction toward the driver 12. Among the touch electrodes 30 to be connected to the auxiliary touch lines 44, the touch electrodes 30 that are disposed at corner sections (of four corner sections) of the display area AA on an opposite side from the driver 12 with respect to the Y-axis direction are farthest from the driver 12. The auxiliary touch lines 44 and the touch electrodes 30 are connected to each other in the non-display area NAA.

Figure 11:
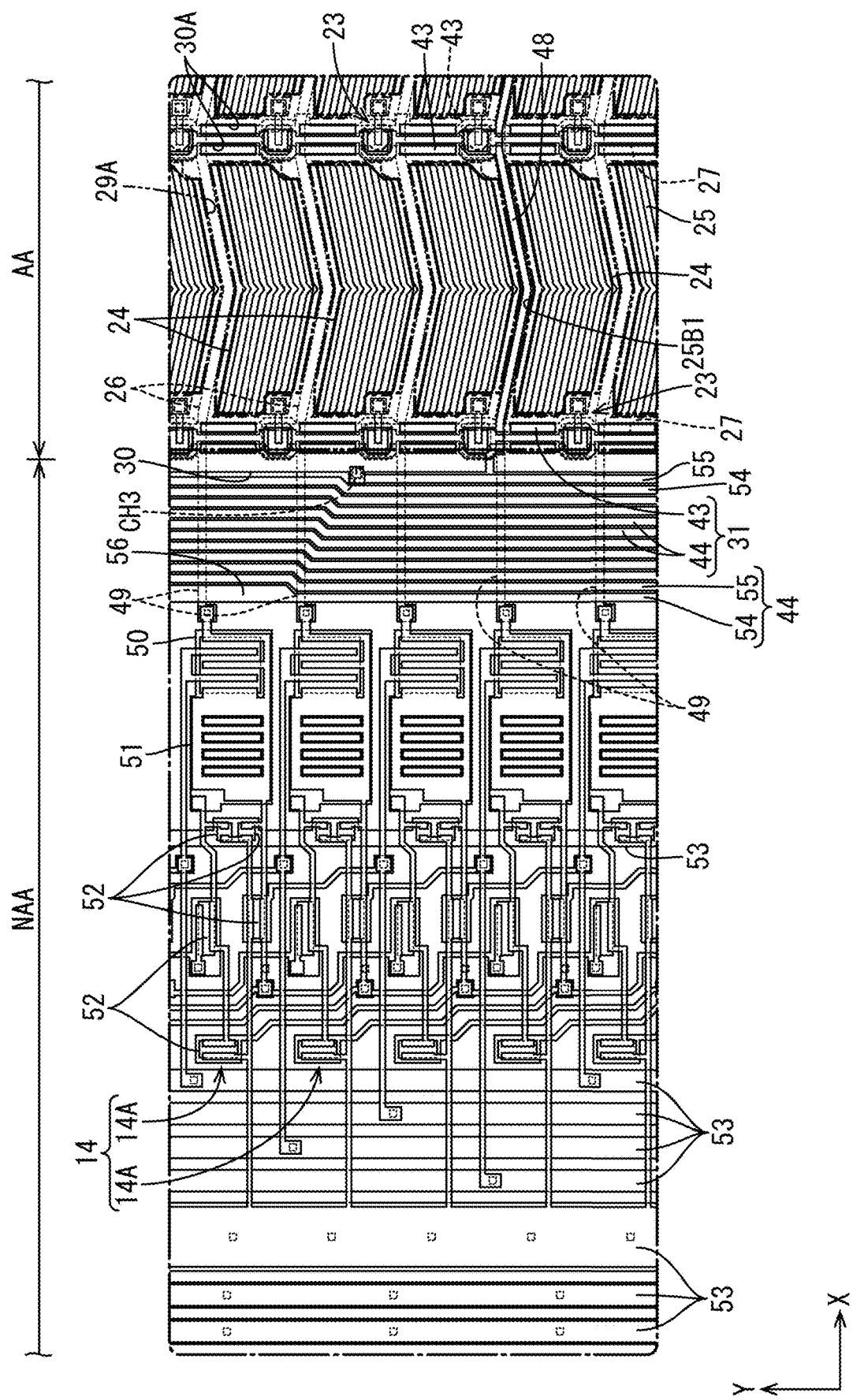
FIG. 11 is an enlarged plan view illustrating a portion of the array substrate including the gate circuit and the auxiliary touch lines.

Next, a detailed configuration of the gate circuit 14 that is adjacent to the auxiliary touch lines 44 will be described with reference to FIG. 11. FIG. 11 is an enlarged plan view illustrating the portion of the array substrate 21 including the gate circuit 14 and the auxiliary touch lines 44. The gate circuit 14 is a so-called shift resistor circuit and includes unit circuit sections 14A, as illustrated in FIG. 11. The unit circuit sections 14A are arranged linearly along the Y-axis direction at intervals. Each of the intervals is about equal to the interval between the gate lines 26 (the short-edge dimension of the pixel electrode 24). The unit circuit sections 14A are connected to the gate lines 26 via gate connection lines 49 (scanning connection lines) independently and supply scan signals independently. The number of the unit circuit sections 14A included in the gate circuit 14 is equal to the number of the gate lines 26. The number of the gate connection lines 49 is equal to each of the number of the gate lines 26 and the number of the unit circuit sections 14A. The unit circuit sections 14A of the gate circuit 14 are connected to one another to supply scan signals to the gate lines 26 sequentially from the upper level. The gate connection lines 49 extend in the X-axis direction in the area between the gate circuit 14 and the display area AA to cross an arrangement area in which the auxiliary touch lines 44 are disposed. The gate connection lines 49 are connected to the gate circuit 14 at one ends thereof and connected to the gate lines 26 at another ends thereof.

Circuit configurations of the unit circuit sections 14A will be described. As illustrated in FIG. 11, each of the unit circuit sections 14A includes an output transistor 50, a capacitance forming section 51, and control transistors 52. The output transistor 50 outputs scan signals to the gate connection line 49. The capacitance forming section 51 increases the driving voltage of the output transistor 50 (a potential of the gate electrode of the output transistor 50) to a potential higher than that of the scan signal outputted from the output transistor 50 with bootstrapping. The output transistors 50 are disposed closest to the display area AA and the auxiliary touch lines 44 among the components of the unit circuit sections 14A. The drain electrode of the output transistor 50 is connected to one end of the gate connection line 49. The capacitance forming sections 51 are disposed on an opposite side from the display area AA with respect to the output transistors 50 in the X-axis direction and near the output transistors 50. The control transistors 52 are dispersedly disposed in predefined areas, respectively, while having distances therebetween. The control transistors 52 are disposed on an opposite side from the display area AA with respect to the capacitance forming sections 51 in the X-axis direction. In this embodiment, one unit circuit section 14A includes five control transistors 52. The gate circuit 14 includes gate circuit signal lines 53 (eight gate circuit signal lines 53 in FIG. 11) for supplying clock signals and source voltage to the unit circuit sections 14A that are previously described. The gate circuit signal lines 53 have a belt-like shape extending linearly in the Y-axis direction.

Figure 12:
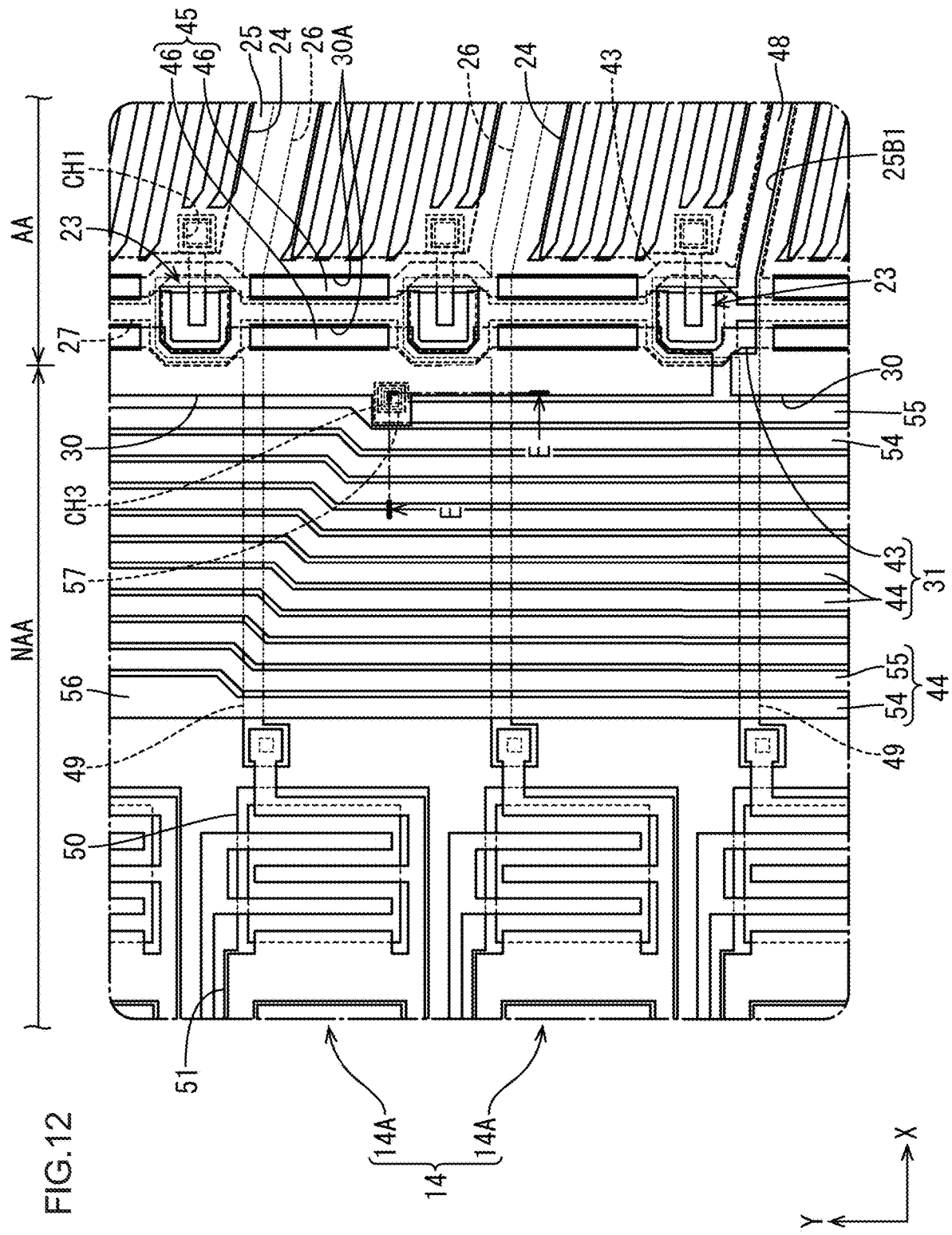
FIG. 12 is an enlarged plan view illustrating a portion of the array substrate including the auxiliary touch lines and illustrating a connection portion of the touch electrode and a second auxiliary touch line.
Figure 13:
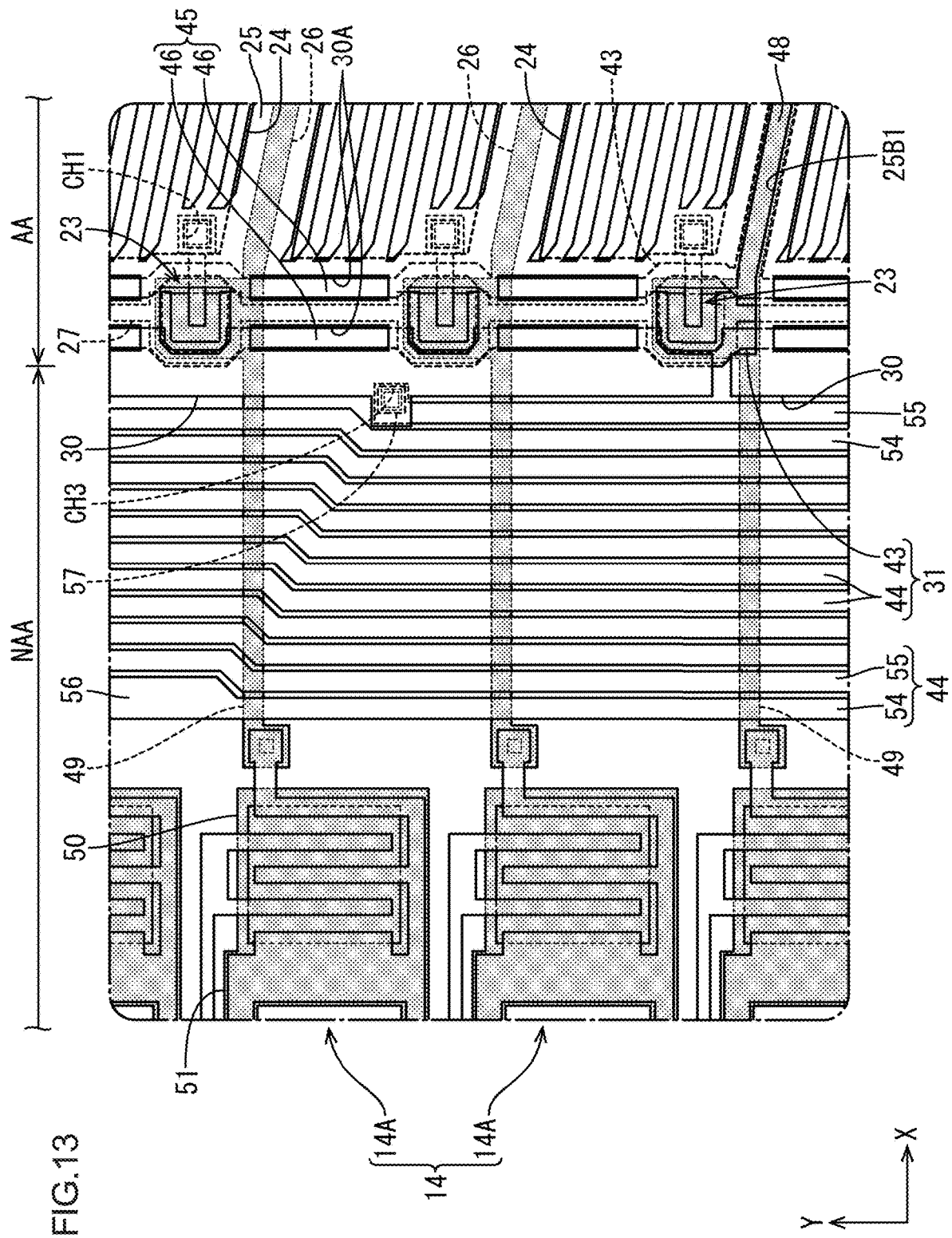
FIG. 13 is a plan view illustrating a pattern of the first metal film in FIG. 12.
Figure 14:
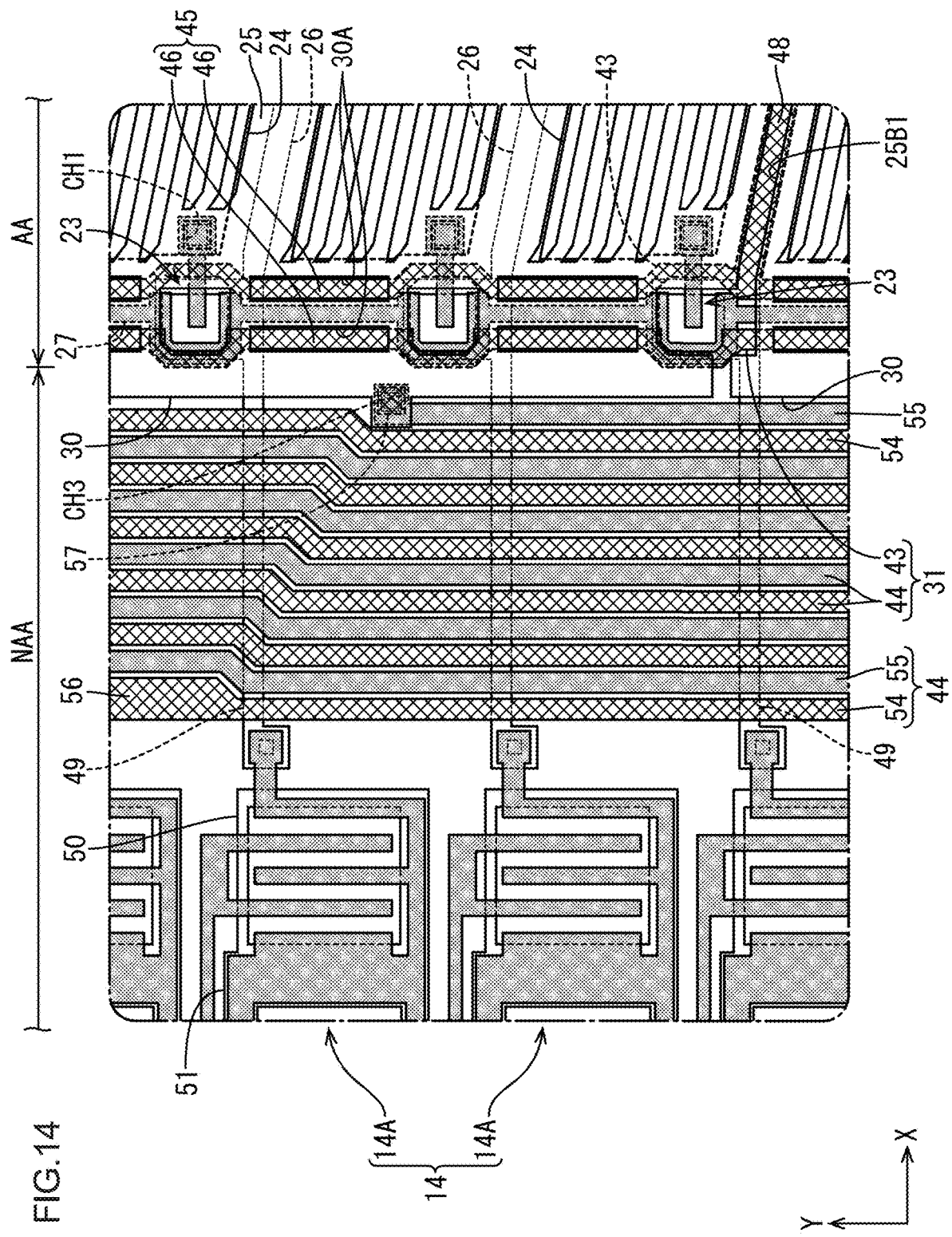
FIG. 14 is a plan view illustrating patterns of the second metal film and the third metal film in FIG. 12.

Details of the gate connection lines 49 and the auxiliary touch lines 44 will be described with reference to FIGS. 12 to 14. FIG. 12 is an enlarged plan view illustrating the portion of the array substrate 21 including the auxiliary touch lines 44 and is a plan view illustrating a connection portion of the touch electrode 30 and a second auxiliary touch line 55. FIG. 13 is a plan view illustrating a pattern of the first metal film 32 included in the configuration near the auxiliary touch lines 44 and the first metal film 32 is illustrated with shading. FIG. 14 is a plan view illustrating patterns of the second metal film 35 and the third metal film 38 included in the configuration near the auxiliary touch lines 44 and the second metal film 35 and the third metal film 38 are illustrated with different types of shading. As illustrated in FIGS. 12 and 13, the gate connection lines 49 are portions of the first metal film 32 portions of which are configured as the gate lines 26. The auxiliary touch lines 44 cross the gate connection lines 49. However, the auxiliary touch lines 44 are portions of the second metal film 35 or the third metal film 38 and do not include portions of the first metal film 32 portions of which are configured as the gate connection lines 49. According to such a configuration, the auxiliary touch lines 44 and the gate connection lines 49 that cross are less likely to be short-circuited and a large variety of the wiring structures related to the auxiliary touch lines 44 can be obtained compared to a prior-art configuration including a single conductive film as the auxiliary touch lines. In this embodiment, using a large variety of the wiring structures, the auxiliary touch lines 44 include first auxiliary touch lines 54 (first auxiliary position detection lines) that are portions of the third metal film 38 and second auxiliary touch lines 55 (second auxiliary position detection lines) that are portions of the second metal film 35. Each of the first auxiliary touch lines 54 is a portion of the third metal film 38 and has a single-layer structure and the first auxiliary touch lines 54 are connected to the touch electrodes 30 that are not connected to the second auxiliary touch lines 55. Each of the second auxiliary touch lines 55 is a portion of the second metal film 35 and has a single-layer structure and the second auxiliary touch lines 55 are connected to the touch electrodes 30 that are not connected to the first auxiliary touch lines 54. According to such a configuration, the first auxiliary touch lines 54 and the second auxiliary touch lines 55 that are arranged adjacent to one another in a plan view are less likely to be short-circuited. This increases a wiring density of the auxiliary touch lines 44 and a frame width of the array substrate 21 and the liquid crystal panel 11 can be reduced.

As illustrated in FIGS. 12 and 14, the first auxiliary touch lines 54 and the second auxiliary touch lines 55 extend in parallel to one another in the Y-axis direction and do not overlap. Specifically, the first auxiliary touch lines 54 (six first auxiliary touch lines) and the second auxiliary touch lines 55 (six second auxiliary touch lines) are arranged alternately and in a repeated manner at predefined intervals with respect to the X-axis direction. The first auxiliary touch lines 54 and the second auxiliary touch lines 55 are arranged in an area between the gate circuit 14 and the display area AA. The first auxiliary touch lines 54 and the second auxiliary touch lines 55 have a line width of about 5 μm, for example, and the distance between the first auxiliary touch line 54 and the second auxiliary touch line 55 that are adjacent to each other in the X-axis direction is quite small and is about 1.5 μm, for example. The first auxiliary touch lines 54 and the second auxiliary touch lines 55 that are arranged at quite small intervals are not short-circuited since the first auxiliary touch lines 54 and the second auxiliary touch lines 55 are portions of different metal films 35, 38. Further, the first auxiliary touch lines 54 and the second auxiliary touch lines 55 are disposed not to overlap. Therefore, compared to a configuration in which the first auxiliary touch lines and the second auxiliary touch lines overlap, the first auxiliary touch lines 54 and the second auxiliary touch lines 55 can be connected to the touch electrodes 30 easily and a parasitic capacitance that may be created between the first auxiliary touch lines 54 and the second auxiliary touch lines 55 can be reduced.

As illustrated in FIGS. 12 and 14, the auxiliary touch lines 44 are connected to the touch electrodes 30 to be connected sequentially while extending to be away from the driver 12 in the Y-axis direction. Among the first auxiliary touch lines 54 and the second auxiliary touch lines 55 that are arranged in the X-axis direction, ones that are disposed closer to the left in FIGS. 12 and 14 are to be connected to the touch electrodes 30 that are disposed farther away from the driver 12 in the Y-axis direction and ones that are disposed closer to the right in the same drawings are to be connected to the touch electrodes 30 that are disposed closer to the driver 12 in the Y-axis direction. FIGS. 12 to 14 illustrate the connection portion of the touch electrode 30 and the second auxiliary touch line 55 to be connected to the touch electrode 30 that is closest to the driver 12 in the Y-axis direction among the first auxiliary touch lines 54 and the second auxiliary touch lines 55. Specifically, the first auxiliary touch line 54 on the left end in FIGS. 12 and 14 is connected to the touch electrode 30 that is disposed at the edge (the corner section) farthest from the driver 12 in the Y-axis direction and has a greatest length (longest) from the driver 12 to the touch electrode 30 to be connected. On the other hand, the second auxiliary touch line 55 on the right end in the drawings is connected to the touch electrode 30 that is disposed closest to the driver 12 in the Y-axis direction and has a smallest length (shortest) from the driver 12 to the touch electrode 30 to be connected. Here, the length corresponds to a length of a transfer path through which touch signals are transferred to each of the auxiliary touch lines 54, 55. The first auxiliary touch lines 54 and the second auxiliary touch lines 55 are arranged alternately in a repeated manner in the X-axis direction. Therefore, the touch electrodes 30 that are to be connected to the auxiliary touch lines 44 and arranged in the Y-axis direction are arranged such that the touch electrodes 30 to be connected to the first auxiliary touch lines 44 and the touch electrodes 30 to be connected to the second auxiliary touch lines 55 are arranged alternately in a repeated manner in the Y-axis direction.

As illustrated in FIGS. 12 and 14, the auxiliary touch line 44 is connected to the touch electrode 30 to be connected at the end portion on an opposite side from the driver 12 side end portion. This provides a space corresponding to the auxiliary touch line 44 connected to the touch electrode 30 in an area of the array substrate 21 on an opposite side from the driver 12 with respect to the connection portion of the auxiliary touch line 44 and the touch electrode 30 in the Y-axis direction. Specifically, eleven auxiliary touch lines 44 are disposed on an upper side than the connection portion of the auxiliary touch line 44 (the second auxiliary touch line 55 on the right end in FIGS. 12 and 14) and the touch electrode 30 that is closest to the driver 12 in the Y-axis direction in FIGS. 12 and 14 among the touch electrodes 30 to be connected to the auxiliary touch lines 44. A space corresponding to one auxiliary touch line 44 that is connected to the touch electrode 30 is provided on the upper side than the connection portion. In this embodiment, the space allows the width of the particular auxiliary touch line to be increased. Specifically, near the connection portion of the touch electrode 30 and the auxiliary touch line 44, the other auxiliary touch lines 44 are obliquely bent so as to be closer to the display area AA and the auxiliary touch line 44 (the first auxiliary touch line 54 on the left end in FIGS. 12 and 14) to be connected to the touch electrode 30 that is disposed farthest away from the driver 12 has a wide portion 56 that is wider than the other auxiliary touch lines 44. The wide portion 56 has a line width that is about twice as that of a narrow portion that is in front thereof (on the driver 12 side) or that of the other auxiliary touch lines 44. The wide portion 56 extends in an area ranging from the connection portion of the shortest auxiliary touch line 44 (the second auxiliary touch line 55 on the right end in FIGS. 12 and 14) and the touch electrode 30 to be connected to the connection portion of the longest auxiliary touch line 44 including the wide portion 56 and the touch electrode 30 to be connected. With such a configuration, difference between a wire resistance of the second auxiliary touch line 55 whose length from the driver 12 to the touch electrode 30 to be connected is largest and a wire resistance of the other auxiliary touch lines 44 can be made smaller. Blunting is less likely to be caused in the signals transferred via the longest auxiliary touch line 44. Furthermore, since the wide portion 56 is provided in a restricted area with respect to the Y-axis direction using the space of the auxiliary touch line 44 connected to the touch electrode 30, the space for arranging the auxiliary touch lines 44 is less likely to be increased even with the presence of the wide portion 56. The configuration is preferable for reducing the frame width.

Figure 15:
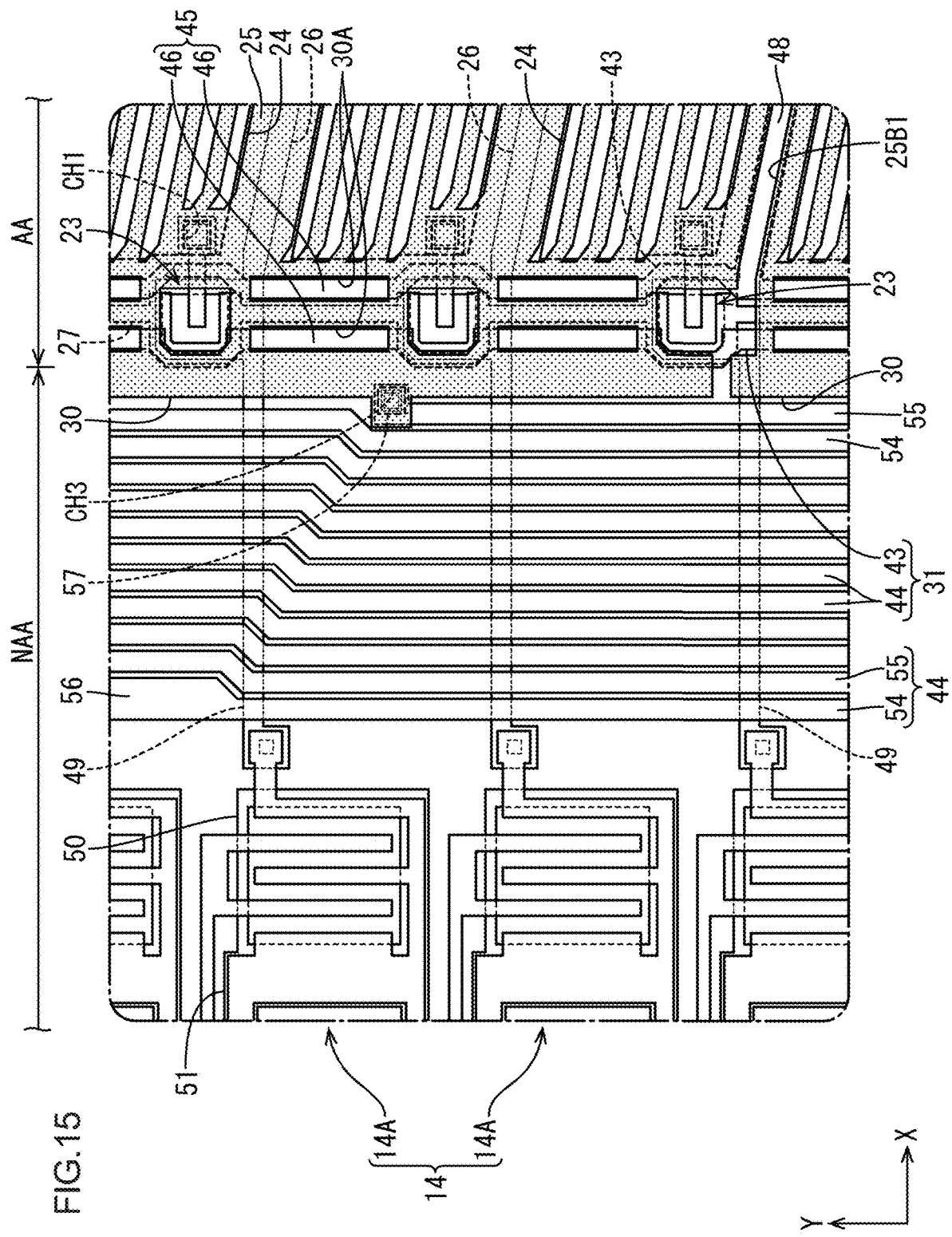
FIG. 15 is a plan view illustrating a pattern of a second transparent electrode film in FIG. 12.
Figure 16:
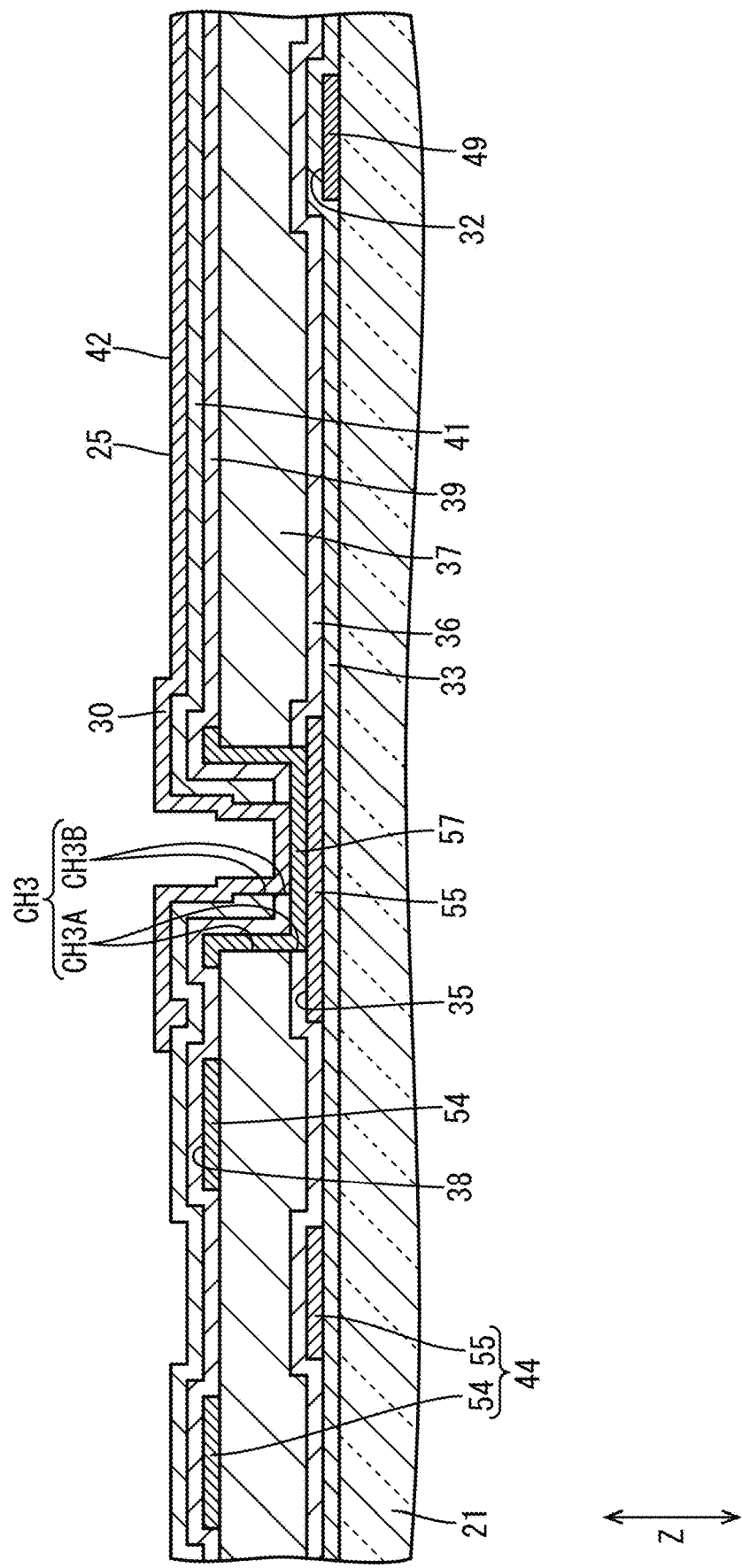
FIG. 16 is a cross-sectional view of the array substrate taken along line E-E in FIG. 12.

Next, the connection structure of the touch electrode 30 and the second auxiliary touch line 55 will be described with reference to FIGS. 15 and 16. FIG. 15 is a plan view illustrating the configuration near the auxiliary touch lines 44 and particularly a pattern of the second transparent electrode film 42. The second transparent electrode film 42 is illustrated with shading. FIG. 16 is a cross-sectional view illustrating the portion of the array substrate 21 including the connection portion of the touch electrode 30 and the second auxiliary touch line 55. As illustrated in FIG. 15, the touch electrode 30 to be connected to the auxiliary touch line 44 is disposed to straddle the display area AA and the non-display area NAA and includes a portion disposed in the non-display area NAA. The portion of the touch electrode 30 in the non-display area NAA overlaps the opposite end of the auxiliary touch line 44 from the driver 12 side. As illustrated in FIG. 16, the second auxiliary touch line 55 that is a portion of the second metal film 35 is connected to the touch electrode 30 to be connected and a portion of the second transparent electrode film 42 via a second auxiliary touch line contact hole CH3 formed through the first interlayer insulating film 36, the planarization film 37, the second interlayer insulating film 39, and the electrode in-between insulating film 41 that are disposed between the second auxiliary touch line 55 and the touch electrode 30. Specifically, an intermediate electrode 57 is disposed to overlap the second auxiliary touch line 55 and the touch electrode 30. The intermediate electrode 57 is a portion of the third metal film 38 and is disposed in an island form. The first interlayer insulating film 36 and the planarization film 37 that are disposed between the intermediate electrode 57 and the second auxiliary touch line 55 include lower layer-side second auxiliary touch line contact holes CH3A of the second touch line contact hole CH3. The intermediate electrode 57 is connected to the second auxiliary touch line 55 via the lower layer-side second auxiliary touch line contact holes CH3A. On the other hand, the second interlayer insulating film 39 and the electrode in-between insulating film 41 that are disposed between the intermediate electrode 57 and the touch electrode 30 include upper layer-side second auxiliary touch line contact holes CH3B of the second touch line contact hole CH3. The intermediate electrode 57 is connected to the touch electrode 30 via the upper layer-side second auxiliary touch line contact holes CH3B. Thus, the second auxiliary touch line 55 and the touch electrode 30 are electrically connected to each other via the intermediate electrode 57. Therefore, problems such as breaking of the film are less likely to be caused in the touch electrodes 30 and connection reliability is high compared to a configuration in which the second auxiliary touch line 55 is directly connected to the touch electrode 30.

As illustrated in FIG. 16, the first auxiliary touch lines 54 that are portions of the third metal film 38 are included in an upper layer than the gate connection lines 49 that are portions of the first metal film 32 via the gate insulating film 33, the first interlayer insulating film 36, and the planarization film 37 and are included in an upper layer than the second auxiliary touch lines that are portions of the second metal film 35 via the first interlayer insulating film 36 and the planarization film 37. The second auxiliary touch lines 55 that are portions of the second metal film 35 are included in an upper layer than the gate connection lines 49 that are portions of the first metal film 32 via the gate insulating film 33 and are included in a lower layer than the first auxiliary touch lines 54 that are portions of the third metal film 38 via the first interlayer insulating film 36 and the planarization film 37. This keeps the first auxiliary touch lines 54 and the second auxiliary touch lines 55 to be insulated from the gate connection lines 49 that cross the lines 54, 55. The first auxiliary touch lines 54 and the second auxiliary touch lines 55 are included in upper layers than the gate connection lines 49 while overlapping the gate connection lines 49 via at least the gate insulating film 33. Therefore, even if an electric field is created near the gate connection line 49 according to the transfer of the scan signals to the gate line 26, the electric field directed toward the upper layer (the liquid crystal layer 22) from the gate connection line 49 can be blocked by the first auxiliary touch lines 54 and the second auxiliary touch lines 55. Particularly, the first auxiliary touch lines 54 that are portions of the third metal film 38 are included in an upper layer than the gate connection lines 49 or disposed near the liquid crystal layer 22 via the gate insulating film 33, the first interlayer insulating film 36, and the planarization film 37. Therefore, the above-described electric field can be blocked more effectively. Alignment errors of the liquid crystal molecules included in the liquid crystal layer 22 may be caused due to the electric field directed toward the upper layer from the gate connection line 49; however, such alignment errors are less likely to be caused in the above configuration. For example, an alignment error of the liquid crystal molecules that may be caused due to charging of any one of the films disposed in the non-display area NAA of the CF substrate 20 may influence the alignment of the liquid crystal molecules in the display area AA. However, such display errors are less likely to be caused.

Figure 17:
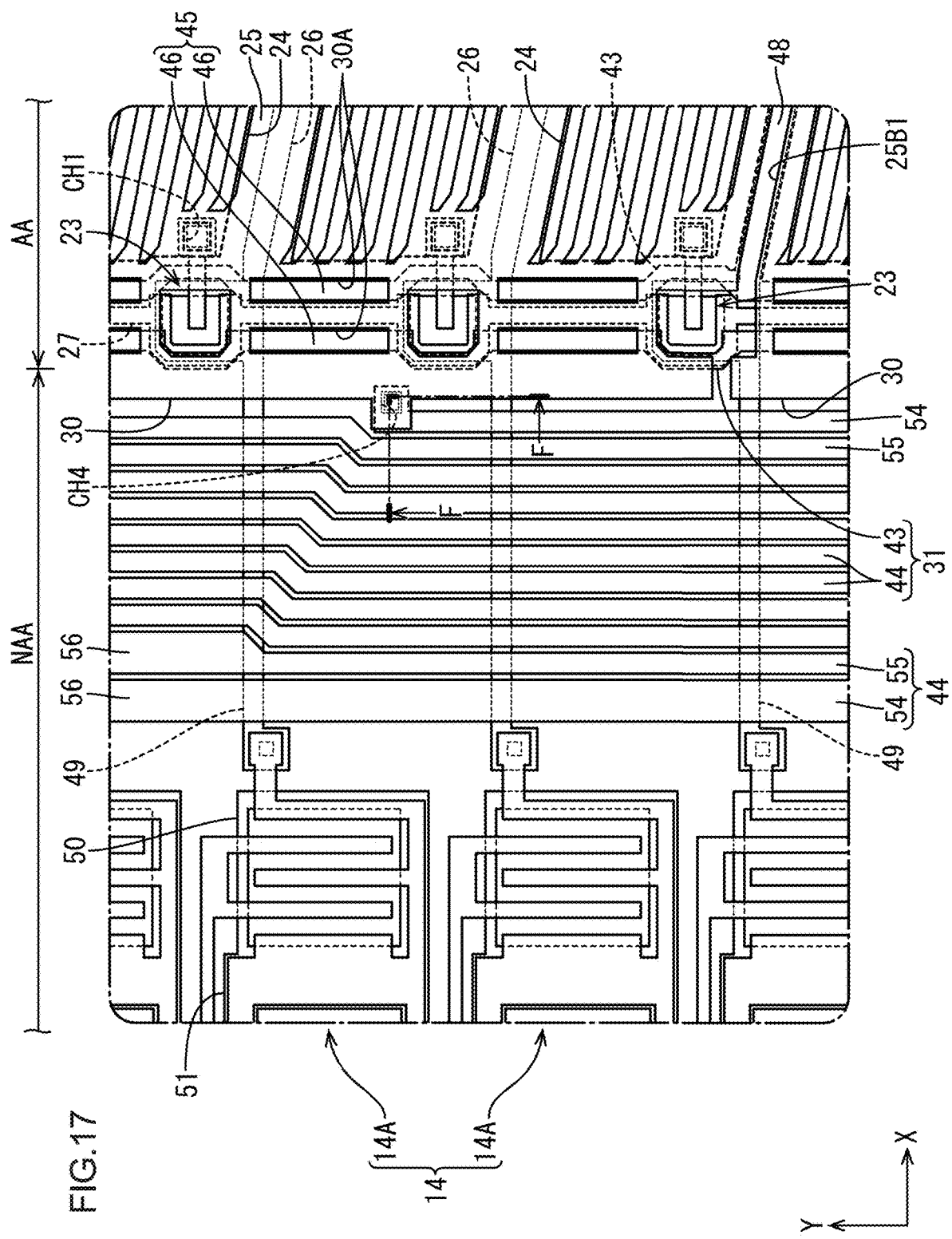
FIG. 17 is an enlarged plan view illustrating a portion of the array substrate including the auxiliary touch lines and illustrating a connection portion of the touch electrode and a first auxiliary touch line.
Figure 18:
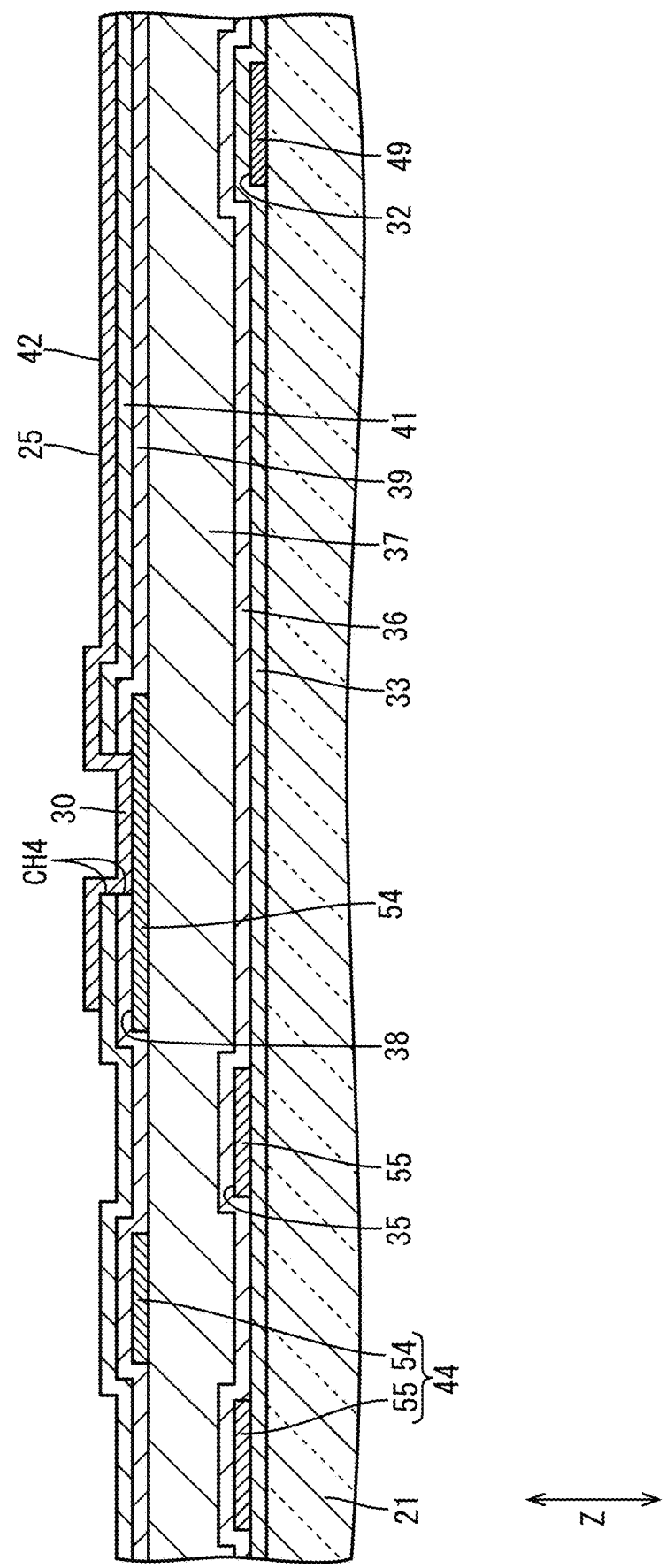
FIG. 18 is a cross-sectional view of the array substrate taken along line F-F in FIG. 17.

Next, the connection structure of the touch electrode 30 and the first auxiliary touch line 54 will be described with reference to FIGS. 17 and 18. FIG. 17 is an enlarged plan view illustrating a portion of the array substrate 21 including the auxiliary touch lines 44 and is a plan view illustrating a connection portion of the touch electrode 30 that is farther away from the driver 12 than that in FIG. 12 and the first auxiliary touch line 54. FIG. 18 is a cross-sectional view illustrating a portion of the array substrate 21 including the connection portion of the touch electrode 30 and the first auxiliary touch line 54. Among the first auxiliary touch lines 54 and the second auxiliary touch lines 55 that are arranged in the X-axis direction, the first auxiliary touch line 54 disposed on the right end in FIG. 17 is connected to the touch electrode 30 that is a second one from the driver 12 side in the Y-axis direction among the touch electrodes 30 to be connected to the auxiliary touch lines 44 as illustrated in FIG. 17. The first auxiliary touch line 54 on the right end in FIG. 17 has a length from the driver 12 to the touch electrode 30 to be connected and the length is a second smallest length. The first auxiliary touch line 54 on the right end in FIG. 17 corresponds to the second one from the right end in FIG. 12. The second auxiliary touch line 55 that is the second one from the left end in FIG. 17 includes the wide portion 56 using a space provided by connecting the auxiliary touch line 44 (the first auxiliary touch line 54 on the right end in FIG. 17) having a second smallest length to the touch electrode 30. The wide portion 56 of the second auxiliary touch line 55 that is the second one from the left end in FIG. 17 has a width same as that of the wide portion 56 of the first auxiliary touch line 54 on the left end in FIG. 17 and has a length smaller than that of the wide portion 56 of the first auxiliary touch line 54 on the left end in FIG. 17. The length of the wide portion 56 is a length extending to the touch electrode 30 to be connected. Such a configuration can reduce difference between a wire resistance of the auxiliary touch line 44 (the second auxiliary touch line 55 that is a second one from the left end in FIG. 17) whose length from the driver 12 to the touch electrode 30 to be connected is a second largest length and each of a wire resistance of the auxiliary touch line 44 (the first auxiliary touch line 54 on the left end in FIG. 17) whose length from the driver 12 to the touch electrode 30 to be connected is a largest length and a wire resistance of the other auxiliary touch lines 44. The lengths of the wide portions 56 of the auxiliary touch lines 44 that are arranged in the X-axis direction are varied according to the lengths from the driver 12 to the respective touch electrodes 30 to be connected. The wide portion 56 of a long auxiliary touch line 44 is long and the wide portion 56 of a short auxiliary touch line 44 is short. This can equalize the wire resistances of the auxiliary touch lines 44 that are arranged in the X-axis direction.

As illustrated in FIG. 18, the first auxiliary touch lines 54 that are portions of the third metal film 38 are connected to the touch electrodes 30 that are to be connected and are portions of the second transparent electrode film 42 via first auxiliary touch line contact holes CH4 formed in the second interlayer insulating film 39 and the electrode in-between insulating film 41. The connection structure of the first auxiliary touch line 54 and the touch electrode 30 is almost same as that of the intermediate electrode 57 and the touch electrode 30 (refer to FIG. 16).

As described before, the liquid crystal display device 10 (the display device) in this embodiment includes the pixel electrodes 24 that are disposed in the display area AA, the common electrode 25, the touch electrodes 30 (the position detection electrodes), the driver 12 (the signal supply section), the main touch lines 43 (the main position detection lines), and auxiliary touch lines 44 (the auxiliary position detection lines). The common electrode 25 at least partially overlaps the pixel electrodes 24 via the electrode in-between insulating film 41, which is an insulating film. The touch electrodes 30 are separated portions of the common electrode 25 and create electrostatic capacitances between the touch electrodes 30 and a position inputter performing position inputting and detect a position of the inputting performed by the position inputter. The driver 12 is arranged adjacent to the display area AA. The main touch lines 43 are at least partially disposed in the display area AA and one ends of the main touch lines 43 are connected to portions of the touch electrodes 30, respectively, and another ends of the main touch lines 43 are connected to the drivers 12. The main touch lines 43 cross a space between the driver 12 and the display area AA. The auxiliary touch lines 44 are disposed in a space outside the display area AA and between the driver 12 and the display area AA and routed around the line crossing area WA in which the main touch lines 43 are disposed. One ends of the auxiliary touch lines 44 are connected to touch electrodes 30 that are different from the touch electrodes 30 to be connected to the main touch lines 43 and other ends thereof are connected to the driver 12. The auxiliary touch lines 44 include ones that are portions of the second metal film 35 and another ones that are portions of the third metal film 38. The second metal film 35 and the third metal film 38 are conductive films and are included in different layers via the first interlayer insulating film 36 and the planarization film 37, which are insulating films.

According to such a configuration, when the pixel electrode 24 is charged, a potential difference is created between the pixel electrode 24 and the common electrode 25 that overlaps the pixel electrode 24 via the electrode in-between insulating film 41, which is an insulating film. The image display is performed using the potential difference. Electrostatic capacitances are created between the touch electrodes 30 that are separated portions of the common electrode 25 and the position inputter performing position inputting. The touch electrodes 30 detect the input positions inputted by the position inputter using the signals supplied via the main touch lines 43 and the auxiliary touch lines 44. The signals supplied from the drivers 12 are transferred via the main touch lines 43 and the auxiliary touch lines 44. The touch electrodes 30 are connected to the main touch lines 43 that cross the area between the driver 12 and the display area AA and also connected to the auxiliary touch lines 44 that are disposed outside the display area AA and between the driver 12 and the display area AA to be routed around the line crossing area WA in which the main touch lines 43 are disposed. This reduces the number of the main touch lines 43 by the number of the auxiliary touch lines 44. This reduces a space for arranging the main touch lines 43 within the display area AA. The number of the touch electrodes 30 can be increased and this is preferable for improving the position detection accuracy.

Furthermore, the auxiliary touch lines 44 includes ones that are portions of the second metal film 35 and ones that are portions of the third metal film 38. The second metal film 35 and the third metal film 38 that are conductive films included in different layers via the first interlayer insulating film 36 and the planarization film 37, which are insulating films. With such a configuration, a wide variety of the wiring structure can be obtained compared to the prior-art configuration including a single conductive film as the auxiliary touch lines. In this embodiment, using such a wide variety of the wiring structure, the auxiliary touch lines 44 includes ones that are portions of the second metal film 35, or one conductive film, and ones that are portions of the third metal film 38, or another conductive film different from the one conductive film. This increases the wiring density of the auxiliary touch lines 44.

The auxiliary touch lines 44 include the first auxiliary touch lines 54 (the first auxiliary position detection lines) and the second auxiliary touch lines 55 (the second auxiliary position detection lines). The first auxiliary touch lines 54 are portions of the third metal film 38 that is one of the conductive films including the second metal film 35 and the third metal film 38. The second auxiliary touch lines 55 are connected to the touch electrodes 30 that are different from the touch electrodes 30 to be connected to the first auxiliary touch lines 54. The second auxiliary touch lines 55 are portions of the second metal film 35 that is one of the conductive films including the second metal film 35 and the third metal film 38 and that is different one from the third metal film 38 portions of which are configured as the first auxiliary touch lines 54. According to such a configuration, the first auxiliary touch lines 54 and the second auxiliary touch lines 55 that are arranged adjacent to one another in a plan view are less likely to be short-circuited. This increases the wiring density of the auxiliary touch lines 44 and a frame width can be reduced compared to the prior-art configuration including a single conductive film as the auxiliary touch lines.

The first auxiliary touch lines 54 and the second auxiliary touch lines 55 extend in parallel to one another and do not overlap. According to such a configuration, the first auxiliary touch lines 54 and the second auxiliary touch lines 55 that do not overlap can be easily connected to the respective touch electrodes 30 to be connected and parasitic capacitances that may be created between the first auxiliary touch lines 54 and the second auxiliary touch lines 55 can be suppressed compared to the configuration in which the first auxiliary touch lines 54 and the second auxiliary touch lines 55 overlap.

The TFTs 23, the gate lines 26, and the gate connection lines 49 are further included. The TFTs 23 are disposed in the display area AA and connected to the pixel electrodes 24. The gate lines 26 extend and cross the main touch lines 43 in the display area AA and are connected to the TFTs 23. The gate connection lines 49 extend and cross the auxiliary touch lines 44 outside the display area AA and are connected to the gate lines 26. The auxiliary touch lines 44 include portions of the conductive films including the second metal film 35 and the third metal film 38. The auxiliary touch lines 44 include ones that are portions of the second metal film 35 and ones that are portions of the third metal film 38. The second metal film 35 is included in an upper layer than the gate connection lines 49 via the gate insulating film 33, which is an insulating film, and the third metal film 38 is included in an upper layer than the gate connection lines 49 via the gate insulating film 33, the first interlayer insulating film 36, and the planarization film 37, which are insulating films. According to such a configuration, the gate lines 26 are supplied with the signals for driving the TFTs 23 via the gate connection lines 49 and the pixel electrodes 24 are charged according to the driving of the TFTs 23. The electric field is created around the gate connection lines 49 that are disposed outside the display area AA according to the transfer of the signals. The auxiliary touch lines 44 crossing the gate connection lines 49 include portions of the conductive films including the second metal film 35 and the third metal film 38. The auxiliary touch lines 44 include ones that are portions of the second metal film 35 and ones that are portions of the third metal film 38. The second metal film 35 is included in an upper layer than the gate connection lines 49 via the gate insulating film 33, which is an insulating film, and the third metal film 38 is included in an upper layer than the gate connection lines 49 via the gate insulating film 33, the first interlayer insulating film 36, and the planarization film 37, which are the insulating films. With such a configuration, the electric field directed toward the upper layer from the gate connection lines 49 can be blocked. Therefore, display errors that may be caused by the electric field directed toward the upper layer from the gate connection lines 49 are less likely to be caused.

The TFTs 23 and the source lines 27 (image lines) are further included. The TFTs 23 are disposed in the display area AA and connected to the pixel electrodes 24. The source lines 27 extend in parallel to the main touch lines 43 in the display area AA and are connected to the TFTs 23. The pixel electrodes 24 have an elongated shape and the source lines 27 and the main touch lines 43 extend along the short-edge direction of the pixel electrodes 24. According to such a configuration, the source lines 27 are provided with the signals for charging the pixel electrodes 24 and the pixel electrodes 24 are charged according to the driving of the TFTs 23. In the configuration in which the source lines 27 and the main touch lines 43 extend along the short-edge direction of the pixel electrodes 24, the intervals between the source lines 27 and the intervals between the main touch lines 43 are increased and the number of the main touch lines 43 tends to be smaller than the number of the touch electrodes 30. The auxiliary touch lines 44 are disposed outside the display area AA and even if there is a shortage of the main touch lines 43, the shortage of the main touch lines 43 can be fulfilled.

Each of the main touch lines 43 includes the common sections 45 that are disposed at intervals to have a common position relationship with respect to the source line 27. According to such a configuration, even if parasitic capacitances appear between the source line 27 and each of the common sections 45 of the main touch lines 43, the parasitic capacitances are equalized. Difference is less likely to be caused in the parasitic capacitances that may appear between the main touch lines 43 and the source lines 27 and this suppresses lowering of display quality due to the difference in the parasitic capacitances.

The common sections 45 include the line non-overlapping common sections 46 that do not overlap the source lines 27. According to such a configuration, a parasitic capacitance is less likely to appear between the line non-overlapping common sections 46 and the source line 27 and display quality is less likely to be lowered compared to a configuration including the common sections overlapping the source lines 27.

Among the auxiliary touch lines 44, the auxiliary touch lines 44 whose lengths extending to the touch electrodes 30 to be connected are great partially have the wide portions 56 that are wider than the auxiliary touch lines 44 having small lengths. The wide portion 56 extends in an area ranging from the connection portion of the short auxiliary touch line 44 and the touch electrode 30 to be connected to the connection portion of the long auxiliary touch line 44 and the touch electrode 30 to be connected. According to such a configuration, blunting is less likely to be caused in the signals transferred via the auxiliary touch line 44 whose length extending to the touch electrode 30 to be connected is great among the auxiliary touch lines 44. The wide portion 56 of the long auxiliary touch line 44 is provided in a restricted area ranging from the connection portion of the short auxiliary touch line 44 and the touch electrode 30 to be connected to the connection portion of the long auxiliary touch line 44 and the touch electrode 30 to be connected. Therefore, the space for arranging the auxiliary touch lines 44 is less likely to be increased due to the presence of the wide portion 56. The configuration is preferable for reducing the frame width.

The main touch lines 43 and the auxiliary touch lines 44 extend in parallel to one another and the auxiliary touch lines 44 are connected to the respective touch electrodes 30 that are arranged along the extending direction of the auxiliary touch lines 44. According to such a configuration, among the touch electrodes 30, ones that are arranged along the extending direction of the main touch lines 43 and the auxiliary touch lines 44 are supplied with the signals that are transferred via the auxiliary touch lines 44. Such a configuration reduces the length of the auxiliary touch lines 44 and blunting is less likely to be caused in the signals compared to a configuration in which the auxiliary touch lines 44 are connected to the touch electrodes 30 that are disposed on the edge portion opposite from the driver 12 side with respect to the extending direction.

Second Embodiment

A second embodiment will be described with reference to FIG. 19 or FIG. 20. The second embodiment includes auxiliary touch lines 58 having a configuration different from that of the first embodiment. Configurations, operations, and effects similar to those of the first embodiment previously described will not be described.

Figure 19:
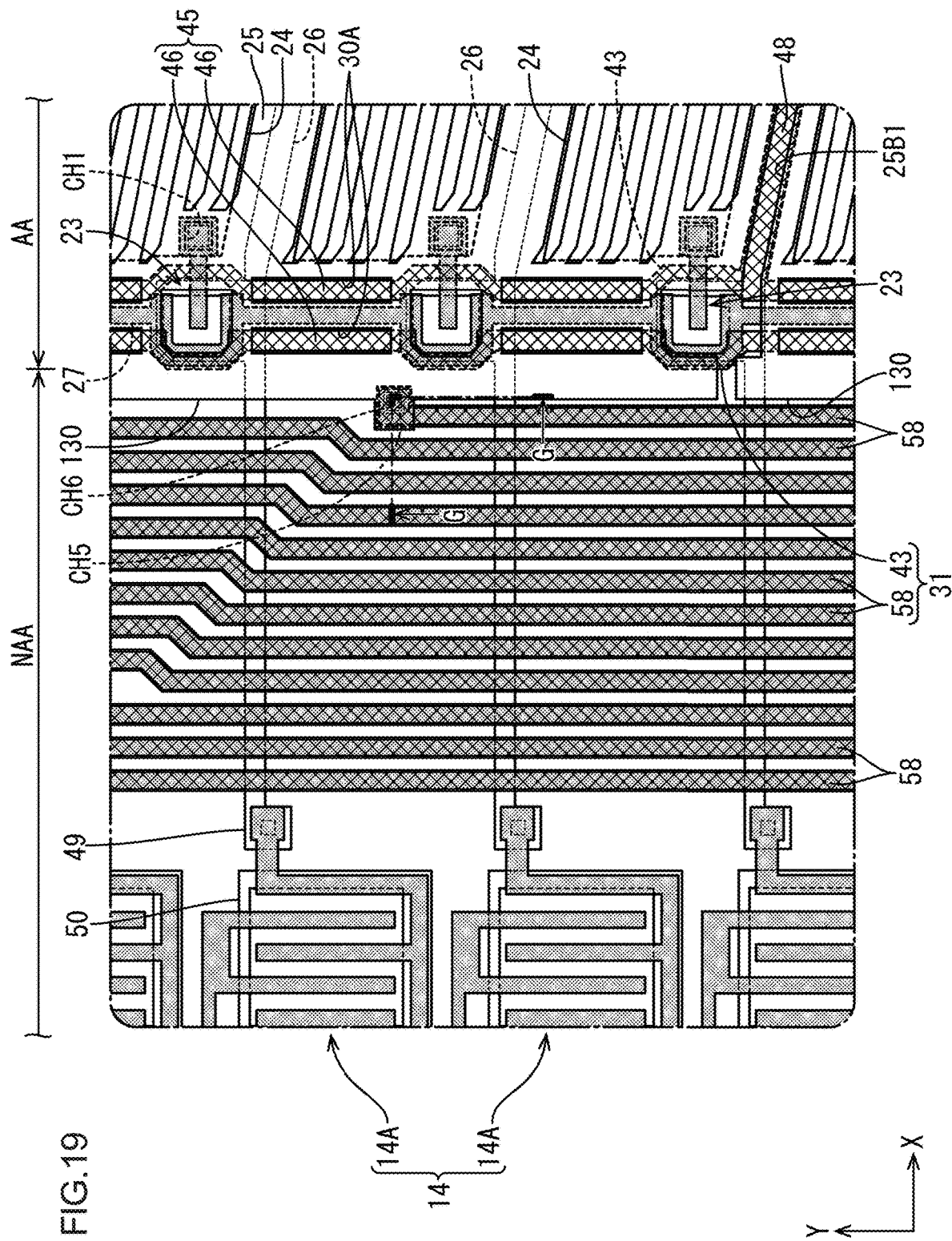
FIG. 19 is an enlarged plan view illustrating auxiliary touch lines in an array substrate included in a liquid crystal panel according to a second embodiment and illustrating patterns of a second metal film and a third metal film.
Figure 20:
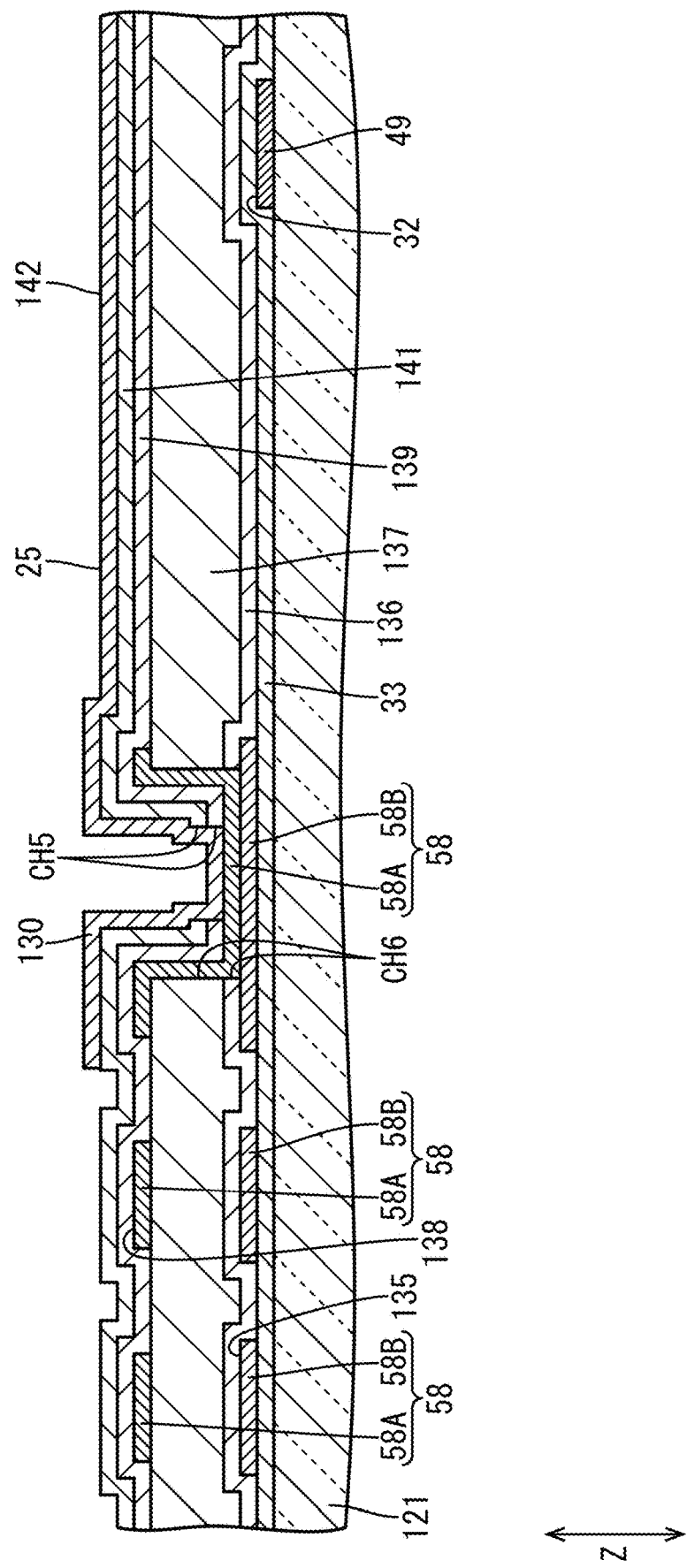
FIG. 20 is a cross-sectional view of the array substrate taken along line G-G in FIG. 19.

As illustrated in FIGS. 19 and 20, the auxiliary touch line 58 in this embodiment has a multilayer structure and includes a first line section 58A that is a portion of a third metal film 138 and a second line section 58B that is a portion of a second metal film 135. FIG. 19 is an enlarged plan view illustrating a portion of an array substrate 121 including the auxiliary touch lines 58 and is a plan view illustrating patterns of the second metal film 135 and the third metal film 138. The second metal film 135 and the third metal film 138 are illustrated with different types of shading in FIG. 19. FIG. 20 is a cross-sectional view illustrating a connection portion of a touch electrode 130 and the auxiliary touch line 58 in the array substrate 121. The first line sections 58A and the second line sections 58B of the auxiliary touch lines 58 extend in parallel to each other and overlap over entire lengths thereof and are electrically connected to each other. With the configuration of the auxiliary touch lines 58 including the first line sections 58A and the second line sections 58B that are connected to each other, the wire resistance can be reduced compared to the prior-art configuration including a single conductive film as the auxiliary touch lines. Further, since the first line sections 58A and the second line sections 58B are disposed to overlap, a high wiring density can be maintained compared to a configuration in which the line sections do not overlap.

As illustrated in FIG. 20, the first line sections 58A and the second line sections 58B are connected to each other at a position that overlaps a connection portion of the touch electrode 130 and the auxiliary touch line 58. The first line sections 58A are portions of the third metal film 138 and included in an upper layer than the second line sections 58B that are portions of the second metal film 135. The first line section 58A of the auxiliary touch line 58 is connected to the touch electrode 130 that is a portion of a second transparent electrode film 142 via auxiliary touch line contact holes CH5 formed in a second interlayer insulating film 139 and an electrode in-between insulating film 141 that are disposed therebetween. The second line section 58B that is a portion of the second metal film 135 is connected to the first line section 58A that is a portion of the third metal film 138 via line section contact holes CH6 that are formed in a first interlayer insulating film 136 and a planarization film 137 that are disposed therebetween. The auxiliary touch line contact holes CH5 and the line section contact holes CH6 overlap. Thus, the first line sections 58A and the second line sections 58B are electrically connected to each other at the end portions on an opposite side from the driver. Furthermore, the first line sections 58A and the second line sections 58B are electrically connected to each other at the end portions on the driver side via the line section contact holes formed in the first interlayer insulating film 136 and the planarization film 137. Therefore, even if one of the first line section 58A and the second line section 58B has disconnection in an area ranging from the driver to the touch electrode 130 to be connected, the signal transferring function can be maintained by another one and good redundancy is obtained.

As previously described, according to the present embodiment, the auxiliary touch line 58 includes the first line section 58A and the second line section 58B. The first line section 58A is a portion of the third metal film 138 that is one of the conductive films including the second metal film 135 and the third metal film 138. The second line section 58B is a portion of the second metal film 135 that is one of the conductive films including the second metal film 135 and the third metal film 138 and is different from the third metal film 138 a portion of which is configured as the first line section 58A. The second line section 58B is disposed to overlap and to be connected to the first line section 58A. Similar to the first embodiment, the auxiliary touch lines 58 include portions of the second metal film 135 and portions of the third metal film 138 and the second metal film 135 and the third metal film 138 are conductive films that are included in different layers while having the first interlayer insulating film 136 and the planarization film 137, which are insulating films. According to such a configuration, a wide variety of a wiring structure can be obtained compared to the prior-art configuration including a single conductive film as the auxiliary touch lines. In this embodiment, the auxiliary touch lines 58 include portions of the second metal film 135 and portions of the third metal film 138 that are connected to each other using the wide variety of the wiring structure. The second metal film 135 and the third metal film 138 are included in the conductive films. The wire resistance is reduced in the auxiliary touch lines 58 including the first line sections 58A and the second line sections 58B compared to the prior-art configuration including a single conductive film as the auxiliary touch lines. Even if one of the first line section 58A and the second line section 58B has disconnection, the signals can be transferred with another one and good redundancy is obtained. The wiring density is less likely to be lowered since the first line sections 58A and the second line sections 58B are disposed to overlap.

Third Embodiment

A third embodiment will be described with reference to FIG. 21. The third embodiment includes auxiliary touch lines 244, 258 similar to those in the first and second embodiments. Configurations, operations, and effects similar to those of the first and second embodiments previously described will not be described.

Figure 21:
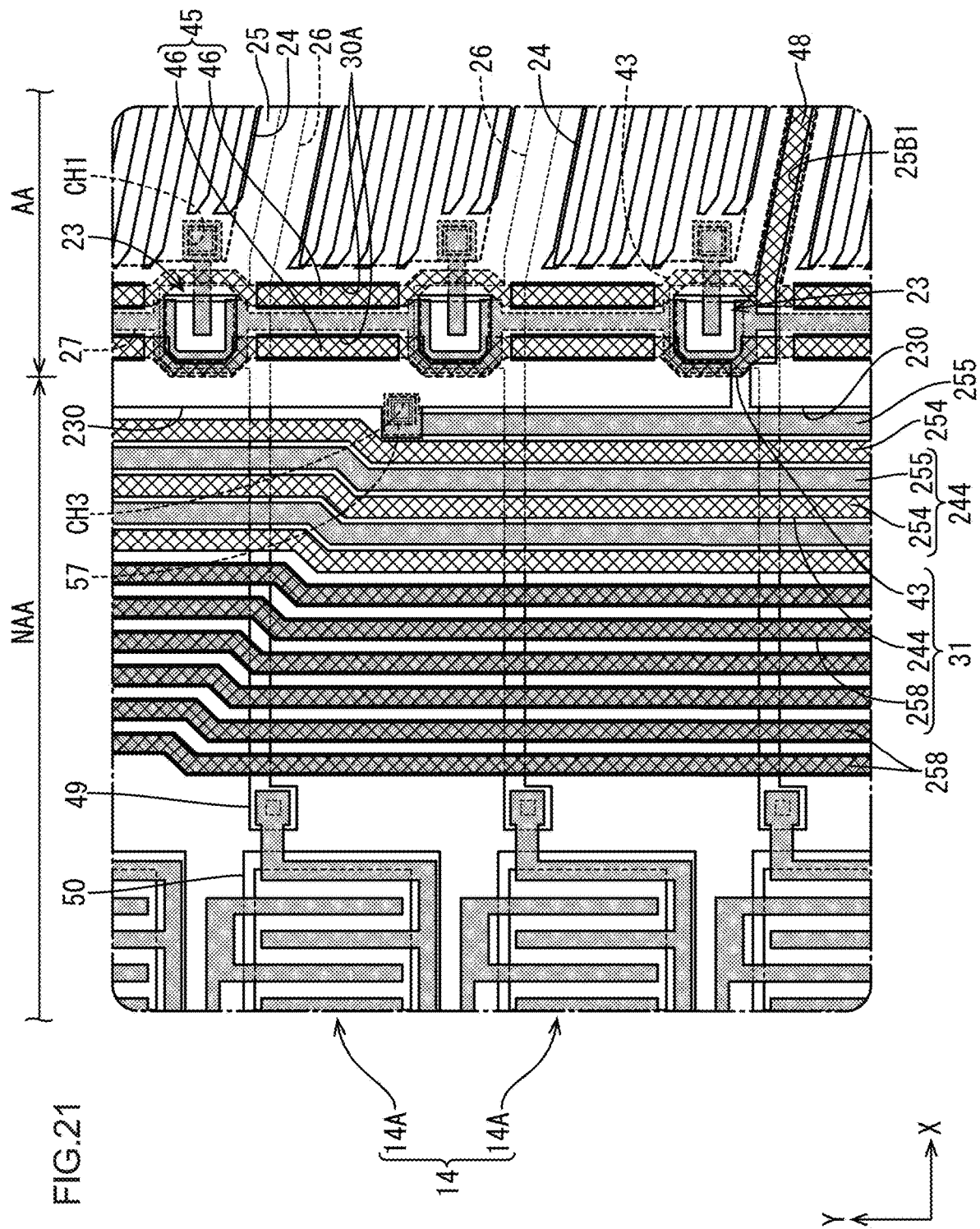
FIG. 21 is an enlarged plan view illustrating auxiliary touch lines in an array substrate included in a liquid crystal panel according to a third embodiment and illustrating patterns of a second metal film and a third metal film.

As illustrated in FIG. 21, an array substrate in this embodiment includes single-layer auxiliary touch lines 244 that have a single-layer structure same as that of the first embodiment and multilayer auxiliary touch lines 258 that have a multilayer structure same as that of the second embodiment. FIG. 21 is an enlarged plan view illustrating a portion of the array substrate including the auxiliary touch lines 244, 258 and illustrates patterns of a second metal film 235 and a third metal film 238. The second metal film 235 and the third metal film 238 are illustrated with different types of shading in FIG. 21. The auxiliary touch lines 244, 258 that are arranged in the X-axis direction are divided equally into a first group and a second group. The first group includes the auxiliary touch lines 244, 258 whose lengths from the driver to touch electrodes 230 to be connected are relatively great and the second group includes the auxiliary touch lines 244, 258 whose lengths are relatively small. The first group includes only the multilayer auxiliary touch lines 258 and the second group includes only the single-layer auxiliary touch lines 244. The multilayer auxiliary touch line 258 included in the first group includes a first line section 258A that is a portion of the third metal film 238 and a second line section 258B that is a portion of the second metal film 235 similar to the first embodiment. The first line section 258A and the second line section 258B are disposed to overlap and electrically connected to each other. Therefore, the wire resistance of the auxiliary touch lines 258 is reduced compared to the single-layer auxiliary touch lines 244. With such a configuration, although the multilayer auxiliary touch lines 258 are included in the first group and have a great length from the driver to touch electrodes 230 to be connected, blunting is less likely to be caused in the signal to be transferred. On the other hand, the single-layer auxiliary touch lines 244 may have a wire resistance higher than that of the multilayer auxiliary touch lines 258. However, the single-layer auxiliary touch lines 244 are originally included in the second group and less likely to cause signal blunting. Therefore, problems related to the signal blunting are less likely to be caused. Similar to the auxiliary touch lines in the first embodiment, the single-layer auxiliary touch lines 244 include (three) first auxiliary touch lines 254 that are portions of the third metal film 238 and (three) second auxiliary touch lines 255 that are portions of the second metal film 235. The first auxiliary touch lines 254 and the second auxiliary touch lines 255 are arranged alternately in a repeated manner in the X-axis direction. According to such a configuration, the first auxiliary touch lines 254 and the second auxiliary touch lines 255 that are arranged adjacent to one another in a plan view are less likely to be short-circuited. This increases a wiring density of the single-layer auxiliary touch lines 244 and a frame width can be reduced.

As previously described, the present embodiment includes the auxiliary touch lines 244, 258. The auxiliary touch lines 258 whose lengths to the touch electrodes 230 to be connected are great include the first line sections 258A and the second line sections 258B. The auxiliary touch lines 244 having small lengths includes the first auxiliary touch lines 254 and the second auxiliary touch lines 255. The first auxiliary touch lines 254 are portions of the third metal film 238 that is one of the conductive films including the second metal film 235 and the third metal film 238. The second auxiliary touch lines 255 are connected to the touch electrodes 230 that are not the ones to be connected to the first auxiliary touch lines 254. The second auxiliary touch lines 255 are portions of the second metal film 235 that is different from the third metal film 238 that is one of the conductive films including the second metal film 235 and the third metal film 238 and portions of which are configured as the first auxiliary touch lines 254. According to such a configuration, among the auxiliary touch lines 244, 258, the auxiliary touch lines 258 whose lengths to the touch electrodes 230 to be connected are great include the first line sections 258A and the second line sections 258B and the wire resistance is reduced. Therefore, the signal blunting is less likely to be caused even with the long lengths. On the other hand, the signal blunting is originally less likely to be caused in the auxiliary touch lines 244 whose lengths to the touch electrodes 230 to be connected are small among the auxiliary touch lines 244, 258. Therefore, the auxiliary touch lines 244 can include the first auxiliary touch lines 254 and the second auxiliary touch lines 255 that are portions of one of the second metal film 235 and the third metal film 238 that are different conductive films. According to such a configuration, the first auxiliary touch lines 254 and the second auxiliary touch lines 255 that are arranged adjacent to one another in a plan view are less likely to be short-circuited. This increases a wiring density of the auxiliary touch lines 244 and a frame width can be reduced compared to the configuration of the second embodiment in which all the auxiliary touch lines include the first line sections 258A and the second line sections 258B.

Fourth Embodiment

A fourth embodiment will be described with reference to FIG. 22. In the fourth embodiment section, touch electrodes 330 to which auxiliary touch lines 344 are connected are different from those in the first embodiment. Configurations, operations, and effects similar to those of the first embodiment previously described will not be described.

Figure 22:
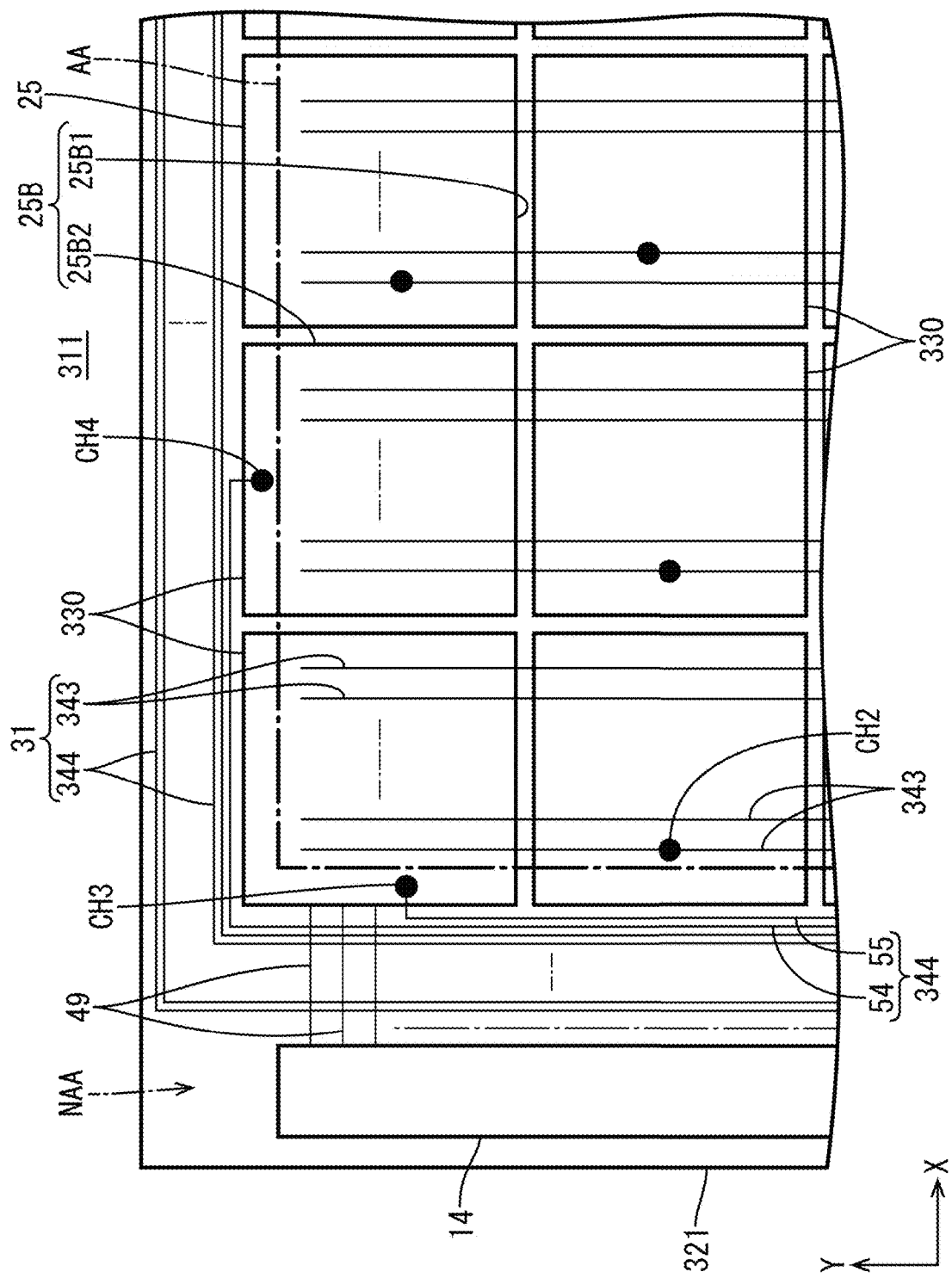
FIG. 22 is an enlarged plan view illustrating a corner section of a liquid crystal panel according to a fourth embodiment and the corner section is on an opposite side from a driver.

As illustrated in FIG. 22, some of the auxiliary touch lines 344 in this embodiment extend to an edge portion of an array substrate 321 on an opposite side (an upper side in FIG. 22) from a driver side (a lower side in FIG. 22) with respect to the Y-axis direction. FIG. 22 is an enlarged plan view illustrating a corner portion of a liquid crystal panel 311 on an opposite side from the driver side. The touch electrodes 330 are arranged in a matrix. The auxiliary touch lines 344 are connected to the touch electrodes 330 that are included in a row disposed at an end on an opposite side from the driver side with respect to the Y-axis direction and are arranged in the X-axis direction. The auxiliary touch line 344 that is connected to the touch electrode 330 disposed at an end (a corner) with respect to the X-axis direction among the touch electrodes 330 to be connected to the auxiliary touch lines 344 does not reach the edge portion of the array substrate 321 on an opposite side from the driver side with respect to the Y-axis direction and has a shortest creepage distance from the driver to the touch electrode 330 to be connected. All the auxiliary touch lines 344 other than the auxiliary touch line 344 having the smallest length extend to the edge portion of the array substrate 321 on an opposite side from the driver side with respect to the Y-axis direction and are connected to the respective touch electrodes 330 that are disposed closer to the middle portion than the touch electrodes 330 disposed at the end portion with respect to the X-axis direction. Such a configuration is preferably for a configuration including a large number of the touch electrodes 330 arranged in the X-axis direction. Specifically, in the liquid crystal panel 311 having a laterally extra-long rectangular shape whose X-axis dimension is eight times or more of the Y-axis dimension, the number of the auxiliary touch lines 344 may be greater than the number of the touch electrodes 330 arranged in the Y-axis direction. This embodiment is particularly preferable for such a configuration.

As previously described, according to the present embodiment, the main touch lines 343 and the auxiliary touch lines 344 extend in parallel to one another and the auxiliary touch lines 344 are connected to the respective touch electrodes 330 that are disposed on the edge side opposite from the driver side with respect to the extending direction of the auxiliary touch lines 344. According to such a configuration, the touch electrodes 330 that are disposed on the edge side opposite from the driver side with respective to the extending direction are supplied with the signals transferred via the auxiliary touch lines 344. Therefore, such a configuration is preferable for the arrangement including a large number of the touch electrodes 330 that are arranged in a direction crossing the extending direction.

Fifth Embodiment

A fifth embodiment will be described with reference to FIG. 23 or FIG. 24. In the fifth embodiment section, a liquid crystal panel 411 has an outline that is altered from that in the fourth embodiment. Configurations, operations, and effects similar to those of the fourth embodiment previously described will not be described.

Figure 23:
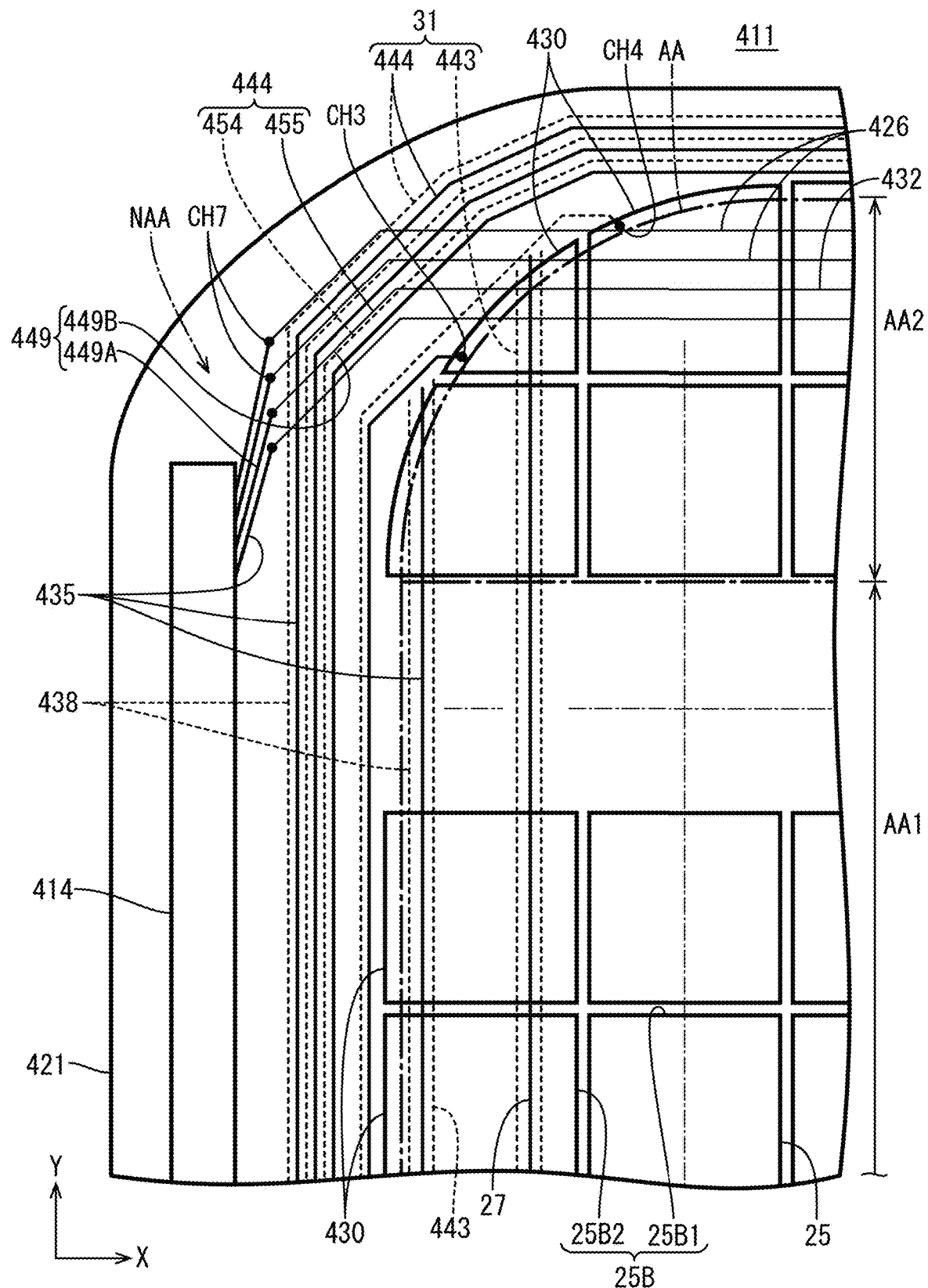
FIG. 23 is an enlarged plan view illustrating a corner section of a liquid crystal panel according to a fifth embodiment and the corner section is on an opposite side from a driver.

As illustrated in FIG. 23, the liquid crystal panel 411 and an array substrate 421 in this embodiment has an outline such that corner sections thereof on an opposite side (an upper side in FIG. 23) from a driver side (a lower side in FIG. 23) with respect to the Y-axis direction have an arched shape. FIG. 23 is an enlarged plan view illustrating a portion of the liquid crystal panel 411 on an opposite side from the driver side. In FIG. 23, lines that are portions of a first metal film 432 are illustrated with thin solid lines, lines that are portions of a second metal film 435 are illustrated with bold solid lines, and lines that are portions of a third metal film 438 are illustrated with dotted lines. Since the liquid crystal panel 411 and the array substrate 421 have a non-rectangular (an irregular) outline, the display area AA includes a first area AA1 and a second area AA2. The first area AA1 has an outline extending along the Y-axis direction. The second area AA2 is disposed on an opposite side from the driver with respect to the first area AA1 in the Y-axis direction and has an outline different from that of the first area AA1. Specifically, the second area AA2 partially has an arched outline in a plan view and the arched outline extends along the outline of the liquid crystal panel 411 and the array substrate 421. Since the second area AA2 has such an outline, touch electrodes 430 disposed in the second area AA2 have outlines different from those of the touch electrodes disposed in the first area AA1. More specifically, the touch electrodes 430 disposed in the second area AA2 include edge portions that are disposed in the non-display area NAA and the edge portions have an arched outline that extends along the outline of the second area AA2 in a plan view. Therefore, the touch electrodes 430 disposed in the second area AA2 have areas and outlines that are varied according to the positions thereof.

As illustrated in FIG. 23, a gate circuit 414 includes an opposite-side end portion on an opposite side from the driver side with respect to the Y-axis direction and the opposite-side end portion is closer to the driver than the end of the display area AA is according to the above-described outline of the array substrate 421. Accordingly, among gate connection lines 449 connected to the gate circuit 414, the gate connection lines 449 to be connected to gate lines 426 that are disposed in the second area AA2 extend from the gate circuit 414 obliquely with respect to the X-axis direction and the Y-axis direction toward the opposite side from the driver side. The gate connection lines 449 to be connected to the gate lines 426 in the second area AA2 are longer than the gate connection lines 449 to be connected to the gate lines 426 in the first area AA1. Therefore, the gate connection lines 449 to be connected to the gate lines 426 in the second area AA2 are likely to cause display errors due to an electric field created therearound by the transfer of signals. The gate connection lines 449 includes first gate connection line sections 449A and second gate connection line sections 449B. The first gate connection line sections 449A are portions that are connected to the gate circuit 414 and are portions of the second metal film 435. The second gate connection line sections 449B are portions that are connected to the gate lines 426 and are portions of the first metal film 432. The first gate connection line sections 449A and the second gate connection line sections 449B are disposed such that the end portions thereof overlap and are connected to each other via gate connection line contact holes CH7 that are formed in gate insulating films disposed therebetween. The auxiliary touch lines 444 extend obliquely with respect to the X-axis direction and the Y-axis direction in the corner portion of the array substrate 421 having a round outline similarly to the gate connection lines 449.

Figure 24:
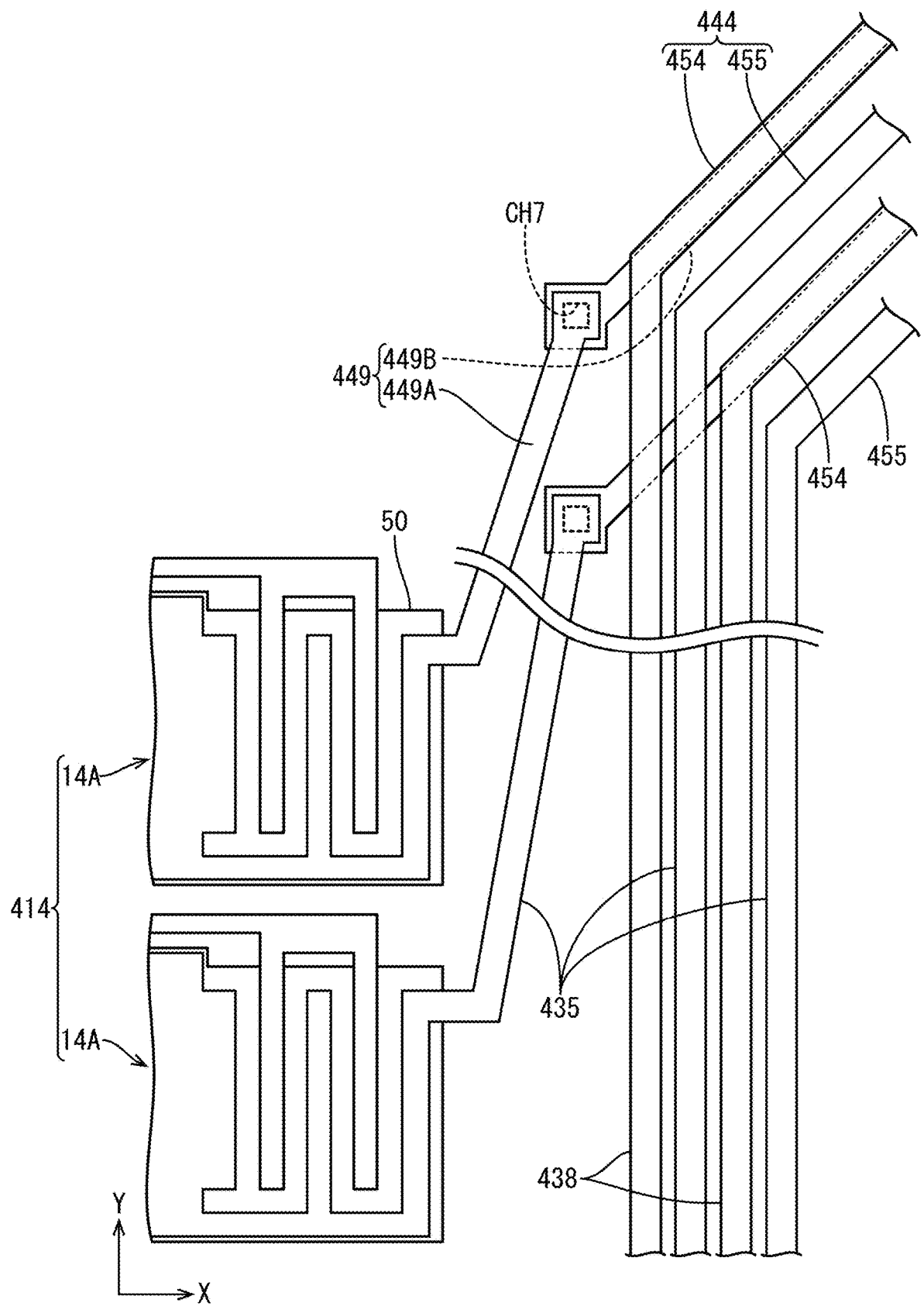
FIG. 24 is an enlarged plan view illustrating a gate circuit and auxiliary touch lines in a section of an array substrate opposite from the driver.

FIG. 24 is an enlarged plan view illustrating a portion of the array substrate 421 on an opposite side from the driver side including the gate circuit 414 and the auxiliary touch lines 444. As illustrated in FIG. 24, a first auxiliary touch line 454 included in the auxiliary touch lines 444 overlaps the second gate connection line section 449B of the gate connection line 449 to be connected to the gate line 426 in the second area AA2. The first auxiliary touch lines 454 are portions of the third metal film 438 and overlap and are included in an upper layer than the second gate connection line sections 449B that are portions of the first metal film 432 via the gate insulating film, the first interlayer insulating film, and the planarization film. According to such a configuration, the first auxiliary touch lines 454 block the electric field that may be created to be directed from the second gate connection line sections 449B of the gate connection lines 449 that are to be connected to the gate lines 426 in the second area AA2 toward the upper layer. Accordingly, even though the gate connection lines 449 to be connected to the gate lines 426 in the second area AA2 have increased lengths, display errors are appropriately suppressed from occurring. Compared to the configuration in which the second auxiliary touch lines 455 that are portions of the second metal film 435 overlap the second gate connection line sections 449B that are portions of the first metal film 432, the number of the insulating films disposed between the second gate connection line sections 449B and the first auxiliary touch lines 454 is increased by the first interlayer insulating film and the planarization film. Therefore, the configuration is preferable for reducing the parasitic capacitance that may appear between the second gate connection line sections 449B and the auxiliary touch lines 444 that overlap.

As described before, according to the present embodiment, TFTs (switching components), the gate lines 426 (scan lines), and the gate connection lines 449 (scan connection lines) are included. The TFTs are disposed in the display area AA and connected to the pixel electrodes. The gate lines 426 extend to cross the main touch lines 443 in the display area AA and are connected to the TFTs. The gate connection lines 449 are disposed outside the display area AA and connected to the gate lines 426. The display area AA includes the first area AA1 and the second area AA2. The first area AA1 has an outline that is along the extending direction. The second area AA2 is disposed on an opposite side end from the driver-side with respect to the first area AA1 in the extending direction and has an outline different from that of the first area AA1. Some of the auxiliary touch lines 444 overlap and are included in an upper layer than the gate connection lines 449 that are connected to the gate lines 426 in the second area AA2 via the gate insulating film, the first interlayer insulating film, and the planarization film. According to such a configuration, since the signals for driving the TFTs are transferred to the gate lines 426 via the gate connection lines 449, the pixel electrodes are charged according to the driving of the TFTs. The gate connection lines 449 that are disposed outside the display area AA create electric fields therearound according to the transferring of the signals. Particularly, the gate connection lines 449 that are connected to the gate lines 426 disposed in the second area AA2 of the display area AA are longer than those connected to the gate lines 426 disposed in the first area AA1 and therefore, display errors are likely to be caused due to the electric field created therearound. The auxiliary touch lines 444 overlap and are included in an upper layer than the gate connection lines 449 to be connected to the gate lines 426 disposed in the second area AA2 via the gate insulating film, the first inter-layer insulating film, and the planarization film, which are the insulating films. According to such a configuration, the auxiliary touch lines 444 block the electric field that may be created to be directed from the gate connection lines 449 that are to be connected to the gate lines 426 in the second area AA2 toward the upper layer. Accordingly, display errors are appropriately suppressed from occurring.

Sixth Embodiment

A sixth embodiment will be described with reference to FIG. 25 or FIG. 26. In the sixth embodiment section, a configuration of touch electrodes 530 is altered from that in the first embodiment. Configurations, operations, and effects similar to those of the first embodiment previously described will not be described.

Figure 25:
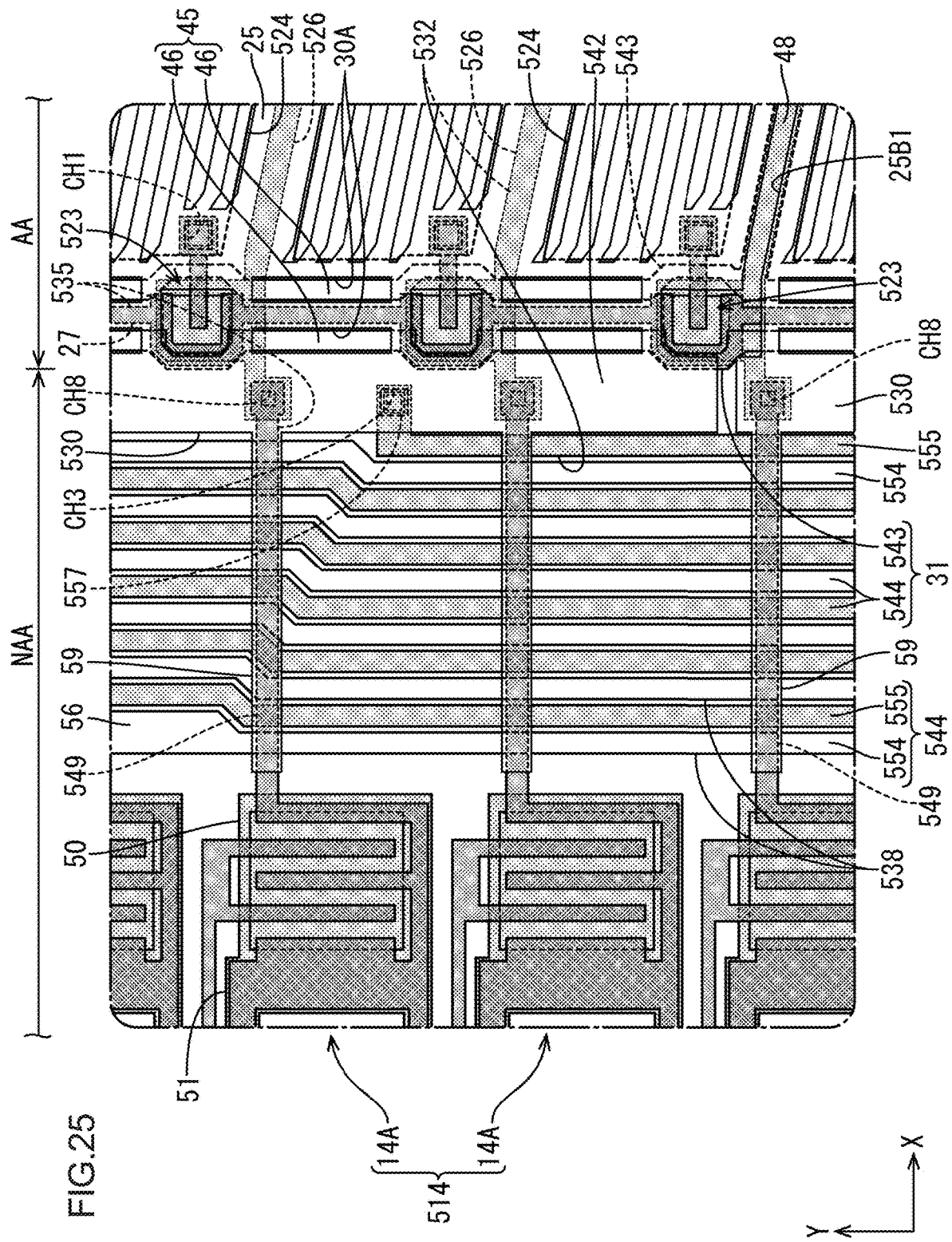
FIG. 25 is an enlarged plan view illustrating auxiliary touch lines in an array substrate included in a liquid crystal panel according to a sixth embodiment and illustrating patterns of a first metal film and a second metal film.

As illustrated in FIG. 25, gate connection lines 549 in this embodiment are portions of a second metal film 535. FIG. 25 is an enlarged plan view illustrating a portion of an array substrate including auxiliary touch lines 544 and is a plan view illustrating patterns of the first metal film 532 and the second metal film 535. The first metal film 532 and the second metal film 535 are illustrated with different types of shadings in FIG. 25. The gate connection lines 549 that are portions of the second metal film 535 are connected to the respective gate lines 526 that are portions of the first metal film 532 via gate connection line contact holes CH8 formed in gate insulating films therebetween. Accordingly, second auxiliary touch lines 555 included in the auxiliary touch lines 544 are portions of the first metal film 532. The second auxiliary touch lines 555 that are portions of the first metal film 532 are included in a lower layer than the gate connection lines 549 that cross the second auxiliary touch lines 555 and the gate insulating film therebetween keeps insulation between the second auxiliary touch lines 555 and the gate connection lines 549. Therefore, the second auxiliary touch lines 555 are less likely to block the electric field that may be created to be directed from the gate connection lines 549 toward the upper layer according to the supply of scan signals to the gate lines 526. First auxiliary touch lines 554 that are portions of the third metal film 538 are included in an upper layer than second auxiliary touch lines 555 that are portions of the first metal film 532 and insulation between the first auxiliary touch lines 554 and the second auxiliary touch lines 555 is maintained by the gate insulating film, the first interlayer insulating film, and the planarization film disposed therebetween. At a connection portion in which the second auxiliary touch line and the touch electrode 530 are connected to each other, a portion of the second metal film 535 and a portion of the third metal film 538 are overlapped to form an intermediate electrode 557 and this may prevent breaking of the film in the touch electrode 530.

Figure 26:
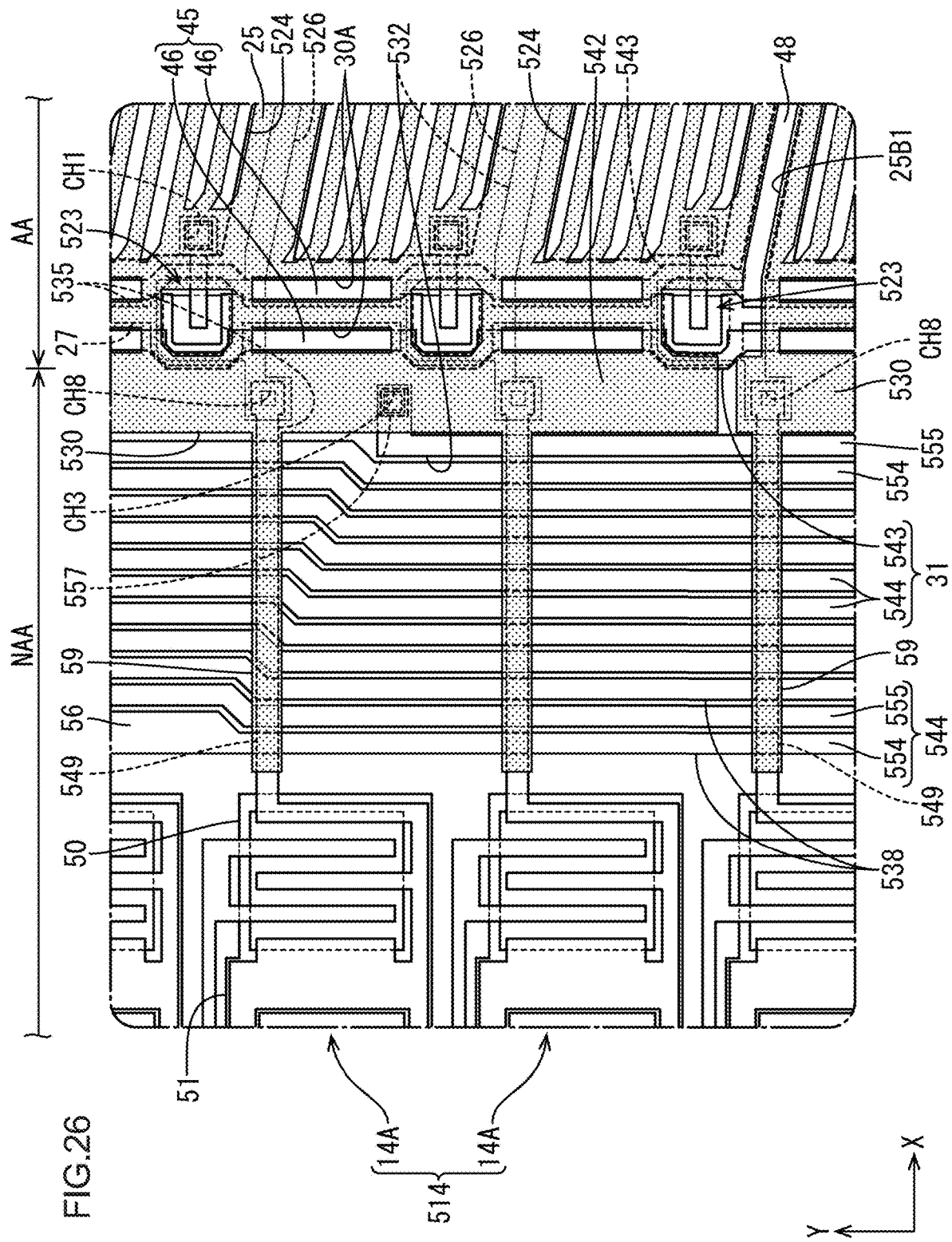
FIG. 26 is a plan view illustrating a pattern of a second transparent electrode film in FIG. 25.

As illustrated in FIG. 26, some of the touch electrodes 530 that are arranged in a matrix include electrode extended portions 59 that extend to overlap the respective gate connection lines 549 that are portions of the second metal film 535. FIG. 26 is an enlarged plan view illustrating a portion of an array substrate including the auxiliary touch line 544 and is a plan view illustrating a pattern of a second transparent electrode film 542. The second transparent electrode film 542 is illustrated with shading in FIG. 26. Among the touch electrodes 530 arranged in a matrix, the electrode extended portions 59 are selectively included in the touch electrodes 530 that are at the two edges with respect to the X-axis direction and that are opposite the arrangement area of the auxiliary touch lines 544. The electrode extended portion 59 extends from a gate circuit 514 side edge (close to the arrangement area of the auxiliary touch lines 544) of the touch electrode 530 toward the gate circuit 514 in the X-axis direction and extends so as to overlap the gate connection line 549 over an almost entire length thereof. The electrode extended portions 59 that are portions of the second transparent electrode film 542 overlap and are included in an upper layer than the gate connection lines 549 that are portions of the second metal film 535 via the first interlayer insulating film, the planarization film, the second interlayer insulating film, and the electrode in-between insulating film. An electric field may be created to be directed from the gate connection lines 549 toward the upper layer according to the supply of scan signals to the gate lines 526. The electrode extended portions 59 block the electric field over entire lengths of the gate connection lines 549. According to such a configuration, even though the auxiliary touch lines 544 include the second auxiliary touch lines 555 that are included in a lower layer than the gate connection lines 549, the good electric blocking effects can be obtained and display errors are appropriately suppressed from occurring. Furthermore, each electrode extended portion 59 is disposed not to overlap most part of each auxiliary touch line 544 (portions other than the overlapping portions that overlaps the gate connection line 549), a parasitic capacitance that may appear between the auxiliary touch line 544 and the touch electrode 530 to be connected can be reduced.

As previously described, according to the present embodiment, TFTs 534 (switching components), the gate lines 526 (scan lines), and the gate connection lines 549 (scan connection lines) are included. The TFTs 523 are disposed in the display area AA and connected to pixel electrodes 524. The gate lines 526 extend to cross the main touch lines 543 in the display area AA and are connected to the TFTs 523. The gate connection lines 549 extend to cross the auxiliary touch lines 544 outside the display area AA and are connected to the gate lines 526. The first auxiliary touch lines 554 are portions of the third metal film 538 that is one of the conductive films including the first metal film 532 and the third metal film 538 and is included in an upper layer than the gate connection lines 549 via the first interlayer insulating film and the planarization film, which are insulating films. The second auxiliary touch lines 555 are portions of the first metal film 532 that is one of the conductive films including the first metal film 532 and the third metal film 538 and is included in a lower layer than the gate connection lines 549 via the gate insulating film, which is an insulating film. Some of the touch electrodes 530 include the electrode extended portions 59 that extend to overlap and are included in an upper layer than the gate connection lines 549 via the first interlayer insulating film, the planarization film, the second interlayer insulating film, and the electrode in-between insulating film, which are insulating films. According to such a configuration, since the signals for driving the TFTs 523 are transferred to the gate lines 526 via the gate connection lines 549, the pixel electrodes 524 are charged according to the driving of the TFTs 523. The gate connection lines 549 that are disposed outside the display area AA create electric fields therearound according to the transferring of the signals to the gate lines 526. The auxiliary touch lines 544 that cross the gate connection lines 549 include the first auxiliary touch lines 554 and the second auxiliary touch lines 555. The first auxiliary touch lines 554 are portions of the third metal film 538 that is included in an upper layer than the gate connection lines 549 via the first interlayer insulating film and the planarization film, which are insulating films. The second auxiliary touch lines 555 are portions of the first metal film 532 that is included in a lower layer than the gate connection lines 549 via the gate insulating film, which is an insulating film. According to such a configuration, the electric fields directed toward the upper layer from portions of the gate connection lines 549 overlapping the first auxiliary touch lines 554 are blocked by the first auxiliary touch lines 554; however, the electric fields directed toward the upper layer from portions of the gate connection lines 549 overlapping the second auxiliary touch lines 555 are not blocked by the second auxiliary touch lines 555. In this respect, some of the touch electrodes 530 include the electrode extended portions 59 that extend to overlap and are included in an upper layer than the gate connection lines 549 via the first interlayer insulating film, the planarization film, the second interlayer insulating film, and the electrode in-between insulating film. Therefore, the electric fields directed toward the upper layer from portions of the gate connection lines 549 overlapping the second auxiliary touch lines 555 are blocked by the electrode extended portions 59. Therefore, display errors due to an electric field directed toward the upper layer from the gate connection lines 549 are less likely to be caused.

Seventh Embodiment

A seventh embodiment will be described with reference to FIG. 27. In the seventh embodiment section, a configuration of an electrode extended portion 659 is altered from that in the sixth embodiment. Configurations, operations, and effects similar to those of the sixth embodiment previously described will not be described.

Figure 27:
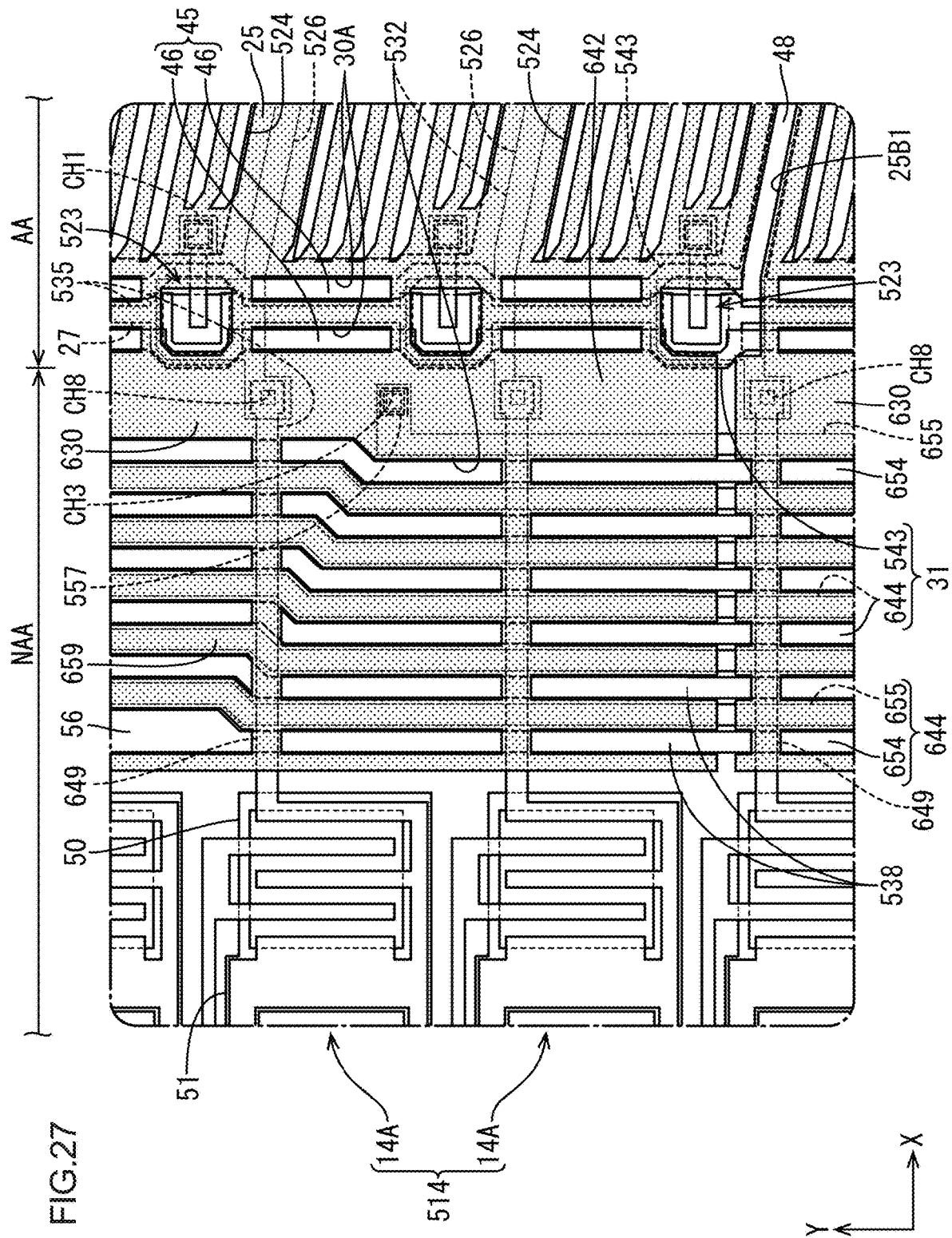
FIG. 27 is an enlarged plan view illustrating auxiliary touch lines in an array substrate included in a liquid crystal panel according to a seventh embodiment.

As illustrated in FIG. 27, the electrode extended portion 659 in this embodiment overlaps second auxiliary touch lines 655 in addition to gate connection lines 649. FIG. 27 is an enlarged plan view illustrating a portion of an array substrate including auxiliary touch lines 644 and is a plan view illustrating a pattern of a second transparent electrode film 642. The second transparent electrode film 642 is illustrated with shading in FIG. 27. Specifically, the electrode extended portions 659 extend over an area that does not overlap most part of the first auxiliary touch lines 654 (portions of the first auxiliary touch lines 654 other than the portions thereof overlapping the gate connection lines 649) within the arrangement area in which the auxiliary touch lines 644 are disposed. In other words, the electrode extended portion 659 includes holes overlapping most part of the first auxiliary touch lines 654. Since the first auxiliary touch lines 654 are included in an upper layer than the second auxiliary touch lines 655 and are disposed near the touch electrodes 630, parasitic capacitances that may appear between the first auxiliary touch lines 654 and the touch electrodes 630 to be connected tend to be great. In this respect, since the electrode extended portions 659 are disposed not to overlap the first auxiliary touch lines 654, parasitic capacitances that may appear between the first auxiliary touch lines 654 and the touch electrodes 630 not to be connected can be reduced.

Eighth Embodiment

An eighth embodiment will be described with reference to FIG. 28. In the eighth embodiment section, arrangement of auxiliary touch lines 744 is altered from that in the first embodiment. Configurations, operations, and effects similar to those of the first embodiment previously described will not be described.

Figure 28:
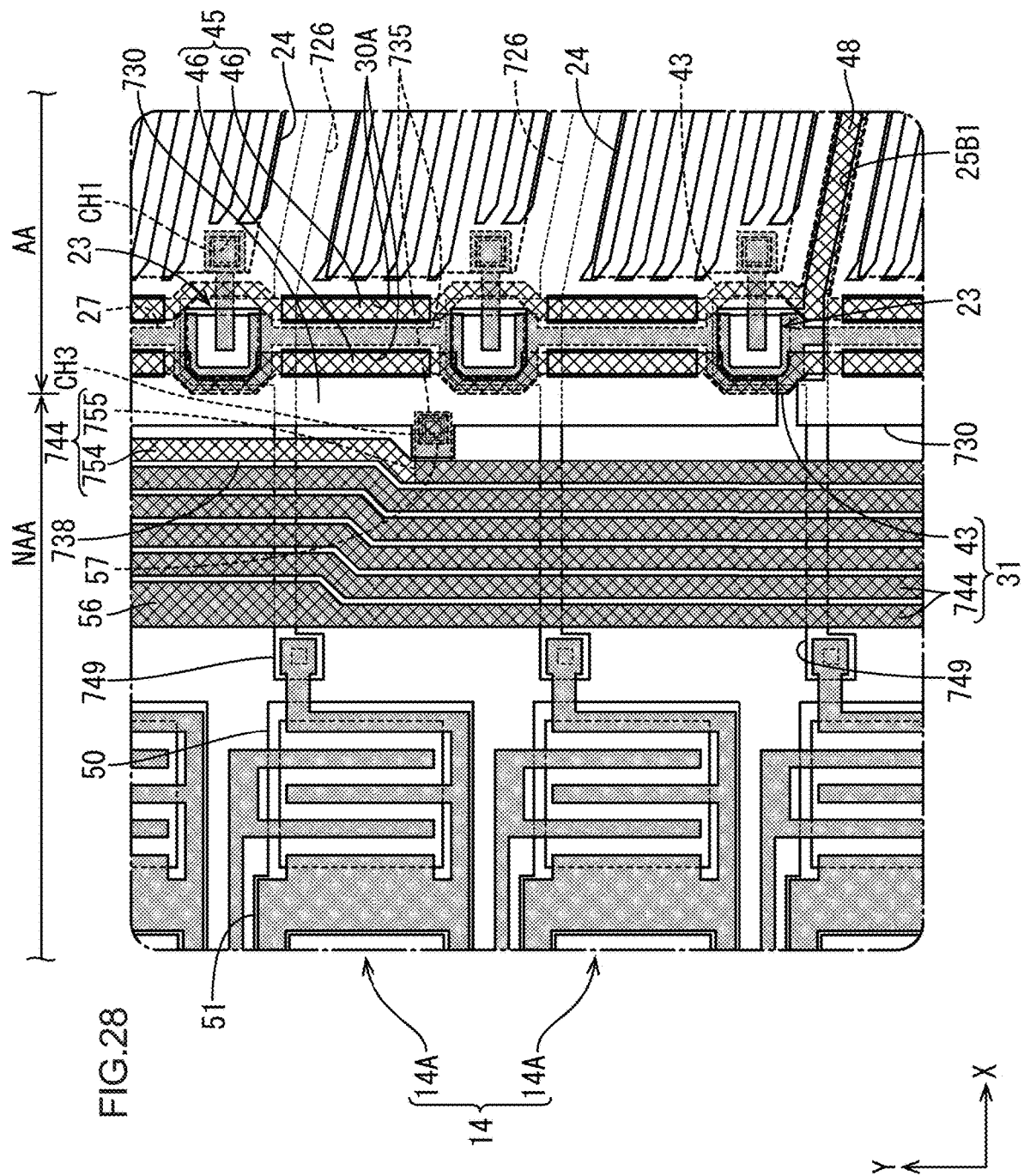
FIG. 28 is an enlarged plan view illustrating auxiliary touch lines in an array substrate included in a liquid crystal panel according to an eighth embodiment.

As illustrated in FIG. 28, first auxiliary touch lines 754 and second auxiliary touch lines 755 included in the auxiliary touch lines 744 in this embodiment extend in parallel to one another and overlap. FIG. 28 is an enlarged plan view illustrating a portion of an array substrate including the auxiliary touch lines 744 and is a plan view illustrating patterns of a second metal film 735 and a third metal film 738. The second metal film 735 and the third metal film 738 are illustrated with different types of shadings in FIG. 28. Each of the first auxiliary touch lines 754 and the second auxiliary touch lines 755 has a single-layer structure. The first auxiliary touch lines 754 and the second auxiliary touch lines 755 overlap, respectively, and are electrically independent of each other and are connected to different touch electrodes 730, respectively. According to such a configuration, the wiring density of the auxiliary touch lines 744 can be increased by the overlapping amount of the first auxiliary touch lines 754 and the second auxiliary touch lines 755 compared to a configuration of the first embodiment in which the first auxiliary touch lines 54 and the second auxiliary touch lines 55 do not overlap. Thus, an arrangement space for arranging the auxiliary touch lines 744 with respect to the X-axis direction can be reduced to about a half of that in the first embodiment and the above configuration is more preferable for reducing the frame width. Furthermore, electric fields may be created near the gate connection lines 749 as the scan signals are transferred through the gate lines 726; however, the first auxiliary touch lines 754 and second auxiliary touch lines 755 that overlap are disposed to overlap the gate connection lines 749 and this configuration effectively blocks such electric fields. The planarization film that is thicker than other insulation films is disposed between the first auxiliary touch lines 754 and second auxiliary touch lines 755 that overlap. Therefore, compared to a configuration without including the planarization film, parasitic capacitances that may appear between the overlapping first auxiliary touch lines 754 and second auxiliary touch lines 755 can be reduced. In the present embodiment, to prevent short-circuit between the auxiliary touch lines 744 that are adjacent to each other in the X-axis direction, it is preferable to increase the distance between the adjacent auxiliary touch lines 744 than that in the first embodiment; however, it is not limited thereto.

As previously described, according to the present embodiment, the first auxiliary touch lines 754 and the second auxiliary touch lines 755 extend in parallel to one another and are disposed to overlap. According to such a configuration, the wiring density of the auxiliary touch lines 744 can be increased by the overlapping amount of the first auxiliary touch lines 754 and the second auxiliary touch lines 755 compared to a configuration of the first embodiment in which the first auxiliary touch lines 54 and the second auxiliary touch lines 55 do not overlap. This further reduces the frame width.

Other Embodiments

The technology described herein is not limited to the embodiments described above and illustrated by the drawings. For example, the following embodiments will be included in the technical scope.

(1) The number of the metal films for the auxiliary touch lines 44, 58, 244, 258, 344, 444, 544, 644, 744 may be three or more. In the auxiliary touch lines 44, 244, 344, 444, 544, 644, 744 having a single-layer structure, the auxiliary touch lines 44, 244, 344, 444, 544, 644, 744 may include third auxiliary touch lines in addition to the first auxiliary touch lines 54, 254, 454, 554, 654, 754 and the second auxiliary touch lines 55, 255, 455, 555, 655, 755. In such a configuration, the third auxiliary touch lines may be portions of the metal film that is different from the metal films of the first auxiliary touch lines 54, 254, 454, 554, 654, 754 and the second auxiliary touch lines 55, 255, 455, 555, 655, 755. The third auxiliary touch lines are connected to the touch electrodes 30, 130, 230, 330, 430, 530, 630, 730 that are not to be connected to the first auxiliary touch lines 54, 254, 454, 554, 654, 754 and the second auxiliary touch lines 55, 255, 455, 555, 655, 755. On the other hand, in the auxiliary touch lines 58, 258 having a multilayer structure, the auxiliary touch lines 58, 258 may include third line sections in addition to the first line sections 58A, 258A and the second line sections 58B, 258B. In such a configuration, the third line sections may be portions of the metal film that is different from the metal films of the first line sections 58A, 258A and the second line sections 58B, 258B and connected to the first line sections 58A, 258A or the second line sections 58B, 258B.

(2) The auxiliary touch lines 58, 258 having a multilayer structure may include the wide portions 56.

(3) The wide portions 56 of the auxiliary touch lines 44, 58, 244, 258, 344, 444, 544, 644, 744 may have different widths. For example, the wide portions 56 of the auxiliary touch lines 44, 58, 244, 258, 344, 444, 544, 644, 744 whose lengths from the driver 12 to the touch electrodes 30, 130, 230, 330, 430, 530, 630, 730 are great may be wider than those of the auxiliary touch lines 44, 58, 244, 258, 344, 444, 544, 644, 744 whose lengths are small. According to such a configuration, the wire resistance of the auxiliary touch lines 44, 58, 244, 258, 344, 444, 544, 644, 744 whose lengths are great can be reduced.

(4) The auxiliary touch lines 44, 58, 244, 258, 344, 444, 544, 644, 744 may be partially disposed in the display area AA. For example, portions of the auxiliary touch lines 44, 58, 244, 258, 344, 444, 544, 644, 744 to be connected to the touch electrodes 30, 130, 230, 330, 430, 530, 630, 730 may be disposed in the display area AA. In such a configuration, the touch electrodes 30, 130, 230, 330, 430, 530, 630, 730 can be entirely disposed in the display area AA.

(5) In the auxiliary touch lines 44, 58, 244, 258, 344, 444, 544, 644, 744 having a single-layer structure, the first auxiliary touch lines 54, 254, 454, 554, 654, 754 may partially overlap the second auxiliary touch lines 55, 255, 455, 555, 655, 755 and other portions thereof may not overlap. In such a configuration, the first auxiliary touch lines 54, 254, 454, 554, 654, 754 and the second auxiliary touch lines 55, 255, 455, 555, 655, 755 may extend in parallel to one another or may extend while partially crossing.

(6) In the auxiliary touch lines 58, 258 having a multilayer structure, the first line sections 58A, 258A and the second line sections 58B, 258B may be connected to each other at three portions or more. Furthermore, the first line sections 58A, 258A and the second line sections 58B, 258B may be connected to each other at only one portion. In such configurations, if disconnection may occur in a portion ranging from the driver 12 to the touch electrode 130, 230 to be connected, an appropriate portion may be processed with laser beam to short-circuit the first line section 58A, 258A and the second line section 58B, 258B to maintain the signal transfer function.

(7) In the auxiliary touch lines 58, 258 having the multilayer structure, the first line sections 58A and the second line sections 58B may partially overlap and other portions thereof may not overlap. In such a configuration, the first line sections 58A and the second line sections 58B may extend in parallel to one another or may extend while partially crossing. Furthermore, the first line sections 58A and the second line sections 58B may be disposed not to overlap entirely.

(8) The auxiliary touch lines 58, 258 having the multilayer structure may be connected to the touch electrodes 30, 130, 230, 330, 430, 530, 630, 730 that are arranged in the X-axis direction as described in the fourth and fifth embodiments.

(9) In the auxiliary touch lines 58, 258 having the multilayer structure, one of the first line sections 58A, 258A or the second line sections 58B, 258B may be portions of the metal film and another one may be reduced resistance portions of the semiconductor film 34 obtained by partially reducing a resistance. With such a configuration, the wiring resistance of the auxiliary touch lines 58, 258 having the multilayer structure can be reduced and good redundancy is obtained.

(10) The specific dimensions of the widths of and the intervals between the auxiliary touch lines 44, 58, 244, 258, 344, 444, 544, 644, 744 may be altered as appropriate.

(11) The specific position relationship between the source lines 27 and the main touch lines 43, 343, 443, 543 may be altered as appropriate. For example, the two main touch lines 43, 343, 443, 543 that are disposed in a space on a same side as the source line 27 to be connected with respect to the pixel electrodes 24, 524 may be disposed to partially overlap the source line 27 alternately. In such a configuration, portions of the main touch lines 43, 343, 443, 543 overlapping the source line 27 may be line overlapping common sections which correspond to the common sections 45.

(12) Only one main touch line 43, 343, 443, 543 may be disposed in a space on a same side as the source line 27 to be connected with respect to the pixel electrode 24, 524. In such a configuration, the number of the main touch lines 43, 343, 443, 543 is equal to that of the source lines 27.

(13) Three main touch lines 43, 343, 443, 543 may be disposed in a space on a same side as the source line 27 to be connected with respect to the pixel electrodes 24, 524. In such a configuration, the number of the main touch lines 43, 343, 443, 543 is three times or more of the number of the source lines 27.

(14) The pixel electrodes 24, 524 may be disposed such that the elongated direction matches the extending direction of the touch lines 31 (the Y-axis direction) and the short-edge direction matches a direction crossing the extending direction of each touch line (the X-axis direction).

(15) Each of the edge dimensions and the planar shape of the touch electrodes 30, 130, 230, 330, 430, 530, 630, 730 may be altered as appropriate.

(16) One touch electrode 30, 130, 230, 330, 430, 530, 630, 730 may be connected to the touch lines 31. In such a configuration, one touch electrode 30, 130, 230, 330, 430, 530, 630, 730 may be connected to the main touch lines 43, 343, 443, 543 or connected to the auxiliary touch lines 44, 58, 244, 258, 344, 444, 544, 644, 744. One touch electrode 30, 130, 230, 330, 430, 530, 630, 730 may be connected to the main touch lines 43, 343, 443, 543 and the auxiliary touch lines 44, 58, 244, 258, 344, 444, 544, 644, 744.

(17) The specific planar shape of the pixel electrodes 24, 524 may be altered as appropriate. For example, each of the pixel electrodes 24, 524 may have multiple bent portions 24A and have a planar shape including bent portions. The planar shape of each pixel electrode 24, 524 including one bent portion 24A may be modified from the one illustrated in each drawing. For example, each pixel electrode 24, 524 may include the bent portion 24A in a portion other than the middle portion with respect to the elongated direction. Furthermore, the pixel electrodes 24, 524 may have a shape without including the bent portion 24A (such as a rectangle or a square).

(18) The ratio of the elongated dimension to the short-edge dimension of the pixel electrode 24, 524 may be a value other than 3. For example, when the color filters 28 that are arranged in the Y-axis direction include the color filters 28 of four colors (including white in addition to red, green, and blue), the ratio of the elongated dimension to the short-edge dimension of the pixel electrode 24, 524 may be 4.

(19) The interval between the unit circuit sections 14A included in the gate circuit 14, 414, 514 and the interval between the gate lines 26, 426, 526, 726 (the pixel electrodes 24, 524) may be altered as appropriate.

(20) In the liquid crystal panel 11, 311, 411, the number of the gate lines 26, 426, 526 may be twice as the number of the pixel electrodes 24, 524 in the Y-axis direction and the number of the source lines 27 may be a half of the number of the pixel electrodes 24, 524 in the X-axis direction.

(21) The TFTs 23, 523 may be top-gate type TFTs that include gate electrodes in an upper layer than the channel sections 23D. The TFTs 23, 523 may be double-gate type TFTs that include gate electrodes in an upper layer and a lower layer than the channel sections 23D, respectively.

(22) The liquid crystal material included in the liquid crystal layer 22 may be liquid crystal material having negative dielectric anisotropy.

(23) The specific screen size and the resolution of the liquid crystal panel 11, 311, 411 may be altered as appropriate.

(24) The specific intervals between the pixels PX and each outer dimension of the pixel PX in the liquid crystal panel 11, 311, 411 may be altered as appropriate.

(25) The number of the drivers 12 mounted on the array substrate 21, 121, 321, 421 may be increased or decreased according to the resolution or the number of signal output lines from each driver 12. The number of the drivers 12 may be three or less or five or more.

(26) The flexible circuit board on which the drivers 12 are mounted with the chip-on-glass (COG) mounting method may be connected to the array substrate 21, 121, 321, 421.

(27) The gate circuits 14, 414, 514 may not be included and a gate driver having a function similar to that of the gate circuit 14, 414, 514 may be mounted on the array substrate 21, 121, 321, 421. The gate circuit 14, 414, 514 may be mounted on only one edge portion of the array substrate 21, 121, 321, 421.

(28) The specific planar shape of the pixel overlapping opening 25A in the common electrode 25 may be altered as appropriate. The planar shape of the pixel overlapping opening 25A may be a W-shape or a linear shape, for example. The specific number and arrangement interval of the pixel overlapping openings 25A may be altered as appropriate.

(29) The common electrode 25 may not include the pixel overlapping openings 25A and the pixel electrode 24, 524 may include a common electrode overlapping opening. The common electrode 25 may be a portion of the first transparent electrode film and the pixel electrodes 24, 524 may be portions of the second transparent electrode film.

(30) The TFTs 23, 523 may be arranged in a zig-zag manner in a plan view.

(31) The black matrix 29 (the inter-pixel light blocking portion) may be included in the array substrate 21, 121, 321, 421.

(32) The channel sections 23D of the TFTs 23, 523 are portions of the semiconductor film 34 and the semiconductor film 34 may be made of amorphous silicon or polysilicon (LTPS). When the semiconductor film 34 is made of polysilicon, the bottom gate-type TFTs or the top gate-type TFTs may be preferably used as the TFTs 23, 523. The top gate-type TFTs include a light blocking film in a lower layer than the channel sections 23D (closer to the backlight device to be mounted).

(33) The display mode of the liquid crystal panel 11, 311, 411 may be the IPS mode.

(34) The touch panel pattern may use the mutual capacitance method.

(35) The liquid crystal panel 11, 311, 411 may be a reflection type liquid crystal panel or a semi-transmissive type liquid crystal panel other than the transmissive-type one.

(36) The planar shape of the liquid crystal display device 10 (the liquid crystal panel 11, 311, 411 and the display area AA) may be a vertically-long rectangle, a square, a circle, a semicircle, an elongated oval, an ellipse, or a trapezoid.

(37) A display device including an organic EL display panel or an electrophoretic display panel (EPD) may be used as the display device.

The invention claimed is:

1. A display device comprising:
pixel electrodes disposed in a display area;
a common electrode disposed to partially overlap the pixel electrodes via a first insulating film;
position detection electrodes that are divided portions of the common electrode and create an electrostatic capacitance between one of the position detection electrodes and a position inputter that performs position inputting and detect an input position inputted by the position inputter, the position detection electrodes including position detection electrodes included in a first group and position detection electrodes included in a second group;
a signal supply section disposed adjacent to the display area;
main position detection lines including portions that are disposed in the display area and having one end portions that are connected to the position detection electrodes included in the first group and another end portions that are connected to the signal supply section and cross a space between the signal supply section and the display area; and
an auxiliary position detection line disposed outside the display area and routed around an area of the space in which the main position detection lines are disposed,
the auxiliary position detection line including one end portion that is connected to a first position detection electrode of the position detection electrodes included in the second group, the one end portion of the auxiliary position detection line being connected to the first position detection electrode at a connection portion, the connection portion being outside the display area,
the auxiliary position detection line having another end portion that is connected to the signal supply section, and
the auxiliary position detection line including portions of conductive films that are included in different layers via a second insulating film.

2. The display device according to claim 1, wherein
the auxiliary position detection line includes a first auxiliary position detection line and a second auxiliary position detection line,
the first auxiliary position detection line is a portion of one of the conductive films and is connected to the first position detection electrode of the position detection electrodes included in the second group, the second auxiliary position detection line is connected to a second position detection electrode of the position detection electrodes included in the second group, the second position detection electrode being different from the first position detection electrode included in the second group and connected to the first auxiliary position detection line, and the second auxiliary position detection line is a portion of another one of the conductive films that is different from the one of the conductive films including the portion of the first auxiliary position detection line.

3. The display device according to claim 2, wherein the first auxiliary position detection line and the second auxiliary position detection line extend in parallel to each other and do not overlap.

4. The display device according to claim 2, wherein the first auxiliary position detection line and the second auxiliary position detection line extend in parallel to each other and overlap.

5. The display device according to claim 2, further comprising:

switching components disposed in the display area and connected to the pixel electrodes;

scan lines extending and crossing the main position detection lines within the display area and connected to the switching components; and scan connection lines extending and crossing the auxiliary position detection line outside the display area and connected to the scan lines, wherein the first auxiliary position detection line is a portion of one of the conductive films, the one of the conductive films being included in an upper layer than the scan connection lines via the second insulating film, the second auxiliary position detection line is a portion of another one of the conductive films, the another one of the conductive films being included in a lower layer than the scan connection lines via a third insulating film, and some of the position detection electrodes include electrode extended portions extending therefrom to overlap the scan connection lines and to be included in an upper layer than the scan connection lines via the second insulating film.

6. The display device according to claim 2, wherein the first auxiliary position detection line and the second auxiliary position detection line do not cross the main position detection lines.

7. The display device according to claim 2, wherein the main position detection lines extend in a first direction and are arranged in a second direction that is perpendicular to the first direction, the first auxiliary position detection line and the second auxiliary position detection line extend in the first direction and are arranged in the second direction, the position detection electrodes are arranged in a matrix and includes rows that extend in the first direction and are arranged in the second direction, and the first position detection electrode and the second position detection electrode are included in one of the rows that is closest to the first auxiliary position detection line and the second auxiliary position detection line.

8. The display device according to claim 1, wherein the auxiliary position detection line includes a first line section and a second line section, the first line section is a portion of one of the conductive films and connected to the first position detection electrode included in the second group, and the second line section is a portion of another one of the conductive films different from the one conductive film including the portion of the first line section, the second line section is disposed to overlap the first line section and connected to the first line section.

9. The display device according to claim 8, further comprising:

a first auxiliary position detection line that is another portion of the one of the conductive films and connected to a second position detection electrode of the position detection electrodes included in the second group; and a second auxiliary position detection line that is another portion of the another one of the conductive films and connected to a third position electrode of the position detection electrodes included in the second group, the second auxiliary position detection line not overlapping the first auxiliary position detection line.

10. The display device according to claim 9, further comprising:

switching components disposed in the display area and connected to the pixel electrodes;

scan lines extending and crossing the main position detection lines within the display area and connected to the switching components;

a second signal supply section connected to the scan lines, wherein the main position detection lines extend in a first direction and are arranged in a second direction that is perpendicular to the first direction, the first line section, the second line section, the first auxiliary position detection line, and the second auxiliary position detection line extend in the first direction and are arranged in the second direction and disposed in a first space between the display area and the second signal supply section, the first line section and the second line section that are overlapped with each other are close to the second signal supply section in the first space, and the first auxiliary position detection line and the second auxiliary position detection line are close to the display area in the first space.

11. The display device according to claim 1, further comprising:

switching components disposed in the display area and connected to the pixel electrodes;

scan lines extending and crossing the main position detection lines within the display area and connected to the switching components; and scan connection lines extending and crossing the auxiliary position detection line outside the display area and connected to the scan lines, wherein one of the portions of conductive films included in the auxiliary position detection line is included in an upper layer than the scan connection lines.

12. The display device according to claim 1, further comprising:

switching components disposed in the display area and connected to the pixel electrodes; and image lines extending parallel to the main position detection lines within the display area and connected to the switching components, wherein the pixel electrodes have an elongated shape and the image lines and the main position detection lines extend in a short-edge direction of the pixel electrodes.

13. The display device according to claim 12, wherein the main position detection lines are arranged at intervals and include common sections so as to have a common position relationship with respect to the image lines, respectively.

14. The display device according to claim 13, wherein the common sections include line non-overlapping common sections that do not overlap the image lines.

15. The display device according to claim 1, wherein
the auxiliary position detection line includes auxiliary position detection lines, the auxiliary position detection lines include a long auxiliary position detection line and a short auxiliary position detection line,
the long auxiliary position line includes a first length extending from the signal supply section to a corresponding one of the position detection electrodes to be connected and the short auxiliary position detection line has a second length extending from the signal supply section to another corresponding one of the position detection electrodes to be connected, the first length is greater than the second length,
the long auxiliary position detection line is connected to the corresponding one of the position detection electrodes at the connection portion and the short auxiliary position detection line is connected to the another corresponding one of the position detection electrodes at a first connection portion,
the long auxiliary position detection line includes a wide portion that is wider than the short auxiliary position detection line, and
the wide portion is between the connection portion and the first connection portion.

16. The display device according to claim 1, wherein
the auxiliary position detection line includes auxiliary position detection lines and the auxiliary position detection lines extend in a first direction and are arranged in a second direction that is perpendicular to the first direction,
the main position detection lines and the auxiliary position detection lines extend in parallel to one another, and
the auxiliary position detection lines are connected to some of the position detection electrodes that are arranged in the first direction, respectively.

17. The display device according to claim 1, wherein
the auxiliary position detection line includes auxiliary position detection lines and the auxiliary position detection lines extend in a first direction and are arranged in a second direction that is perpendicular to the first direction,
the main position detection lines and the auxiliary position detection lines extend in parallel to one another, and
the auxiliary position detection lines are connected to some of the position detection electrodes that are disposed on an opposite side from the signal supply section with respect to the first direction.

18. The display device according to claim 17, further comprising:
switching components disposed in the display area and connected to the pixel electrodes;
scan lines extending in the second direction and crossing the main position detection lines within the display area and connected to the switching components; and
scan connection lines disposed outside the display area and connected to the scan lines, wherein
the display area includes a first area and a second area, the first area has an outline that is along the first direction and the second area is disposed on an opposite side from the signal supply section with respect to the first area in the first direction and has an outline different from the outline of the first area, and
one of the auxiliary position detection lines is disposed to overlap and included in an upper layer than the scan connection lines connected to the scan lines that are disposed in the second area via the second insulating film.

19. The display device according to claim 1, wherein the auxiliary position detection line does not cross the main position detection lines.

* * * * *